(12) United States Patent
Tsubuku et al.

(10) Patent No.: US 9,595,435 B2
(45) Date of Patent: Mar. 14, 2017

(54) METHOD FOR FORMING MULTILAYER FILM INCLUDING OXIDE SEMICONDUCTOR FILM AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Masashi Tsubuku, Atsugi (JP); Ryosuke Watanabe, Yamato (JP); Noritaka Ishihara, Kawasaki (JP); Masashi Oota, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 76 days.

(21) Appl. No.: 14/055,970

(22) Filed: Oct. 17, 2013

(65) Prior Publication Data
US 2014/0113405 A1   Apr. 24, 2014

(30) Foreign Application Priority Data
Oct. 19, 2012   (JP) ................................. 2012-232079

(51) Int. Cl.
| | |
|---|---|
| *H01L 21/02* | (2006.01) |
| *H01L 29/786* | (2006.01) |
| *H01L 27/12* | (2006.01) |

(52) U.S. Cl.
CPC .... *H01L 21/02422* (2013.01); *H01L 21/0262* (2013.01); *H01L 21/02472* (2013.01);
(Continued)

(58) Field of Classification Search
CPC ......... H01L 21/02422; H01L 21/02472; H01L 21/02483; H01L 21/02488;
(Continued)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.
(Continued)

*Primary Examiner* — Robert Bachner
*Assistant Examiner* — James Chin
(74) *Attorney, Agent, or Firm* — Robinson Intellectual Property Law Office; Eric J. Robinson

(57) ABSTRACT

To form an oxide semiconductor film with a low density of localized levels. To improve electric characteristics of a semiconductor device including the oxide semiconductor. After oxygen is added to an oxide film containing In or Ga in contact with an oxide semiconductor film functioning as a channel, heat treatment is performed to make oxygen in the oxide film containing In or Ga transfer to the oxide semiconductor film functioning as a channel, so that the amount of oxygen vacancies in the oxide semiconductor film is reduced. Further, an oxide film containing In or Ga is formed, oxygen is added to the oxide film, an oxide semiconductor film is formed over the oxide film, and then heat treatment is performed.

23 Claims, 22 Drawing Sheets

(52) U.S. Cl.
CPC .. *H01L 21/02483* (2013.01); *H01L 21/02488* (2013.01); *H01L 21/02502* (2013.01); *H01L 21/02554* (2013.01); *H01L 21/02565* (2013.01); *H01L 21/02631* (2013.01); *H01L 21/02664* (2013.01); *H01L 27/1225* (2013.01); *H01L 29/7869* (2013.01); *H01L 29/78693* (2013.01)

(58) Field of Classification Search
CPC ........... H01L 21/02502; H01L 27/1225; H01L 29/78618; H01L 29/7869; H01L 29/78693; H01L 29/78696; H01L 21/02664; H01L 21/02565; H01L 21/02631; H01L 21/0262; H01L 21/02554
USPC ................................ 438/104; 257/43, 57, 60
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,910,490 B2 | 3/2011 | Akimoto et al. |
| 7,932,521 B2 | 4/2011 | Akimoto et al. |
| 7,994,500 B2 | 8/2011 | Kim et al. |
| 8,058,645 B2 | 11/2011 | Jeong et al. |
| 8,129,717 B2 | 3/2012 | Yamazaki et al. |
| 8,129,719 B2 | 3/2012 | Yamazaki et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,077 B2 | 9/2012 | Akimoto et al. |
| 8,274,078 B2 | 9/2012 | Itagaki et al. |
| 8,278,136 B2 | 10/2012 | Tanaka et al. |
| 8,466,463 B2 | 6/2013 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0239335 A1 | 9/2009 | Akimoto et al. |
| 2009/0250693 A1 | 10/2009 | Jeong et al. |
| 2009/0278122 A1 | 11/2009 | Hosono et al. |
| 2009/0280600 A1 | 11/2009 | Hosono et al. |
| 2009/0294765 A1 | 12/2009 | Tanaka et al. |
| 2009/0305461 A1 | 12/2009 | Akimoto et al. |
| 2010/0038641 A1 | 2/2010 | Imai |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117074 A1* | 5/2010 | Yamazaki et al. ............... 257/43 |
| 2010/0136743 A1 | 6/2010 | Akimoto et al. |
| 2010/0207119 A1 | 8/2010 | Sakata et al. |
| 2010/0213460 A1 | 8/2010 | Kondo et al. |
| 2010/0252826 A1 | 10/2010 | Yamazaki et al. |
| 2010/0320458 A1 | 12/2010 | Umeda et al. |
| 2010/0320459 A1 | 12/2010 | Umeda et al. |
| 2011/0003429 A1 | 1/2011 | Oikawa et al. |
| 2011/0089417 A1 | 4/2011 | Yamazaki et al. |

(56) References Cited

U.S. PATENT DOCUMENTS

| | | | |
|---|---|---|---|
| 2011/0104851 A1 | 5/2011 | Akimoto et al. | |
| 2011/0115763 A1 | 5/2011 | Yamazaki et al. | |
| 2011/0117697 A1 | 5/2011 | Akimoto et al. | |
| 2011/0121290 A1 | 5/2011 | Akimoto et al. | |
| 2011/0140100 A1 | 6/2011 | Takata et al. | |
| 2011/0156026 A1 | 6/2011 | Yamazaki et al. | |
| 2011/0163311 A1 | 7/2011 | Akimoto et al. | |
| 2011/0193083 A1 | 8/2011 | Kim et al. | |
| 2011/0212570 A1 | 9/2011 | Yamazaki et al. | |
| 2011/0215328 A1 | 9/2011 | Morosawa et al. | |
| 2011/0215331 A1* | 9/2011 | Yamazaki et al. | 257/60 |
| 2011/0260171 A1 | 10/2011 | Yamazaki | |
| 2011/0263082 A1 | 10/2011 | Yamazaki | |
| 2011/0263083 A1 | 10/2011 | Yamazaki | |
| 2011/0263084 A1 | 10/2011 | Yamazaki | |
| 2011/0263085 A1 | 10/2011 | Yamazaki | |
| 2011/0263091 A1 | 10/2011 | Yamazaki | |
| 2011/0281394 A1 | 11/2011 | Yamazaki | |
| 2011/0297928 A1* | 12/2011 | Isobe | H01L 27/105 257/43 |
| 2011/0298027 A1 | 12/2011 | Isobe et al. | |
| 2012/0032172 A1* | 2/2012 | Noda | H01L 29/7869 257/57 |
| 2012/0108006 A1 | 5/2012 | Yamazaki et al. | |
| 2012/0108007 A1 | 5/2012 | Yamazaki et al. | |
| 2012/0119205 A1 | 5/2012 | Taniguchi et al. | |
| 2012/0122277 A1 | 5/2012 | Yamazaki et al. | |
| 2012/0305913 A1 | 12/2012 | Yamazaki et al. | |
| 2012/0319114 A1* | 12/2012 | Yamazaki et al. | 257/57 |
| 2012/0319183 A1 | 12/2012 | Yamazaki et al. | |
| 2013/0009219 A1* | 1/2013 | Yamazaki | H01L 29/7869 257/288 |
| 2013/0126862 A1 | 5/2013 | Yamazaki | |
| 2013/0146870 A1 | 6/2013 | Yamazaki | |
| 2013/0153889 A1* | 6/2013 | Yamazaki | H01L 21/02565 257/43 |
| 2013/0320330 A1 | 12/2013 | Yamazaki | |
| 2013/0320334 A1 | 12/2013 | Yamazaki et al. | |
| 2013/0334523 A1 | 12/2013 | Yamazaki | |
| 2013/0334533 A1 | 12/2013 | Yamazaki | |
| 2014/0001465 A1 | 1/2014 | Yamazaki | |
| 2014/0008647 A1 | 1/2014 | Yamazaki | |
| 2014/0014947 A1 | 1/2014 | Yamazaki | |
| 2014/0027762 A1 | 1/2014 | Tsurume et al. | |
| 2014/0042433 A1 | 2/2014 | Yamazaki | |
| 2014/0042434 A1 | 2/2014 | Yamazaki | |
| 2014/0042435 A1 | 2/2014 | Yamazaki | |
| 2014/0042436 A1 | 2/2014 | Yamazaki | |
| 2014/0042437 A1 | 2/2014 | Yamazaki | |
| 2014/0042438 A1 | 2/2014 | Yamazaki | |
| 2014/0084287 A1 | 3/2014 | Yamazaki | |
| 2014/0091301 A1 | 4/2014 | Yamazaki | |
| 2014/0106504 A1* | 4/2014 | Yamazaki et al. | 438/104 |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2007-096055 A | 4/2007 | |
| JP | 2007-123861 A | 5/2007 | |
| JP | 2009-231613 | 10/2009 | |
| JP | 2010-016347 | 1/2010 | |
| JP | 4415062 | 2/2010 | |
| JP | 2010-067954 | 3/2010 | |
| JP | 2010-177431 | 8/2010 | |
| JP | 4571221 | 10/2010 | |
| JP | 2012-160679 | 8/2012 | |
| WO | WO-2004/114391 | 12/2004 | |
| WO | WO2008/133345 | 11/2008 | |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $(InGaO_3(ZnO))3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

(56) References Cited

OTHER PUBLICATIONS

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FDP '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

METHOD FOR FORMING MULTILAYER FILM INCLUDING OXIDE SEMICONDUCTOR FILM AND METHOD FOR MANUFACTURING SEMICONDUCTOR DEVICE

BACKGROUND OF THE INVENTION

1. Field of the Invention

The present invention relates to a method for forming a multilayer film including an oxide semiconductor film. The present invention also relates to a method for manufacturing a semiconductor device including a field-effect transistor.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used for transistors. Note that in this specification, a metal oxide exhibiting semiconductor characteristics is referred to as an oxide semiconductor.

For example, a technique in which a transistor is manufactured using zinc oxide or an In—Ga—Zn-based oxide as an oxide semiconductor and the transistor is used as a switching element or the like of a pixel of a display device, is disclosed (see Patent Documents 1 and 2).

REFERENCE

Patent Documents

[Patent Document 1] Japanese Published Patent Application No. 2007-123861

[Patent Document 2] Japanese Published Patent Application No. 2007-096055

SUMMARY OF THE INVENTION

In a transistor using an oxide semiconductor, oxygen vacancies (oxygen defects) which are one of causes of localized levels in an oxide semiconductor film cause defects of electric characteristics of the transistor.

In view of this, in one embodiment of the present invention, an object is to form an oxide semiconductor film with a low density of localized levels. Another object of one embodiment of the present invention is to improve electrical characteristics in a semiconductor device including an oxide semiconductor.

A main point of one embodiment of the present invention is to reduce the amount of oxygen vacancies in an oxide semiconductor film that is to be a channel in the following manner: oxygen is added to an oxide film containing In or Ga, which is in contact with the oxide semiconductor film that is to be a channel; and oxygen in the oxide film containing In or Ga is transferred to the oxide semiconductor film by performing heat treatment.

Another embodiment of the present invention is a method for forming a multilayer film including an oxide semiconductor film, which includes a step of forming an oxide film containing In or Ga, a step of adding oxygen to the oxide film, a step of forming an oxide semiconductor film over the oxide film after the step of adding the oxygen, and a step of performing heat treatment.

Another embodiment of the present invention is a method for forming a multilayer film including an oxide semiconductor film, which includes a step of forming an oxide semiconductor film, a step of forming an oxide film containing In or Ga over the oxide semiconductor film, a step of adding oxygen to the oxide film, and a step of performing heat treatment after the step of adding the oxygen.

Another embodiment of the present invention is a method for forming a multilayer film including an oxide semiconductor film, which includes a step of forming a first oxide film containing In or Ga, a step of adding oxygen to the first oxide film, a step of forming the oxide semiconductor film over the first oxide film after the step of adding the oxygen, a step of forming a second oxide film containing In or Ga over the oxide semiconductor film, and a step of performing heat treatment.

Another embodiment of the present invention is a method for manufacturing a semiconductor device including the following steps: a step of forming a gate insulating film over a gate electrode; a step of forming a multilayer film including an oxide semiconductor film by forming an oxide film containing In or Ga over the gate insulating film, adding oxygen to the oxide film, forming an oxide semiconductor film over the oxide film after the step of adding the oxygen, and performing heat treatment; and a step of forming a pair of electrodes over the multilayer film including the oxide semiconductor film.

Another embodiment of the present invention is a method for manufacturing a semiconductor device including the following steps: a step of forming a gate insulating film over a gate electrode; a step of forming a multilayer film including an oxide semiconductor film by forming an oxide semiconductor film over the gate insulating film, forming an oxide film containing In or Ga over the oxide semiconductor film, adding oxygen to the oxide film, and performing heat treatment after the step of adding the oxygen; and a step of forming a pair of electrodes over the multilayer film including the oxide semiconductor film.

Another embodiment of the present invention is a method for manufacturing a semiconductor device including the following steps: a step of forming a gate insulating film over a gate electrode; a step of forming a multilayer film including an oxide semiconductor film by forming a first oxide film containing In or Ga over the gate insulating film, adding oxygen to the first oxide film, forming an oxide semiconductor film over the first oxide film after the step of adding the oxygen, forming a second oxide film containing In or Ga over the oxide semiconductor film, and performing heat treatment; and a step of forming a pair of electrodes over the multilayer film including the oxide semiconductor film.

Another embodiment of the present invention is a method for manufacturing a semiconductor device including the following steps: a step of forming a multilayer film including an oxide semiconductor film by forming an oxide film containing In or Ga over an oxide film containing silicon, adding oxygen to the oxide film containing In or Ga, forming an oxide semiconductor film over the oxide film containing In or Ga after the step of adding the oxygen, and performing heat treatment; a step of forming a gate insulating film over the multilayer film including the oxide semiconductor film; and a step of forming a gate electrode over the gate insulating film.

Another embodiment of the present invention is a method for manufacturing a semiconductor device including the following steps: a step of forming a multilayer film including an oxide semiconductor film by forming an oxide semiconductor film over an oxide film containing silicon, forming an oxide film containing In or Ga over the oxide semiconductor film, adding oxygen to the oxide film containing In or Ga, and performing heat treatment after the step of adding the oxygen; a step of forming a gate insulating film over the multilayer film including the oxide semiconductor film; and a step of forming a gate electrode over the gate insulating film.

Another embodiment of the present invention is a method for manufacturing a semiconductor device including the following steps: a step of forming a multilayer film including an oxide semiconductor film by forming a first oxide film containing In or Ga over an oxide film containing silicon, adding oxygen to the first oxide film, forming an oxide semiconductor film over the first oxide film after the step of adding the oxygen, forming a second oxide film containing In or Ga over the oxide semiconductor film, and performing heat treatment; a step of forming a gate insulating film over the multilayer film including the oxide semiconductor film; and a step of forming a gate electrode over the gate insulating film.

Note that the oxide semiconductor film is an oxide semiconductor film containing In or Ga, typically, an In—Ga oxide, an In—Zn oxide, or an In-M-Zn oxide (M is any of Al, Ti, Ga, Y, Zr, La, Ce, Nd, Sn, or Hf). Note that the element M indicates a metal element whose strength of bonding with oxygen is higher than that of In.

Further, each of the oxide film containing In or Ga, the first oxide film containing In or Ga, and the second oxide film containing In or Ga is typically an In—Ga oxide, an In—Zn oxide, or an In-M-Zn oxide (M is any of Al, Ti, Ga, Y, Zr, La, Ce, Nd, Sn, or Hf), and each of the above oxide films has the energy at the bottom of the conduction band closer to a vacuum level than the oxide semiconductor film. Typically, a difference between the energy at the bottom of the conduction band in each of the oxide film containing In or Ga, the first oxide film containing In or Ga, and the second oxide film containing In or Ga and the energy at the bottom of the conduction band in the oxide semiconductor film is greater than or equal to 0.05 eV, greater than or equal to 0.07 eV, greater than or equal to 0.1 eV, or greater than or equal to 0.15 eV, and also less than or equal to 2 eV, less than or equal to 1 eV, less than or equal to 0.5 eV, or less than or equal to 0.4 eV. Note that the difference between the vacuum level and the energy at the bottom of the conduction band is referred to as electron affinity.

Further, in the case where the oxide film containing In or Ga, the first oxide film containing In or Ga, the second oxide film containing In or Ga, and the oxide semiconductor film are each an In-M-Zn oxide (M is any of Al, Ti, Ga, Y, Zr, La, Ce, Nd, or Hf), the proportion of M atoms (M is any of Al, Ti, Ga, Y, Zr, La, Ce, Nd, Sn, or Hf) included in each of the oxide film containing In or Ga, the first oxide film containing In or Ga, and the second oxide film containing In or Ga is higher than that in the oxide semiconductor film. Typically, the proportion of M in each of the oxide films is higher than or equal to 1.5 times, preferably higher than or equal to twice, further preferably higher than or equal to three times as high as that in the oxide semiconductor film.

In the case where the oxide film containing In or Ga, the first oxide film containing In or Ga, and the second oxide film containing In or Ga are each an In-M-Zn oxide (M is any of Al, Ti, Ga, Y, Zr, La, Ce, Nd, Sn, or Hf, and In:M:Zn=$x_1$:$y_1$:$z_1$ [atomic ratio]) and the oxide semiconductor film is an In-M-Zn oxide (M is any of Al, Ti, Ga, Y, Zr, La, Ce, Nd, or Hf, and In:M:Zn=$x_2$:$y_2$:$z_2$ [atomic ratio]), the compositions of the films are selected so that $y_1/x_1$ is higher than $y_2/x_2$. It is preferable that $y_1/x_1$ be 1.5 times or more as high as $y_2/x_2$. It is further preferable that $y_1/x_1$ be twice or more as high as $y_2/x_2$. It is still further preferable that $y_1/x_1$ be three times or more as high as $y_2/x_2$. In this case, it is preferable that in the oxide film containing In or Ga, the first oxide film containing In or Ga, and the second oxide film containing In or Ga, $y_1$ be higher than or equal to $x_1$ because a transistor can have stable electric characteristics. However, when $y_1$ is larger than or equal to three times $x_1$, the field-effect mobility of the transistor is reduced. Thus, it is preferable that $y_1$ be lower than three times $x_1$.

Furthermore, of the multilayer film including an oxide semiconductor film, the absorption coefficient calculated by a constant photocurrent method is less than $1\times10^{-3}/\text{cm}^3$.

As a method for adding oxygen to the oxide film containing In or Ga or the first oxide film containing In or Ga, an ion implantation method, an ion doping method, plasma treatment, or the like can be given.

According to one embodiment of the present invention, an oxide semiconductor film with a low density of localized levels can be formed. In addition, electric characteristics of a semiconductor device including the oxide semiconductor can be improved.

DETAILED DESCRIPTION OF THE INVENTION

Figure 1A:
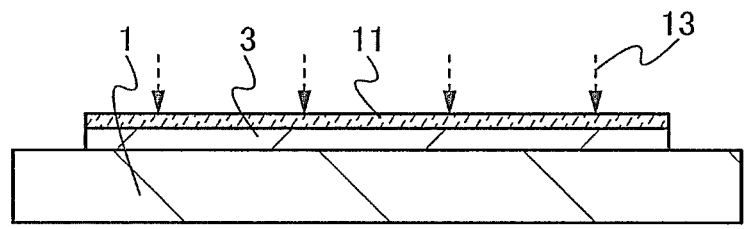
FIGS. 1A to 1E illustrate one embodiment of a method for forming an oxide semiconductor film.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be interpreted as being limited to the description of the embodiments. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flowing is changed in circuit operation, for example. Therefore, the terms "source" and "drain" can be used to denote the drain and the source, respectively, in this specification.

Embodiment 1

In this embodiment, a method for reducing the amount of oxygen vacancies in an oxide semiconductor film will be described. In addition, a method for forming a multilayer film including an oxide semiconductor film with a reduced density of localized levels will be described.

Figure 1B:
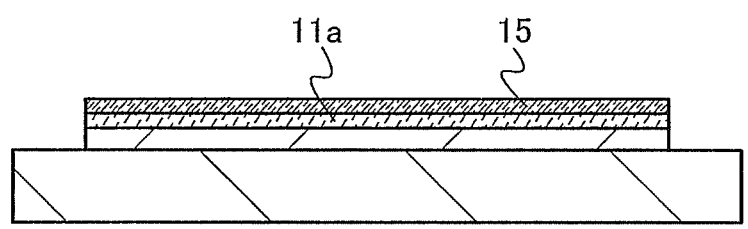

As illustrated in FIG. 1A, over a substrate 1, an oxide insulating film 3 functioning as a base insulating film is formed. Next, over the oxide insulating film 3 functioning as a base insulating film, an oxide film 11 containing In or Ga is formed. After that, oxygen 13 is added to the oxide film 11 containing In or Ga, so that an oxide film containing In or Ga to which oxygen is added (hereinafter, referred to as an oxide film 11a to which oxygen is added) is formed as illustrated in FIG. 1B.

The oxygen 13 that is added to the oxide film 11 containing In or Ga includes at least one of an oxygen radical, an oxygen atom, an oxygen ion, and the like. As a method for adding the oxygen 13 to the oxide film 11 containing In or Ga, an ion doping method, an ion implantation method, or the like can be given.

The amount (dose) of oxygen added to the oxide film 11 containing In or Ga by an ion implantation method is typically preferably greater than or equal to $5\times10^{14}/cm^2$ and less than or equal to $5\times10^{16}/cm^2$. The amount of oxygen which enables oxygen vacancies generated in an oxide semiconductor film in a later step to be reduced, is preferably added, and the amount is typically greater than or equal to $5\times10^{14}/cm^2$ and less than or equal to $1\times10^{15}/cm^2$. However, as the amount of added oxygen is larger, the treatment time becomes longer, and the mass productivity is lowered. Thus, the amount is preferably less than or equal to $5\times10^{16}/cm^2$, more preferably less than or equal to $2\times10^{16}/cm^2$.

Plasma treatment in which the oxide film 11 containing In or Ga is exposed to plasma generated in an atmosphere containing oxygen may be performed, so that oxygen is added to the oxide film 11 containing In or Ga. As the atmosphere containing oxygen, an atmosphere containing an oxidation gas such as oxygen, ozone, dinitrogen monoxide, or nitrogen dioxide can be given. Note that it is preferable that the oxide film 11 containing In or Ga be exposed to plasma generated in a state where bias is applied on the substrate 1 side, because the amount of oxygen added to the oxide film 11 containing In or Ga can be increased. As an example of an apparatus with which such plasma treatment is performed, an ashing apparatus is given.

Figure 1C:
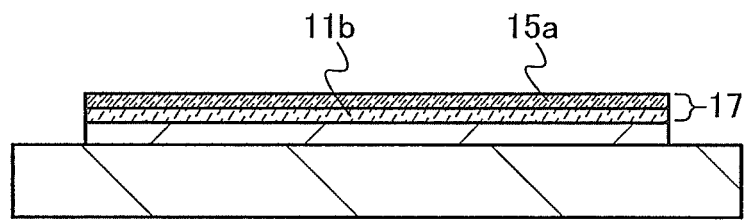

The concentration profiles of oxygen ions at the time when oxygen is added to the oxide film 11 containing In or Ga are described with reference to FIG. 1D and FIG. 1E. Here, the concentration profiles at the time when oxygen ions are added by an ion implantation method are shown. In each of FIG. 1D and FIG. 1E, the horizontal axis indicates a depth from a surface, the vertical axis indicates the concentration of the added oxygen ions, and a curve 5 and a curve 6 indicate concentration profiles.

Figure 1D:
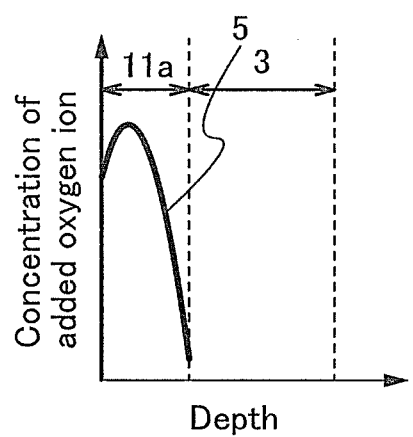
Figure 1E:
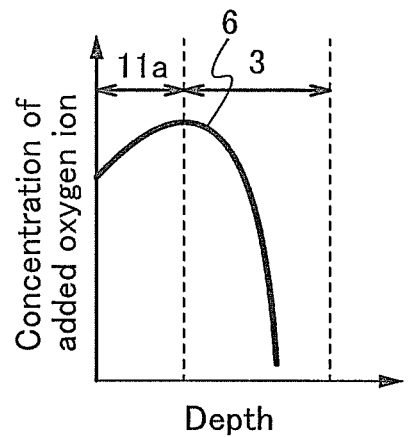

As shown in FIG. 1D, oxygen is preferably added to the oxide film 11 containing In or Ga so that a peak of the concentration profile of oxygen ions can be positioned in the oxide film 11a to which oxygen is added. Further, oxygen may be added to the oxide insulating film 3 functioning as a base insulating film as well as the oxide film 11 containing In or Ga. Furthermore, as illustrated in FIG. 1E, oxygen may be added to the oxide film 11 containing In or Ga and the oxide insulating film 3 functioning as a base insulating film so that a peak of the concentration profile of oxygen ions can be positioned in the oxide insulating film 3 functioning as a base insulating film.

In the oxide film 11a to which oxygen is added through the above step, oxygen whose amount is larger than that of oxygen satisfying the stoichiometric composition is preferably contained. Further, the oxide film 11a to which oxygen is added has a low film density compared with the oxide film 11 containing In or Ga, to which oxygen has not been added yet.

Each component and a formation method thereof are described in detail below.

Although there is no particular limitation on a material and the like of the substrate 1, it is necessary that the substrate have heat resistance high enough to withstand at least heat treatment performed later. For example, a glass substrate, a ceramic substrate, a quartz substrate, a sapphire substrate, or the like may be used as the substrate 1. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 1. Furthermore, any of these substrates further provided with a semiconductor element may be used as the substrate 1. A flexible substrate may be used as the substrate 1.

Examples of the oxide insulating film 3 functioning as a base insulating film include a silicon oxide film, a silicon oxynitride film, a silicon nitride film, a silicon nitride oxide film, a gallium oxide film, a hafnium oxide film, an yttrium oxide film, an aluminum oxide film, and an aluminum oxynitride film. Note that when a silicon nitride film, a gallium oxide film, a hafnium oxide film, an yttrium oxide film, an aluminum oxide film, or the like is used as the oxide insulating film 3 functioning as a base insulating film, it is possible to suppress diffusion of impurities, typically, an alkali metal, water, hydrogen, and the like, into the oxide semiconductor film from the substrate 1.

The oxide insulating film 3 can be formed by a CVD method or a sputtering method.

Note that the oxide insulating film 3 functioning as a base insulating film is not necessarily provided unless needed.

Description of the oxide film 11 containing In or Ga is made together with that of an oxide semiconductor film 15 that is formed in a later step.

Next, as illustrated in FIG. 1B, the oxide semiconductor film 15 is formed over the oxide film 11a to which oxygen is added. Next, heat treatment is performed to make part of oxygen contained in the oxide film 11a to which oxygen is added transfer to the oxide semiconductor film 15, so that oxygen vacancies in the oxide semiconductor film 15 are filled with the oxygen, and accordingly, the amount of oxygen vacancies in the oxide semiconductor film 15 is reduced. Alternatively, heat treatment is performed to make part of oxygen in the oxide insulating film 3 functioning as a base insulating film and the oxide film 11a to which oxygen is added transfer to the oxide semiconductor film 15, so that oxygen vacancies in the oxide semiconductor film 15 are filled with the oxygen, and accordingly the amount of oxygen vacancies in the oxide semiconductor film 15 is reduced. As a result, as illustrated in FIG. 1C, an oxide semiconductor film 15a which has the reduced amount of oxygen vacancies and the reduced density of localized levels can be formed. The amount of oxygen contained in the oxide film 11a to which oxygen is added is reduced by the heat treatment, and in FIG. 1C, the oxide film is referred to as an oxide film 11b containing In or Ga. In addition, a multilayer film including the oxide film 11b containing In or Ga and the oxide semiconductor film 15a is referred to as a multilayer film 17.

Each component and the formation method thereof are described in detail below.

The oxide semiconductor film 15 is an oxide semiconductor film containing In or Ga and typically includes an In—Ga oxide, an In—Zn oxide, and an In-M-Zn oxide (M is any of Al, Ti, Ga, Y, Zr, La, Ce, Nd, Sn, or Hf).

Note that when the oxide semiconductor film 15 is an In-M-Zn oxide, the atomic ratio of In to M is preferably as follows: the proportion of In atoms be higher than or equal to 25 atomic % and the proportion of M atoms be lower than 75 atomic %, and it is further preferably as follows: the proportion of In atoms be higher than or equal to 34 atomic % and the proportion of M atoms be lower than 66 atomic %.

The energy gap of the oxide semiconductor film 15 is greater than or equal to 2 eV, preferably greater than or equal to 2.5 eV, further preferably greater than or equal to 3 eV.

The oxide film 11 containing In or Ga is typically an In—Ga oxide, an In—Zn oxide, or an In-M-Zn oxide (M is any of Al, Ti, Ga, Y, Zr, La, Ce, Nd, Sn, or Hf), and has the energy at the bottom of the conduction band closer to a vacuum level than the oxide semiconductor film 15. Typically, a difference between the energy at the bottom of the conduction band of the oxide film 11 containing In or Ga and the energy at the bottom of the conduction band of the oxide semiconductor film formed in a later step is greater than or equal to 0.05 eV, greater than or equal to 0.07 eV, greater than or equal to 0.1 eV, or greater than or equal to 0.15 eV and also less than or equal to 2 eV, less than or equal to 1 eV, less than or equal to 0.5 eV, or less than or equal to 0.4 eV.

When the oxide film 11 containing In or Ga is an In-M-Zn oxide, the atomic ratio of In to M is preferably as follows: the proportion of In atoms be lower than 50 atomic % and the proportion of M atoms be higher than or equal to 50 atomic %, and it is further preferably as follows: the proportion of In atoms be lower than 25 atomic % and the proportion of M atoms be higher than or equal to 75 atomic %.

Further, in the case where the oxide film 11 containing In or Ga and the oxide semiconductor film 15 are each an In-M-Zn oxide (M is any of Al, Ti, Ga, Y, Zr, La, Ce, Nd, Sn, or Hf), the proportion of M atoms (M is any of Al, Ti, Ga, Y, Zr, La, Ce, Nd, Sn, or Hf) included in the oxide film 11 containing In or Ga is higher than that in the oxide semiconductor film 15. Typically, the proportion of M in the oxide film 11 is higher than or equal to 1.5 times, preferably higher than or equal to twice, further preferably higher than or equal to three times as high as that in the oxide semiconductor film 15.

In the case where the oxide film 11 containing In or Ga is an In-M-Zn oxide (M is any of Al, Ti, Ga, Y, Zr, La, Ce, Nd, Sn, or Hf, and In:M:Zn=$x_1$:$y_1$:$z_1$ [atomic ratio]) and the oxide semiconductor film 15 is an In-M-Zn oxide (M is any of Al, Ti, Ga, Y, Zr, La, Ce, Nd, or Hf, and In:M:Zn=$x_2$:$y_2$:$z_2$ [atomic ratio]), $y_1/x_1$ is higher than $y_2/x_2$. It is preferable that $y_1/x_1$ be 1.5 times or more as high as $y_2/x_2$. It is further preferable that $y_1/x_1$ be twice or more as high as $y_2/x_2$. It is still further preferable that $y_1/x_1$ be three times or more as high as $y_2/x_2$. In this case, it is preferable that in the oxide film 11 containing In or Ga, $y_1$ be higher than or equal to $x_1$ because a transistor using the oxide semiconductor film can have stable electric characteristics. However, when $y_1$ is larger than or equal to three times $x_1$, the field-effect mobility of the transistor is reduced. Thus, it is preferable that $y_1$ be lower than three times $x_1$.

For example, as the oxide film 11 containing In or Ga, an In—Ga—Zn oxide film having a composition ratio of In to Ga and Zn that is 1:3:2, 1:6:4, or 1:9:6 can be used, and as the oxide semiconductor film 15, an In—Ga—Zn oxide film having a composition ratio of In to Ga and Zn that is 1:1:1 or 3:1:2 can be used. Note that in each of the oxide film 11 containing In or Ga and the oxide semiconductor film 15, the proportions of atoms in the atomic ratio varies within a range of ±20% as a margin.

The atomic ratio is not limited to the above, and the atomic ratio may be appropriately set in accordance with needed semiconductor characteristics.

When silicon or carbon, which is one of elements belonging to Group 14, is contained in the oxide semiconductor film 15, the amount of oxygen vacancies is increased, and the oxide semiconductor film 15 becomes an n-type film. Thus, the concentration of silicon or carbon in the oxide semiconductor film 15 or the concentration of silicon or carbon in the vicinity of an interface between the oxide film 11 containing In or Ga and the oxide semiconductor film 15 is adjusted to be lower than or equal to $2 \times 10^{18}$ atoms/cm$^3$, preferably lower than or equal to $2 \times 10^{17}$ atoms/cm$^3$.

The oxide film 11 containing In or Ga and the oxide semiconductor film 15 can be formed by a sputtering method, a coating method, a pulsed laser deposition method, a laser ablation method, or the like.

In the case where the oxide film 11 containing In or Ga and the oxide semiconductor film 15 are formed by a sputtering method, as a power supply device for generating plasma, an RF power supply device, an AC power supply device, a DC power supply device, or the like can be used as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas.

Further, targets may be selected as appropriate in accordance with respective compositions of the oxide film 11 containing In or Ga and the oxide semiconductor film 15 that are to be formed.

Note that in the case where the oxide film 11 containing In or Ga and the oxide semiconductor film 15 are formed by, for example, a sputtering method, the substrate temperature may be set to higher than or equal to 100° C. and lower than or equal to 450° C., preferably higher than or equal to 170° C. and lower than or equal to 350° C., and the oxide film 11 containing In or Ga and the oxide semiconductor film 15 may be formed while being heated.

Note that when a c-axis aligned crystalline oxide semiconductor (CAAC-OS) is formed as the oxide semiconductor film 15 which is described later, it is preferable that the oxide film 11 containing In or Ga be formed without heat treatment. The oxide film 11 containing In or Ga is likely to have a polycrystalline structure when being heated. In the case where the oxide semiconductor film 15 is formed over the polycrystalline oxide film 11 containing In or Ga, the crystalline order in the oxide semiconductor film 15 becomes random.

The temperature of heat treatment performed after formation of the oxide semiconductor film 15 is preferably within the range of temperature where oxygen is transferred from the oxide film 11a to which oxygen is added to the oxide semiconductor film 15. The temperature is typically higher than or equal to 250° C. and lower than the strain point of the substrate, preferably higher than or equal to 300° C. and lower than or equal to 550° C., further preferably higher than or equal to 350° C. and lower than or equal to 510° C.

The heat treatment is performed in an inert gas atmosphere containing nitrogen or a rare gas such as helium, neon, argon, xenon, or krypton. Further, after heat treatment performed in an inert gas atmosphere, heat treatment may be additionally performed in an oxygen atmosphere or a dry air atmosphere (air whose dew point is lower than or equal to −80° C., preferably lower than or equal to −100° C.). Note that it is preferable that hydrogen, water, and the like be not contained in an inert gas and oxygen, like the dry air, and the dew point is preferably lower than or equal to −80° C., further preferably lower than or equal to −100° C. The treatment time is 3 minutes to 24 hours.

Through the above steps, the amount of oxygen vacancies in the oxide semiconductor film can be reduced. Thus, the multilayer film 17 including the oxide semiconductor film 15a with a reduced density of localized levels can be formed.

Note that of the multilayer film 17 including the oxide semiconductor film with a reduced density of localized levels, the absorption coefficient calculated by a constant photocurrent method (CPM) is lower than $1 \times 10^{-3}$/cm, preferably lower than $1 \times 10^{-4}$/cm, further preferably lower than $5 \times 10^{-5}$/cm. The absorption coefficient has a positive correlation with an energy corresponding to the localized levels due to oxygen vacancies and entry of impurities (the energy calculated from the wavelength); thus, the density of localized levels in the multilayer film 17 is extremely low.

A part of the absorption coefficient which is called an urbach tail due to the band tail is removed from a curve of the absorption coefficient obtained by the CPM measurement, whereby the absorption coefficient due to the localized levels can be calculated from the following formula. Note that the urbach tail indicates a constant gradient region on a curve of the absorption coefficient obtained by the CPM measurement, and the gradient is called urbach energy.

$$\int \frac{\alpha(E) - \alpha_u}{E} dE \qquad \text{[FORMULA 1]}$$

Here, $\alpha(E)$ indicates the absorption coefficient at each energy level and $\alpha_u$ indicates the absorption coefficient due to the urbach tail.

In this embodiment, the oxide semiconductor film is in contact with the oxide film containing at least one of metal elements constituting the oxide semiconductor film, that is, in contact with the oxide film containing In or Ga. Accordingly, the number of interface levels at an interface between the oxide film containing In or Ga and the oxide semiconductor film is extremely small. Thus, when oxygen is transferred from the oxide film containing In or Ga to the oxide semiconductor film, the oxygen is less likely to be captured by the interface levels, and the oxygen in the oxide film containing In or Ga can be efficiently transferred to the oxide semiconductor film. Further, with the oxygen transferred into the oxide semiconductor film, oxygen vacancies in the oxide semiconductor film are filled, and thus, the density of localized levels in the oxide semiconductor film can be reduced.

The oxide semiconductor film is in contact with the oxide film containing In or Ga. In other words, the oxide semiconductor film is provided over the oxide insulating film with the oxide film containing In or Ga provided therebetween, and accordingly the concentration of silicon or carbon which is one of elements belonging to Group 14 in the oxide semiconductor film can be reduced. Therefore, the amount of oxygen vacancies in the oxide semiconductor film can be reduced, and the density of localized levels in the oxide semiconductor film can be reduced.

Modification Example 1

As the oxide insulating film 3, an oxide insulating film containing oxygen in excess of the stoichiometric composition may be formed. Thus, the excess oxygen is transferred to the oxide film 11 containing In or Ga and further to the oxide semiconductor film, and oxygen vacancies can be filled. As a result, the amount of oxygen vacancies in the oxide semiconductor film can be further reduced.

The oxide insulating film containing oxygen in excess of the stoichiometric composition can be formed by a CVD method, a sputtering method, or the like. Alternatively, after the oxide insulating film is formed by a CVD method, a sputtering method, or the like, oxygen may be added to the oxide insulating film by an ion implantation method, an ion doping method, plasma treatment, or the like.

Modification Example 2

As described above, in this embodiment, after the oxide semiconductor film 15 is formed as illustrated in FIG. 1B, part of oxygen in the oxide film 11a to which oxygen is added is transferred to the oxide semiconductor film 15 by performing heat treatment. Instead of this, by setting the film formation temperature of the oxide semiconductor film 15 to be higher than or equal to 170° C. and lower than the strain point of the substrate, part of oxygen in the oxide film 11a to which oxygen is added can be transferred to the oxide semiconductor film 15 while the oxide semiconductor film 15 being formed. Thus, the number of steps can be reduced.

Note that the structures, methods, and the like described in this embodiment can be used as appropriate in combination with any of the structures, methods, and the like described in the other embodiments and examples.

Embodiment 2

In this embodiment, a method for reducing the amount of oxygen vacancies in an oxide semiconductor film, which is different from the method in Embodiment 1, will be described. In addition, a method for forming a multilayer film including an oxide semiconductor film with a reduced density of localized levels will be described. A difference of the method in this embodiment from Embodiment 1 is that an oxide film containing In or Ga, from which oxygen is supplied to the oxide semiconductor film, is formed after the oxide semiconductor film is formed.

Figure 2A:
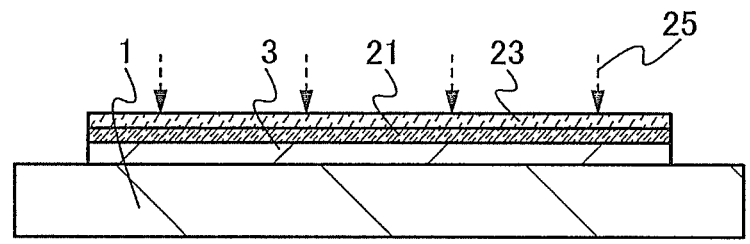
FIGS. 2A to 2D illustrate one embodiment of a method for forming an oxide semiconductor film.
Figure 2B:
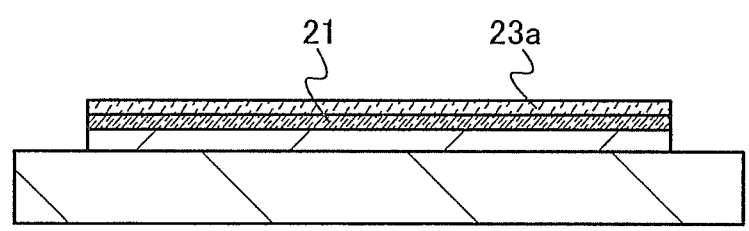

As illustrated in FIG. 2A, the oxide insulating film 3 functioning as a base insulating film is formed over the substrate 1. Next, an oxide semiconductor film 21 is formed over the oxide insulating film 3. Then, an oxide film 23 containing In or Ga is formed over the oxide semiconductor film 21. Then, oxygen 25 is added to the oxide film 23 containing In or Ga, so that an oxide film containing In or Ga to which oxygen is added (hereinafter, referred to as an oxide film 23a to which oxygen is added) is formed as illustrated in FIG. 2B.

The oxide semiconductor film 21 can be formed as appropriate using a material and a method which are similar to those of the oxide semiconductor film 15 described in Embodiment 1, and the oxide film 23 containing In or Ga can be formed as appropriate using a material and a method which are similar to those of the oxide film 11 containing In or Ga described in Embodiment 1.

For the oxygen 25 added to the oxide film 23 containing In or Ga, a material similar to the oxygen 13 described in Embodiment 1 and an addition method similar to the method described in Embodiment 1 can be used as appropriate.

Figure 2C:
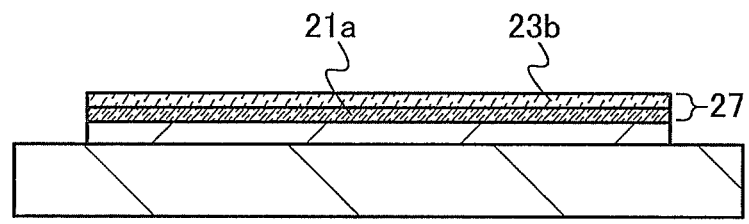
Figure 2D:
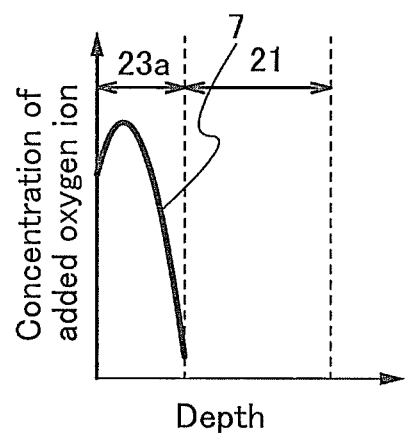

A concentration profile of oxygen ions at the time when oxygen is added to the oxide film 23 containing In or Ga is described with reference to FIG. 2D. Here, the concentration profile at the time when oxygen ions are added by an ion implantation method is shown in FIG. 2D. In FIG. 2D, the horizontal axis indicates a depth from a surface, the vertical axis indicates the concentration of the added oxygen ions, and a curve 7 indicates a concentration profile of the oxygen ions.

As shown in FIG. 2D, oxygen is preferably added to the oxide film 23 containing In or Ga so that a peak of the concentration profile of oxygen ions can be positioned in the oxide film 23a to which oxygen is added.

Note that when the oxide semiconductor film 21 has an amorphous structure, the oxygen content in the oxide semiconductor film 21 can be increased by adding oxygen to the oxide semiconductor film 21. Further, when the oxide semiconductor film 21 has crystallinity, typically a single crystal structure, a polycrystalline structure, or a CAAC-OS which is described later, it is preferable that the amount of oxygen 25 added to the oxide semiconductor film 21 be extremely small in order to keep crystallinity of the oxide semiconductor film 21.

Next, heat treatment is performed to make part of oxygen contained in the oxide film 23a to which oxygen is added transfer to the oxide semiconductor film 21, so that oxygen vacancies in the oxide semiconductor film 21 are filled with the oxygen, and accordingly, the amount of oxygen vacancies in the oxide semiconductor film 21 is reduced. As a result, an oxide semiconductor film 21a which has the reduced amount of oxygen vacancies and the reduced density of localized levels can be formed as illustrated in FIG. 2C. Further, in the oxide film 23a to which oxide is added, the oxygen content is reduced by the heat treatment. In FIG. 2C, the oxide film is referred to as an oxide film 23b containing In or Ga. In addition, a multilayer film including the oxide semiconductor film 21a and the oxide film 23b containing In or Ga is referred to as a multilayer film 27.

Note that of the multilayer film 27 including an oxide semiconductor film with a reduced density of localized levels, the absorption coefficient calculated by CPM measurement is lower than $1 \times 10^{-3}$/cm, preferably, lower than $1 \times 10^{-4}$/cm, further preferably lower than $5 \times 10^{-5}$/cm.

Through the above steps, the amount of oxygen vacancies in the oxide semiconductor film can be reduced. Thus, the multilayer film 27 including the oxide semiconductor film 21a with a reduced density of localized levels can be formed.

In this embodiment, the oxide semiconductor film is in contact with the oxide film containing at least one of metal elements constituting the oxide semiconductor film, that is, the oxide film containing In or Ga. Thus, the number of interface levels at the interface between the oxide film containing In or Ga and the oxide semiconductor film is extremely small. Thus, when oxygen is transferred from the oxide film containing In or Ga to the oxide semiconductor film, the oxygen is less likely to be captured by the interface levels, and the oxygen in the oxide film containing In or Ga can be efficiently transferred to the oxide semiconductor film. Further, with the oxygen transferred into the oxide semiconductor film, oxygen vacancies in the oxide semiconductor film are filled, and thus the density of localized levels in the oxide semiconductor film can be reduced.

Modification Example

After an oxide insulating film similar to the oxide insulating film 3 described in Embodiment 1 is formed over the oxide film 23 containing In or Ga, the oxygen 25 may be added to the oxide insulating film and the oxide film 23 containing In or Ga. In this case, the oxygen 25 is preferably added while the oxygen addition condition is being adjusting so that a peak of the concentration profile of oxygen ions is positioned in the oxide film 23 containing In or Ga. As a result, the oxygen 25 can be selectively added to the oxide film 23 containing In or Ga even when the thickness of the oxide film 23 containing In or Ga is small.

Note that the structures, methods, and the like described in this embodiment can be used as appropriate in combination with any of the structures, methods, and the like described in the other embodiments and examples.

Embodiment 3

In this embodiment, a method for reducing the amount of oxygen vacancies in an oxide semiconductor film, which is different from the methods in Embodiment 1 and Embodiment 2, will be described. In addition, a method for forming a multilayer film including an oxide semiconductor film with a reduced density of localized levels will be described. A difference of the method in this embodiment from Embodiment 1 is that heat treatment is performed after an oxide film containing In or Ga is formed over an oxide semiconductor film that has been formed. In addition, a difference from Embodiment 2 is that an oxide semiconductor film is formed after oxygen is added to an oxide film containing In or Ga, which has been formed over an oxide insulating film functioning as a base insulating film.

Figure 3A:
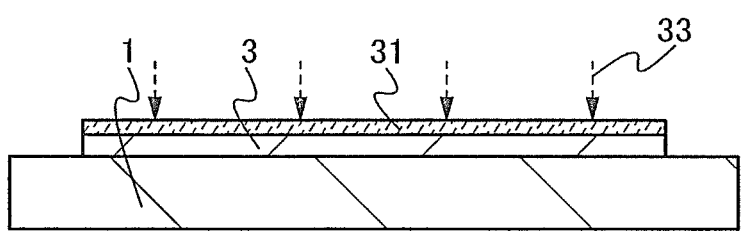
FIGS. 3A to 3C illustrate one embodiment of a method for forming an oxide semiconductor film.

As illustrated in FIG. 3A, the oxide insulating film 3 functioning as a base insulating film is formed over the substrate 1, which is similar to that of Embodiment 1. Next, an oxide film 31 containing In or Ga is formed over the oxide insulating film 3, and then oxygen 33 is added to the oxide film 31 containing In or Ga, so that an oxide film containing In or Ga, to which oxygen is added (hereinafter referred to as an oxide film 31a to which oxygen is added) is formed as illustrated in FIG. 3B.

The oxide film 31 containing In or Ga can be formed using a material and a formation method similar to those of the oxide film 11 containing In or Ga described in Embodiment 1, as appropriate. Note that when the oxide film 31 containing In or Ga is an In-M-Zn oxide, the atomic ratio of In to M is preferably as follows: the proportion of In atoms be lower than 50 atomic % and the proportion of M atoms be higher than or equal to 50 atomic %, and it is further preferably as follows: the proportion of In atoms be lower than 25 atomic % and the proportion of M atoms be higher than or equal to 75 atomic %.

For the oxygen 33 added to the oxide film 31 containing In or Ga, a material similar to the oxygen 13 described in Embodiment 1 and an addition method similar to the method described in Embodiment 1 can be used as appropriate.

Figure 3B:
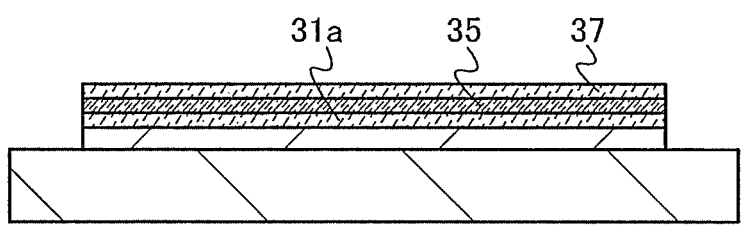

Next, as illustrated in FIG. 3B, an oxide semiconductor film 35 is formed over the oxide film 31a to which oxygen is added. Next, over the oxide semiconductor film 35, an oxide film 37 containing In or Ga is formed.

The oxide semiconductor film 35 can be formed using a material and a formation method similar to those of the oxide semiconductor film 15 described in Embodiment 1 as appropriate. The oxide film 37 containing In or Ga can be formed using a material and a formation method similar to those of the oxide film 11 containing In or Ga described in Embodiment 1.

Figure 3C:
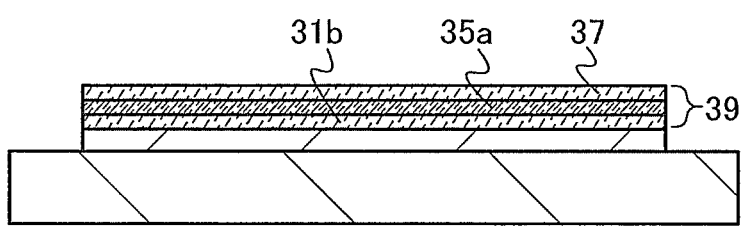

Next, heat treatment is performed to make part of oxygen contained in the oxide film 31a to which oxygen is added transfer to the oxide semiconductor film 35, so that oxygen vacancies in the oxide semiconductor film 35 are filled with the oxygen; accordingly, the amount of oxygen vacancies in the oxide semiconductor film 35 is reduced. As a result, an oxide semiconductor film 35a which has the reduced amount of oxygen vacancies and the reduced density of localized levels can be formed as illustrated in FIG. 3C. Further, in the oxide film 31a to which oxygen is added, the oxygen content is reduced by the heat treatment. In FIG. 3C, the oxide film is referred to as an oxide film 31b containing In or Ga. In addition, a multilayer film including the oxide film 31b containing In or Ga, the oxide semiconductor film 35a, and the oxide film 37 containing In or Ga is referred to as a multilayer film 39. Note that in some cases, oxygen is transferred not only to the oxide semiconductor film 35 but also to the oxide film 37 containing In or Ga by the heat treatment.

Note that of the multilayer film 39 including an oxide semiconductor film with a reduced density of localized levels, the absorption coefficient calculated by CPM measurement is lower than $1 \times 10^{-3}$/cm, preferably lower than $1 \times 10^{-4}$/cm, further preferably lower than $5 \times 10^{-5}$/cm.

Through the above steps, an oxide semiconductor film with a reduced density of localized levels can be formed. In addition, a multilayer film including an oxide semiconductor film with a reduced density of localized levels can be formed. In this embodiment, the oxide semiconductor film is in contact with the oxide film containing at least one of metal elements constituting the oxide semiconductor film, that is, the oxide film containing In or Ga. Thus, the number of interface levels at the interface between the oxide film containing In or Ga and the oxide semiconductor film is extremely small. Thus, when oxygen is transferred from the oxide film containing In or Ga to the oxide semiconductor film, the oxygen is less likely to be captured by the interface levels, and the oxygen in the oxide film containing In or Ga can be efficiently transferred to the oxide semiconductor film. Further, with the oxygen transferred into the oxide semiconductor film, oxygen vacancies in the oxide semiconductor film are filled, and thus, the density of localized levels in the oxide semiconductor film can be reduced.

The oxide semiconductor film is in contact with the oxide film containing In or Ga. In other words, the oxide semiconductor film is provided over the oxide insulating film with the oxide film containing In or Ga which is interposed therebetween, and accordingly the concentration of silicon or carbon which is one of elements belonging to Group 14 can be reduced in the oxide semiconductor film. Therefore, the amount of oxygen vacancies in the oxide semiconductor film can be reduced, and the density of localized levels in the oxide semiconductor film can be reduced.

Modification Example

In this embodiment, the oxygen 33 is added to the oxide film 31 containing In or Ga, which is provided below the oxide semiconductor film 35. In stead of this, after oxygen is added to the oxide film 37 containing In or Ga, which is provided over the oxide semiconductor film 35, heat treatment may be performed to make part of oxygen transfer to the oxide semiconductor film 35, so that oxygen vacancies in the oxide semiconductor film 35 are filled with the oxygen; accordingly, the amount of oxygen vacancies in the oxide semiconductor film 35 may be reduced.

Furthermore, after an oxide insulating film similar to the oxide insulating film 3 functioning as a base insulating film is formed over the oxide film 37 containing In or Ga, the oxygen 33 may be added to the oxide insulating film and the oxide film 37 containing In or Ga. As a result, the oxygen 33 can be selectively added to the oxide film 37 containing In or Ga even when the thickness of the oxide film 37 containing In or Ga is small.

Note that the structures, methods, and the like described in this embodiment can be used as appropriate in combination with any of the structures, methods, and the like described in the other embodiments and examples.

Embodiment 4

The threshold voltage of a transistor using an oxide semiconductor film with oxygen vacancies easily shifts negatively, and such a transistor tends to be normally-on. This is because electric charges are generated owing to oxygen vacancies in the oxide semiconductor, and the resistance is reduced. In addition, a transistor using an oxide semiconductor film with oxygen vacancies has such a problem that the electric characteristics, typically, the threshold voltage, are changed with time or changed by a stress test (typically, a gate bias-temperature (BT) stress test under light irradiation). In this embodiment, a method for manufacturing a highly reliable semiconductor device in which a change in threshold voltage is small will be described. Typically, a semiconductor device is manufactured using a multilayer film including the oxide semiconductor film with a low density of localized levels described in any of Embodiment 1 to Embodiment 3.

In this embodiment, a method for manufacturing a bottom-gate transistor is described. For a method for forming an oxide semiconductor film, the description in Embodiment 2 is referred to.

Figure 4A:
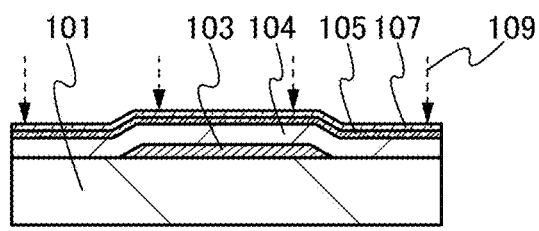
FIGS. 4A to 4F illustrate one embodiment of a method for manufacturing a transistor.
Figure 4B:
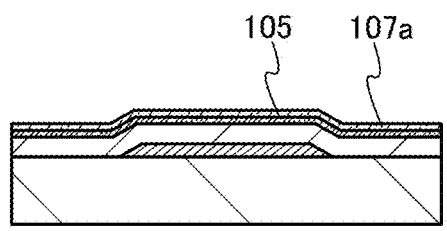

As illustrated in FIG. 4A, a gate electrode 103 is formed over a substrate 101, and a gate insulating film 104 is formed at least over the gate electrode 103. Next, an oxide semiconductor film 105 is formed over the gate insulating film 104, and an oxide film 107 containing In or Ga is formed over the oxide semiconductor film 105. Then, oxygen 109 is added to the oxide film 107 containing In or Ga in a manner similar to that in Embodiment 2, so that an oxide film containing In or Ga to which oxygen is added, (hereinafter referred to as an oxide film 107a to which oxygen is added) is formed as illustrated in FIG. 4B.

As the substrate 101, a substrate which is given as an example of the substrate 1 in Embodiment 1 can be used as appropriate.

Here, a glass substrate is used as the substrate 101.

The gate electrode 103 can be formed using a metal element selected from aluminum, chromium, copper, tantalum, titanium, molybdenum, and tungsten; an alloy containing any of these metal elements as a component; an alloy containing any of these metals in combination; or the like. Further, one or more metal elements selected from manganese or zirconium may be used. Further, the gate electrode 103 may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 103 can also be formed using a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added. It is also possible to have a stacked-layer structure formed using the above light-transmitting conductive material and the above metal element.

Further, an In—Ga—Zn-based oxynitride film, an In—Sn-based oxynitride film, an In—Ga-based oxynitride film, an In—Zn-based oxynitride film, a Sn-based oxynitride film, an In-based oxynitride film, a film of a metal nitride (such as InN or ZnN), or the like may be provided between the gate electrode 103 and the gate insulating film 104. These films each have a work function of 5 eV or higher, preferably 5.5 eV or higher and the electron affinity of each of these films is larger than that of an oxide semiconductor; thus, the threshold voltage of the transistor including an oxide semiconductor can be shifted in a positive direction. Accordingly, what is called a normally-off switching element can be obtained. For example, in the case of using an In—Ga—Zn-based oxynitride film, an In—Ga—Zn-based oxynitride film whose nitrogen concentration is higher than at least the nitrogen concentration of the oxide semiconductor film 105, specifically, an In—Ga—Zn-based oxynitride film whose nitrogen concentration is higher than or equal to 7 at. % is used.

A method for forming the gate electrode 103 is described below. First, a conductive film is formed by a sputtering method, a CVD method, an evaporation method, or the like. Then, a mask is formed over the conductive film by a photolithography step. Then, part of the conductive film is etched using the mask to form the gate electrode 103. After that, the mask is removed.

Note that the gate electrode 103 may be formed by an electrolytic plating method, a printing method, an inkjet method, or the like, instead of the above formation method.

Here, a 100 nm-thick tungsten film is formed by a sputtering method. Next, a mask is formed by a photolithography step, and the tungsten film is subjected to dry etching with use of the mask to form the gate electrode 103.

The gate insulating film 104 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, and a Ga—Zn-based metal oxide film. The gate insulating film 104 may be formed using an oxide insulator from which oxygen is released by heating. With use of a film from which oxygen is released by heating as the gate insulating film 104, the number of interface levels at the interface between the oxide semiconductor film 105 and the gate insulating film 104 can be reduced; accordingly, a transistor with less deterioration in electrical characteristics can be obtained. It is possible to prevent outward diffusion of oxygen from the oxide semiconductor film 105 and entry of hydrogen, water, or the like into the oxide semiconductor film 105 from the outside by providing an insulating film having a blocking effect against oxygen, hydrogen, water, and the like for the gate insulating film 104. As the insulating film that can block oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

The gate insulating film 104 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 104 is greater than or equal to 5 nm and less than or equal to 500 nm, preferably greater than or equal to 10 nm and less than or equal to 300 nm, further preferably greater than or equal to 50 nm and less than or equal to 250 nm.

The gate insulating film 104 can be formed by any of various deposition methods such as a CVD method or a sputtering method.

Here, as the gate insulating film 104, a stacked layer including a 400-nm-thick silicon nitride film and a 50-nm-thick silicon oxynitride film is formed by a CVD method.

The oxide semiconductor film 105 is formed using a material and a method similar to those of the oxide semiconductor film 15 in Embodiment 1. Note that since the oxide semiconductor film 105 has an energy gap that is 2 eV or more, preferably 2.5 eV or more, further preferably 3 eV or more, the off-state current of the transistor that is formed later can be low.

The thickness of the oxide semiconductor film 105 is greater than or equal to 1 nm and less than or equal to 200 nm, preferably greater than or equal to 3 nm and less than or equal to 100 nm, further preferably greater than or equal to 3 nm and less than or equal to 50 nm.

Here, as the oxide semiconductor film 105, a 35-nm-thick In—Ga—Zn oxide film (In:Ga:Zn=1:1:1) is formed by a sputtering method.

The oxide film 107 containing In or Ga can be formed using a material and a formation method similar to those of the oxide film 11 containing In or Ga described in Embodiment 1.

The thickness of the oxide film 107 containing In or Ga is greater than or equal to 1 nm and less than or equal to 100 nm, preferably greater than or equal to 3 nm and less than or equal to 50 nm.

The oxide semiconductor film and the oxide film containing In or Ga are not simply stacked but formed to have a continuous energy band (to have a structure in which the energy at the bottom of the conduction band varies continuously across the films). In other words, a staked structure in which a defect level such as a trap center or a recombination center for the oxide semiconductor film or an impurity which forms a barrier blocking the flow of carrier does not exist at the interface between the films is formed. If an impurity exists between the oxide semiconductor film and the oxide film containing In or Ga which are stacked, a continuity of the energy band is damaged, and the carrier is captured or recombined at the interface and then disappears.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

In order to obtain a highly purified intrinsic oxide semiconductor film, besides the high vacuum evacuation of the chamber, a highly purification of a sputtering gas is also needed. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor film can be prevented as much as possible.

Here, as the oxide film 107 containing In or Ga, a 35-nm-thick In—Ga—Zn oxide film (In:Ga:Zn=1:3:2) is formed by a sputtering method.

For the oxygen 109 added to the oxide film 107 containing In or Ga, a material and an addition method similar to those of the oxygen 13 described in Embodiment 1 can be used as appropriate.

Here, oxygen ions are added with a dose of $2\times10^{16}$/cm² to the oxide film 107 containing In or Ga by an ion implantation method at an accelerating voltage of 5 keV.

Figure 4C:
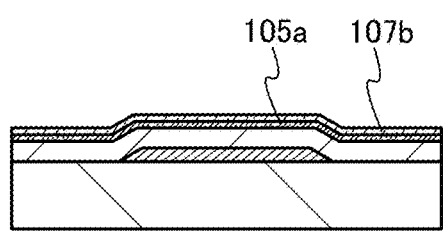

Next, in a manner similar to that of Embodiment 1, heat treatment is performed to make oxygen contained in the oxide film 107a to which oxygen is added transfer to the oxide semiconductor film 105, so that oxygen vacancies in the oxide semiconductor film 105 are filled with the oxygen; accordingly, the amount of oxygen vacancies in the oxide semiconductor film 105 is reduced. As a result, as illustrated in FIG. 4C, an oxide semiconductor film 105a which has the reduced amount of oxygen vacancies and the reduced density of localized levels can be formed. Further, in the oxide film 107a to which oxygen is added, the oxygen content is reduced by the heat treatment. In FIG. 4C, the oxide film is referred to as an oxide film 107b containing In or Ga.

Here, after heat treatment is performed at 450° C. for 1 hour in a nitrogen atmosphere, heat treatment is performed at 450° C. for 1 hour in a dry-air atmosphere.

Figure 4D:
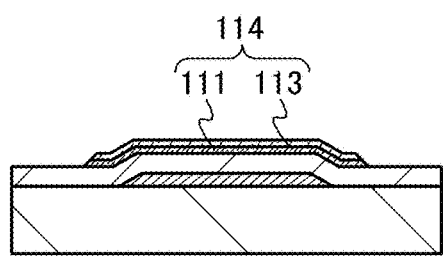

Next, a mask is formed over the oxide semiconductor film 105a by a photolithography step, and then with use of the mask, the oxide semiconductor film 105a and the oxide film 107b to which oxygen is added are partly etched, whereby a multilayer film 114 including an oxide semiconductor film 111 and an oxide film 113 to which oxygen is added is formed over the gate insulating film 104 so as to overlap with part of the gate electrode 103, as illustrated in FIG. 4D. After that, the mask is removed.

Note that of the multilayer film including an oxide semiconductor film with a reduced density of localized levels, the absorption coefficient calculated by CPM measurement is lower than $1\times10^{-3}$/cm, preferably lower than $1\times10^{-4}$/cm, further preferably lower than $5\times10^{-5}$/cm. Since the density of the localized levels of the multilayer film 114 in contact with the gate insulating film 104 is reduced, the density of carriers at the localized levels and electron traps in the oxide semiconductor film can be reduced. Thus, the amount of on-state current of the transistor formed in the later step can be increased, and the field effect mobility can be increased.

Figure 4E:
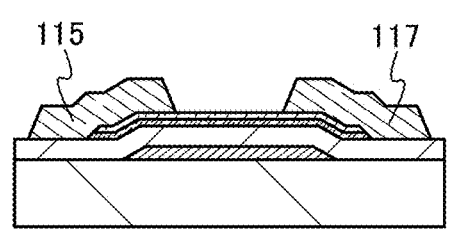

Next, as illustrated in FIG. 4E, a pair of electrodes 115 and 117 is formed.

The pair of electrodes 115 and 117 is formed to have a single-layer structure or a stacked structure including, as a conductive material, any of metals such as aluminum, titanium, chromium, nickel, copper, yttrium, zirconium, molybdenum, silver, tantalum, and tungsten or an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

A method for forming the pair of electrodes 115 and 117 is described below. First, a conductive film is formed by a sputtering method, a CVD method, an evaporation method, or the like. Then, a mask is formed over the conductive film by a photolithography step. Next, the conductive film is etched with use of the mask to form the pair of electrodes 115 and 117. After that, the mask is removed.

Here, a 50-nm-thick tungsten film, a 400-nm-thick aluminum film, and a 100-nm-thick titanium film are sequentially stacked by a sputtering method. Next, a mask is formed over the titanium film by a photolithography step and the tungsten film, the aluminum film, and the titanium film are subjected to dry etching with use of the mask to form the pair of electrodes 115 and 117.

After the pair of electrodes 115 and 117 is formed, cleaning treatment is preferably performed to remove an etching residue. A short circuit of the pair of electrodes 115 and 117 can be suppressed by this cleaning treatment. The cleaning treatment can be performed using an alkaline solution such as a tetramethylammonium hydroxide (TMAH) solution, or an acidic solution such as diluted hydrofluoric acid, an oxalic acid solution, or a phosphorus acid solution.

Figure 4F:
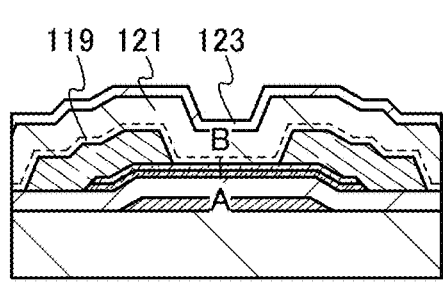

Next, as illustrated in FIG. 4F, a protective film is formed over the gate insulating film 104, the multilayer film 114, and the pair of electrodes 115 and 117. The protective film can be formed using a material and a formation method similar to those of the gate insulating film 104, as appropriate. Here, an oxide insulating film 119, an oxide insulating film 121, and a nitride insulating film 123 are stacked.

Here, as the oxide insulating film 119, a 50-nm-thick silicon oxynitride film is formed by a CVD method, and as the oxide insulating film 121, a 350-nm-thick silicon oxynitride film is formed by a CVD method. After that, heat treatment is performed at 350° C. for 1 hour in an atmosphere containing nitrogen and oxygen. Then, as the nitride insulating film 123, a 100-nm-thick silicon nitride film is formed by a CVD method.

Through the above steps, a transistor can be manufactured.

Here, a band structure along dashed-dotted line A-B in the vicinity of the multilayer film 114 in FIG. 4F is described with reference to FIGS. 5A to 5C.

A band structure along dashed-dotted line A-B in the vicinity of the multilayer film 114 in FIG. 4F is described with reference to FIG. 5A, and the flow of carrier in the transistor is described with reference to FIGS. 5B and 5C.

Figure 5A:
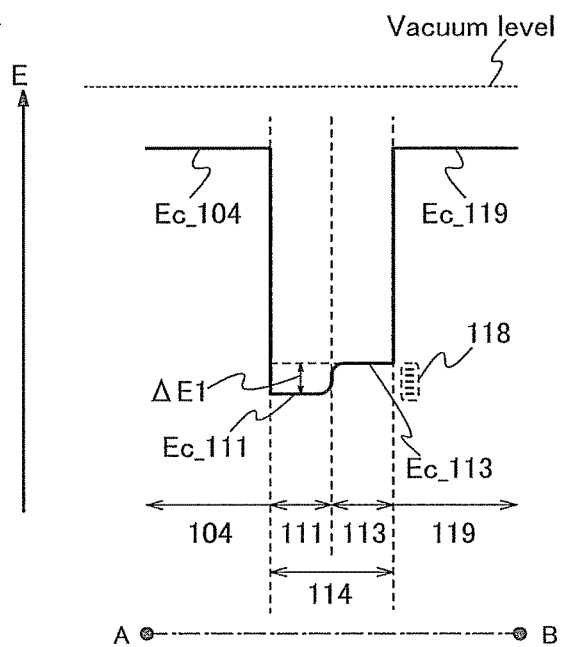
FIGS. 5A to 5C are diagrams showing a band structure of a transistor.
Figure 5B:
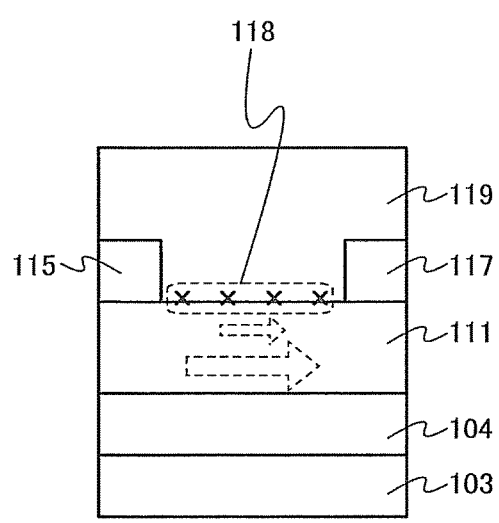

In FIG. 5A, for example, an In—Ga—Zn oxide (In:Ga:Zn=1:1:1) with an energy gap of 3.15 eV is used as the oxide semiconductor film 111, and an In—Ga—Zn oxide (In:Ga:Zn=1:3:2) with an energy gap of 3.5 eV is used as the oxide film 113 containing In or Ga. Note that the energy gap can be measured with use of a spectroscopic ellipsometer.

Further, the bottom of the conduction band of the oxide semiconductor film 111 is represented by Ec_111, and the bottom of the conduction band of the oxide film 113 containing In or Ga is represented by Ec_113. The bottom of the conduction band of the gate insulating film 104 is represented by Ec_104, and the bottom of the conduction band of the oxide insulating film 119 is represented by Ec_119.

As shown in FIG. 5A, in the multilayer film 114, the bottom of the conduction band in the vicinity of the interface between the oxide semiconductor film 111 and the oxide film 113 containing In or Ga varies continuously. Such a shape is caused by mutual transfer of oxygen between the oxide semiconductor film 111 and the oxide film 113 containing In or Ga. Further, in the multilayer film 114, an energy of the bottom of the conduction band of the oxide semiconductor film 111 is lowest, and this region functions as a channel region.

Now, a state where electrons serving as carrier flow is described with reference to FIGS. 5B and 5C. Note that in FIGS. 5B and 5C, the amount of electrons flowing in the oxide semiconductor film 111 is represented by a size of a dotted arrow.

In the vicinity of the interface between the oxide film 113 containing In or Ga and the oxide insulating film 119, trap levels 118 are formed by an impurity and defects. Thus, for example, in the case where a channel region of the transistor is formed with a single layer of the oxide semiconductor film 111 as illustrated in FIG. 5B, in the oxide semiconductor film 111, electrons serving as carrier flows mainly in the gate insulating film 104 side, but a small amount of electrons also flow on the oxide insulating film 119 side. As a result, part of electrons flowing on the oxide semiconductor film 111 is captured by the trap levels 118.

Figure 5C:
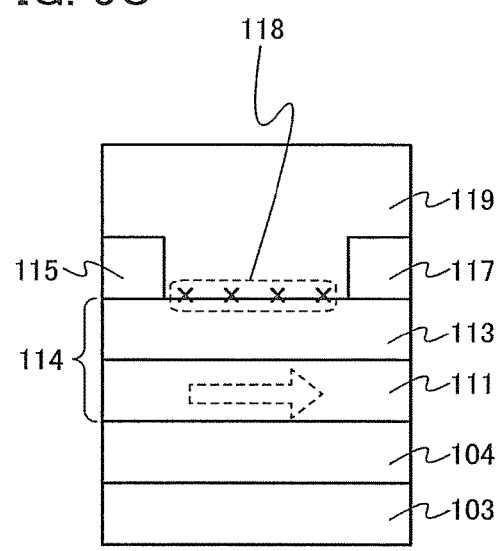

On the other hand, in the transistor described in this embodiment, the oxide film 113 containing In or Ga is provided between the oxide semiconductor film 111 and the oxide insulating film 119 as illustrated in FIG. 5C; thus, there is a distance between the oxide semiconductor film 111 and the trap levels 118. As a result, electrons flowing in the oxide semiconductor film 111 are less likely to be captured by the trap levels 118. When the electrons are captured by the trap levels 118, the electrons become negative fixed charges. As a result, a threshold voltage of the transistor fluctuates. However, by the distance between the oxide semiconductor film 111 and the trap levels 118, capture of the electrons by the trap levels 118 can be reduced, and accordingly a fluctuation of the threshold voltage can be reduced.

Further, when oxygen added to the oxide film 113 containing In or Ga transfers to the oxide semiconductor film 111, the amount of oxygen vacancies in the oxide semiconductor film 111 can be reduced.

As a result, of the multilayer film 114, the absorption coefficient calculated by CPM measurement is lower than $1 \times 10^{-3}$/cm, preferably lower than $1 \times 10^{-4}$/cm, further preferably lower than $5 \times 10^{-5}$/cm.

Note that when the energy difference $\Delta E1$ of the bottom of the conduction band in the vicinity of the interface between the oxide semiconductor film 111 and the oxide film 113 containing In or Ga is small, carrier flowing in the oxide semiconductor film 111 transcends the bottom of the conduction band of the oxide film 113 containing In or Ga and is captured by the trap levels. Thus, the energy difference $\Delta E1$ of the bottom of the conduction band between the oxide semiconductor film 111 and the oxide film 113 containing In or Ga is greater than or equal to 0.1 eV, preferably greater than or equal to 0.15 eV.

Through the above steps, the density of localized levels of the oxide semiconductor film is reduced, and a transistor with excellent electric characteristics can be manufactured. In addition, a highly reliable transistor in which a variation in electric characteristics with time or a variation in electric characteristics due to a stress test is small can be manufactured.

Modification Example 1

It is preferable that the oxide semiconductor film 111 be highly purified by reducing the amount of impurities, which enables a transistor with excellent electric characteristics to be manufactured. Examples of the impurities include hydrogen, nitrogen, an alkali metal, and an alkaline earth metal.

Hydrogen contained in the oxide semiconductor reacts with oxygen bonded to a metal atom to be water, and also causes oxygen vacancies in a lattice from which oxygen is released (or a portion from which oxygen is released). In addition, the reaction of part of hydrogen and oxygen causes generation of electrons serving as carrier. Thus, a transistor including an oxide semiconductor which contains hydrogen is likely to be normally on.

Accordingly, it is preferable that hydrogen be reduced as much as possible in the oxide semiconductor film 111. Specifically, the hydrogen concentration of the oxide semiconductor film 111, which is measured by secondary ion mass spectrometry (SIMS), is lower than $5 \times 10^{18}$ atoms/cm$^3$, preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$.

As a method for reducing the hydrogen concentration in the oxide semiconductor film 111, heat treatment is performed to make oxygen transfer from the oxide film 107a to which oxygen is added to the oxide semiconductor film 105 in FIG. 4B, whereby the hydrogen concentration in the oxide semiconductor film 105a can be reduced. In other words, in this embodiment, one heat treatment enables the amount of the oxide vacancies in the oxide semiconductor film to be reduced and also enables the hydrogen concentration to be reduced.

Further, the concentration of alkali metals or alkaline earth metals in the oxide semiconductor film 111, which is measured by SIMS, is lower than or equal to $1 \times 10^{18}$ atoms/cm$^3$, preferably lower than or equal to $2 \times 10^{16}$ atoms/cm$^3$. When each of an alkali metal and an alkaline earth metal is bonded to an oxide semiconductor, a carrier might be generated, which might cause an increase in the off-state current of the transistor. Thus, it is preferable to reduce the concentration of alkali metals or alkaline earth metals in the oxide semiconductor film 111.

When a nitride insulating film is provided as part of the gate insulating film 104, the concentration of alkali metals or alkaline earth metals in the oxide semiconductor film 111 can be reduced.

Further, when nitrogen is contained in the semiconductor film 111, electrons serving as carrier are generated and the carrier density increases, so that the oxide semiconductor film easily becomes n-type. Thus, a transistor including an oxide semiconductor which contains nitrogen is likely to be normally on. For this reason, nitrogen in the oxide semiconductor film is preferably reduced as much as possible; the concentration of nitrogen is preferably set to, for example, lower than or equal to $5 \times 10^{18}$ atoms/cm$^3$.

When such an oxide semiconductor film highly purified by reducing impurities (such as hydrogen, nitrogen, an alkali metal, and an alkaline earth metal) as much as possible is used as the semiconductor film 111, the transistor can be prevented from being normally on, so that the off-state current of the transistor can be significantly reduced. Accordingly, a semiconductor device having favorable electrical characteristics can be manufactured. Further, a semiconductor device with improved reliability can be manufactured.

Various experiments can prove the low off-state current of a transistor including a highly purified oxide semiconductor film. For example, even when an element has a channel width (W) of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage (drain voltage) between the source electrode and the drain electrode of from 1 V to 10 V. In that case, it can be found that a value obtained by dividing the off-state current by the channel width of the transistor is less than or equal to 100 zA/μm. Further, the off-state current is measured with use of a circuit in which a capacitor and a transistor are connected to each other and charge that flows in or out from the capacitor is controlled by the transistor. In the measurement, a purified oxide semiconductor film is used for a channel region of the transistor, and the off-state current of the transistor is measured from a change in the amount of charge of the capacitor per unit time. As a result, it is found that in the case where the voltage between the source electrode and the drain electrode of the transistor is 3 V, a lower off-state current of several tens of yoctoamperes per micrometer (yA/μm) can be obtained. Thus, the transistor including the highly purified oxide semiconductor film has a significantly low off-state current.

Modification Example 2

Note that although in this embodiment, the pair of electrodes 115 and 117 is provided between the multilayer film 114 and the oxide insulating film 119, the pair of electrodes 115 and 117 may be provided between the gate insulating film 104 and the multilayer film 114.

Modification Example 3

Insulating films which can be used for the oxide insulating film 119, the oxide insulating film 121, and the nitride insulating film 123 described in this embodiment are described below.

As one or both of the oxide insulating film 119 and the oxide insulating film 121, an oxide insulating film containing oxygen in excess of the stoichiometric composition may be used. With use of such a film, the oxygen contained in the oxide insulating film can be transferred to the oxide semiconductor film, and with the oxygen, oxygen vacancies can be filled. For example, when the number of oxygen molecules released from an oxide insulating film is greater than or equal to $1.0 \times 10^{18}$ molecules/cm$^3$ when measured by thermal desorption spectroscopy (hereinafter referred to as TDS spectroscopy), with use of such an oxide insulating film, the oxygen vacancies in the oxide semiconductor film can be filled.

Further, the oxide insulating film 119 is in contact with the multilayer film 114; thus, when it is an oxide insulating film with a low density of interface levels at the interface with the multilayer film 114, electric characteristics of the transistor are further improved. For example, the insulating film 119 is preferably an oxide insulating film having a lower defect density than the oxide insulating film 121. Specifically, the spin density of the oxide insulating film at a g-value of 2.001 (E'-center) obtained by electron spin resonance is $3.0 \times 10^{17}$ spins/cm$^3$ or lower, preferably $5.0 \times 10^{16}$ spins/cm$^3$ or lower. The spin density at a g-value of 2.001 measured by electron spin resonance spectroscopy corresponds to the number of dangling bonds in the oxide insulating film 119.

The thickness of the oxide insulating film 119 can be greater than or equal to 5 nm and less than or equal to 150 nm, preferably greater than or equal to 5 nm and less than or equal to 50 nm, further preferably greater than or equal to 10 nm and less than or equal to 30 nm. The thickness of the oxide insulating film 121 can be greater than or equal to 30 nm and less than or equal to 500 nm, preferably greater than or equal to 150 nm and less than or equal to 400 nm.

In the case where an oxide insulating film containing nitrogen, such as a silicon oxynitride film or a silicon nitride oxide film, is used as one or both of the oxide insulating film 119 and the oxide insulating film 121, the nitrogen concentration measured by SIMS is higher than or equal to the lower limit of measurement by SIMS and lower than $3 \times 10^{20}$ atoms/cm$^3$, preferably higher than or equal to $1 \times 10^{18}$ atoms/cm$^3$ and lower than or equal to $1 \times 10^{20}$ atoms/cm$^3$. With use of such a film, the amount of nitrogen transferred to the oxide semiconductor film 111 in the transistor can be small. In addition, the number of defects in the oxide insulating film containing nitrogen itself can be reduced.

As the nitride insulating film 123, a nitride insulating film where the hydrogen content is low may be provided. The nitride insulating film is as follows, for example: the number of hydrogen molecules released from the nitride insulating film is less than $5.0 \times 10^{21}$ atoms/cm$^3$, preferably less than $3.0 \times 10^{21}$ atoms/cm$^3$, further preferably less than $1.0 \times 10^{21}$ atoms/cm$^3$ when measured by TDS spectroscopy.

The nitride insulating film 123 has a thickness large enough to prevent entry of impurities such as hydrogen and water from the outside. For example, the thickness can become greater than or equal to 50 nm and less than or equal to 200 nm, preferably greater than or equal to 50 nm and less than or equal to 150 nm, and further preferably greater than or equal to 50 nm and less than or equal to 100 nm.

In the case where an oxide insulating film which causes few interface levels between the oxide semiconductor film 111 and the oxide insulating film is used as the oxide insulating film 119, the oxide insulating film 119 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the treatment chamber, the pressure in the treatment chamber is higher than or equal to 20 Pa and lower than or equal to 250 Pa, preferably higher than or equal to 40 Pa and lower than or equal to 200 Pa, and high frequency power is supplied to an electrode provided in the treatment chamber.

Typical examples of the deposition gas containing silicon include silane, disilane, trisilane, and silane fluoride. Examples of the oxidizing gas include oxygen, ozone, dinitrogen monoxide, and nitrogen dioxide.

By setting the ratio of the amount of the oxidizing gas to the amount of the deposition gas containing silicon to 100 or higher, the hydrogen content in the oxide insulating film 119 can be reduced and dangling bonds in the oxide insulating film 119 can be reduced. Oxygen transferred from the oxide insulating film 121 might be captured by the dangling bonds in the oxide insulating film 119. However, when the number of the dangling bonds in the oxide insulating film 119 is reduced, the oxygen contained in the oxide insulating film 121 transfers to the multilayer film 114 efficiently, and the oxygen vacancies in the oxide semiconductor film 111 included in the multilayer film 114 can be further filled. As a result, the amount of hydrogen which enters the oxide semiconductor film can be reduced and the amount of oxygen vacancies in the oxide semiconductor film can be reduced.

In the case where the above oxide insulating film which includes an oxygen excess region or the above oxide insulating film containing oxygen in excess of the stoichiometric composition is used as the oxide insulating film 121, the oxide insulating film 121 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 260° C., preferably higher than or equal to 180° C. and lower than or equal to 230° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high-frequency power that is higher than or equal to 0.17 W/cm$^2$ and lower than or equal to 0.5 W/cm$^2$, preferably, higher than or equal to 0.25 W/cm$^2$ and lower than or equal to 0.35 W/cm$^2$ is supplied to an electrode provided in the treatment chamber.

As the source gas of the oxide insulating film 121, a source gas which can be used for the oxide insulating film 119 can be used.

As for the formation conditions of the oxide insulating film 121, the high-frequency power having the above power density is supplied to the treatment chamber having the above pressure, whereby the decomposition efficiency of the source gas in plasma is increased, oxygen radicals are increased, and oxidation of the source gas proceeds; therefore, the oxygen content in the oxide insulating film 121 is higher than that in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen in excess of the stoichiometric composition and from which part of oxygen is released by heating. Further, the oxide insulating film 119 is provided over the multilayer film 114. Thus, in formation of the oxide insulating film 121, the oxide insulating film 119 serves as a protective film of the multilayer film 114. Thus, even when the oxide insulating film 121 is formed using the high-frequency power having a high power density, damage to the multilayer film 114 can be suppressed.

In the case where a nitride insulating film with a low hydrogen content is used as the nitride insulating film 123, the nitride insulating film 123 can be formed under the following formation conditions. Here, as the nitride insulating film, a silicon nitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high frequency power is supplied to an electrode provided in the treatment chamber.

As the source gas of the nitride insulating film 123, a deposition gas containing silicon, a nitrogen gas, and an ammonia gas are preferably used. Typical examples of the deposition gas containing silicon include silane, disilane, trisilane, and silane fluoride. Further, the flow rate of nitrogen is preferably 5 times to 50 times that of ammonia, further preferably 10 times to 50 times that of ammonia. The use of ammonia as the source gas facilitates decomposition of nitrogen and the deposition gas containing silicon. This is because ammonia is dissociated by plasma energy or heat energy, and energy generated by the dissociation contributes to decomposition of a bond of the deposition gas molecules containing silicon and a bond of nitrogen molecules. Under the above conditions, a silicon nitride film which has a low hydrogen content and can suppress entry of impurities such as hydrogen and water from the outside can be formed.

Note that the nitride insulating film 123 functions as a blocking film against hydrogen or water; thus after the oxide insulating film 119 and the oxide insulating film 121 are formed, heat treatment is performed to make hydrogen or water contained in the oxide insulating film 119 and the oxide insulating film 121 to be released, and then the nitride insulating film 123 is preferably formed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C.

Modification Example 4

Figure 8:
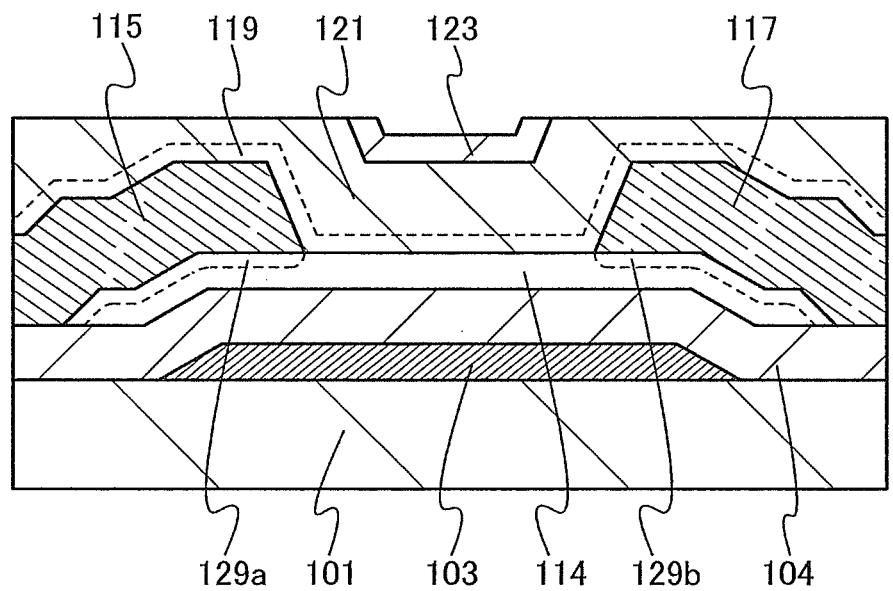
FIG. 8 illustrates one embodiment of a transistor.

As the pair of electrodes 115 and 117 provided in the transistor of this embodiment, it is preferable to use a conductive material which is easily bonded to oxygen, such as tungsten, titanium, aluminum, copper, molybdenum, chromium, tantalum, or an alloy of any of the materials. In this case, oxygen contained in the multilayer film 114 and the conductive material contained in the pair of electrodes 115 and 117 are bonded, and accordingly, an oxygen vacancy region is formed in the multilayer film 114. Further, in some cases, part of constituent elements of the conductive material forming the pair of electrodes 115 and 117 is mixed into the multilayer film 114. As a result, in the multilayer film 114, low resistant regions 129a and 129b are formed in vicinity of a region in contact with the pair of electrodes 115 and 117 (refer to FIG. 8, which is an enlarged cross-sectional view showing the multilayer film 114 in FIG. 4F). Since the low resistance regions 129a and 129b have high conductivity, the contact resistance between the multilayer film 114 and the pair of electrodes 115 and 117 can be reduced, and thus, the on-state current of the transistor can be increased.

Note that the structures, methods, and the like described in this embodiment can be used as appropriate in combination with any of the structures, methods, and the like described in the other embodiments and examples.

Embodiment 5

In this embodiment, a method for manufacturing a highly reliable semiconductor device with less change in the threshold voltage will be described. Typically, a semiconductor device is manufactured using the multilayer film including an oxide semiconductor film with a reduced density of localized levels described in any of Embodiment 1 to Embodiment 3.

In this embodiment, a method for manufacturing a top-gate transistor is described. Further, for a method for forming an oxide semiconductor film, the description in Embodiment 3 is referred to.

Figure 6A:
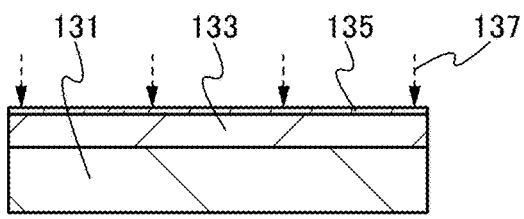
FIGS. 6A to 6F illustrate one embodiment of a method for manufacturing a transistor.
Figure 6B:
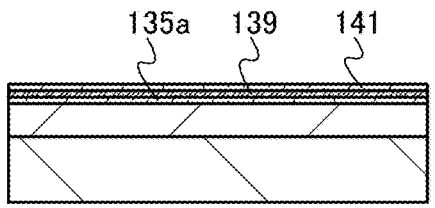

As illustrated in FIG. 6A, over a substrate 131, an oxide insulating film 133 functioning as a base insulating film is formed, and an oxide film 135 containing In or Ga is formed over the oxide insulating film 133. Next, in a manner similar to that of Embodiment 3, oxygen 137 is added to the oxide film 135 containing In or Ga, so that an oxide film containing In or Ga, to which oxygen is added (hereinafter referred to as an oxide film 135a to which oxygen is added) is formed as illustrated in FIG. 6B.

As the substrate 131, a substrate which is given as an example of the substrate 1 in Embodiment 1 can be used as appropriate.

Here, a glass substrate is used as the substrate 131.

The oxide insulating film 133 can be formed as appropriate using a material and a formation method which are similar to those of the oxide insulating film 3 described in Embodiment 1 and Modification Example 1.

In this embodiment, a 300-nm-thick silicon oxide film formed by a sputtering method is used as the oxide insulating film 133.

The oxide film 135 containing In or Ga can be formed as appropriate using a material and a formation method which are similar to those of the oxide film 11 containing In or Ga described in Embodiment 1.

The thickness of the oxide film 135 containing In or Ga is greater than or equal to 3 nm and less than or equal to 100 nm, preferably greater than or equal to 3 nm and less than or equal to 50 nm.

As the oxide film 135 containing In or Ga, a 5-nm-thick In—Ga—Zn oxide film (In:Ga:Zn=1:3:2) is formed by a sputtering method.

For the oxygen 137 added to the oxide film 135 containing In or Ga, a material and an addition method similar to those of the oxygen 13 described in Embodiment 1 can be used as appropriate.

Here, oxygen ions are added with a dose of $2 \times 10^{16}/cm^2$ to the oxide film 135 containing In or Ga by an ion implantation method at an accelerating voltage of 5 keV.

Next, as illustrated in FIG. 6B, an oxide semiconductor film 139 is formed over the oxide film 135a to which oxygen is added. Then, an oxide film 141 containing In or Ga is formed over the oxide semiconductor film 139.

The oxide semiconductor film 139 can be formed as appropriate using a material and a formation method which are similar to those of the oxide semiconductor film 15 described in Embodiment 1. The thickness of the oxide semiconductor film 139 is greater than or equal to 3 nm and less than or equal to 200 nm, preferably greater than or equal to 3 nm and less than or equal to 100 nm, further preferably greater than or equal to 3 nm and less than or equal to 50 nm.

The oxide film 141 containing In or Ga can be formed as appropriate using a material and a formation method which are similar to those of the oxide film 11 containing In or Ga described in Embodiment 1. The thickness of the oxide film 141 containing In or Ga is greater than or equal to 3 nm and less than or equal to 100 nm, preferably greater than or equal to 3 nm and less than or equal to 50 nm.

Here, as the oxide semiconductor film 139, a 15-nm-thick In—Ga—Zn oxide film (In:Ga:Zn=1:1:1) is formed by a sputtering method.

Here, as the oxide film 141 containing In or Ga, a 5-nm-thick In—Ga—Zn oxide film (In:Ga:Zn=1:3:2) is formed by a sputtering method.

Figure 6C:
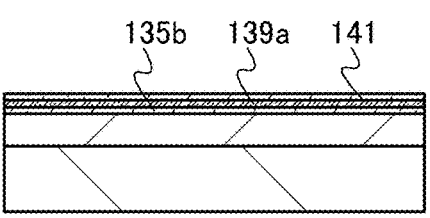

Next, in a manner similar to that of Embodiment 1, heat treatment is performed to make oxygen contained in the oxide film 135a to which oxygen is added transfer to the oxide semiconductor film 139, so that oxygen vacancies in the oxide semiconductor film 139 are filled with the oxygen; accordingly, the amount of oxygen vacancies in the oxide semiconductor film 139 is reduced. As a result, as illustrated in FIG. 6C, an oxide semiconductor film 139a which has the reduced amount of oxygen vacancies and the reduced density of localized levels can be formed. Further, in the oxide film 135a to which oxygen is added, the oxygen content is reduced by the heat treatment. In FIG. 6C, the oxide film is referred to as an oxide film 135b containing In or Ga.

Here, after heat treatment is performed at 450° C. for 1 hour in a nitrogen atmosphere, heat treatment is performed at 450° C. for 1 hour in a dry-air atmosphere.

Figure 6D:
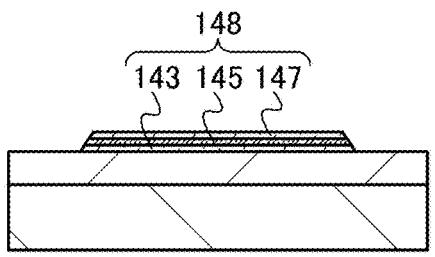

Next, a mask is formed over the oxide film 141 containing In or Ga by a photolithography step, and then with use of the mask, the oxide film 135b containing In or Ga, the oxide semiconductor film 139a, and the oxide film 141 containing In or Ga are partly etched, whereby a multilayer film 148 including an oxide film 143 containing In or Ga, an oxide semiconductor film 145, and an oxide film 147 containing In or Ga is formed, as illustrated in FIG. 6D. After that, the mask is removed.

Note that in the multilayer film including an oxide semiconductor film with a reduced density of localized levels, the absorption coefficient calculated by CPM measurement is lower than $1\times10^{-3}$/cm, preferably lower than $1\times10^{-4}$/cm, further preferably lower than $5\times10^{-5}$/cm. The oxide film 143 containing In or Ga is provided between the oxide insulating film 133 and the oxide semiconductor film 145, and the oxide film 147 containing In or Ga is provided between the oxide semiconductor film 145 and a gate insulating film 153 that is formed in a later step. Part of the oxide semiconductor film 145 functions as a channel region. Further, each of the oxide film 143 containing In or Ga and the oxide film 147 containing In or Ga includes at least one of metal elements constituting the oxide semiconductor film 145. Since the density of the localized levels at the interface between the oxide film 143 containing In or Ga and the oxide semiconductor film 145 and the density of the localized levels at the interface between the oxide semiconductor film 145 and the oxide film 147 containing In or Ga are reduced, the density of carriers at the localized levels and electron traps in the oxide semiconductor film can be reduced. Thus, the amount of on-state current of the transistor formed in the later step can be increased, and the field effect mobility can be increased.

Figure 6E:
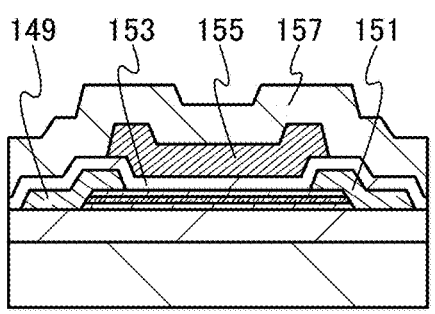

Next, as illustrated in FIG. 6E, a pair of electrodes 149 and 151 is formed over the multilayer film 148. Then, the gate insulating film 153 is formed over the multilayer film 148 and the pair of electrodes 149 and 151. Next, a gate electrode 155 is formed in a region which is over the gate insulating film 153 and overlaps with the multilayer film 148. After heat treatment is performed, a protective film 157 is formed over the gate insulating film 153 and the gate electrode 155.

The pair of electrodes 149 and 151 can be formed as appropriate using a material and a formation method which are similar to those of the pair of electrodes 115 and 117 described in Embodiment 4.

In this embodiment, after a 100-nm-thick tungsten film is formed, a mask is formed over the tungsten film by a photolithography step and the tungsten film is dry-etched with use of the mask to form the pair of electrodes 149 and 151.

The gate insulating film 153 can be formed as appropriate using a material and a formation method which are similar to those of the gate insulating film 104 described in Embodiment 4.

In this embodiment, the gate insulating film 153 is formed using a 30-nm-thick silicon oxynitride film by a plasma CVD method.

The gate electrode 155 can be formed as appropriate using a material and a formation method which are similar to those of the gate electrode 103 described in Embodiment 4.

In this embodiment, a 15-nm-thick tantalum nitride film and a 135-nm-thick tungsten film are formed in this order by a sputtering method. Next, a mask is formed by a photolithography step and the tantalum nitride film and the tungsten film are dry-etched with use of the mask to form the gate electrode 155.

The heat treatment is performed typically at a temperature higher than or equal to 150° C. and lower than the strain point of the substrate, preferably higher than or equal to 250° C. and lower than or equal to 500° C., further preferably higher than or equal to 300° C. and lower than or equal to 450° C.

Here, the heat treatment is performed at 350° C. for 1 hour in an atmosphere of nitrogen and oxygen.

The protective film 157 can be formed as appropriate using a material and a formation method which are similar to those of the protective film described in Embodiment 4.

In this embodiment, a 70-nm-thick aluminum oxide film is formed by a sputtering method, and a 300-nm-thick silicon oxynitride film is formed by a CVD method, whereby the protective film 157 is formed.

Figure 6F:
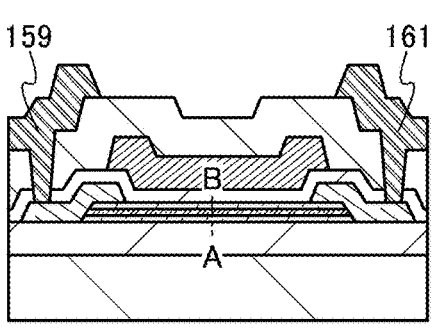

Next, as illustrated in FIG. 6F, after openings are formed in the protective film 157, wirings 159 and 161 which are connected to the pair of electrodes 149 and 151 are formed.

The wirings 159 and 161 can be formed in a manner similar to that of the pair of electrodes 149 and 151. Alternatively, the wirings 159 and 161 can be formed by a damascene method.

Through the above steps, a transistor can be manufactured.

Here, a band structure along dashed-dotted line A-B in the vicinity of the multilayer film 148 in FIG. 6F is described with reference to FIG. 7A, and the flow of carrier in the transistor is described with reference to FIG. 7B.

Figure 7A:
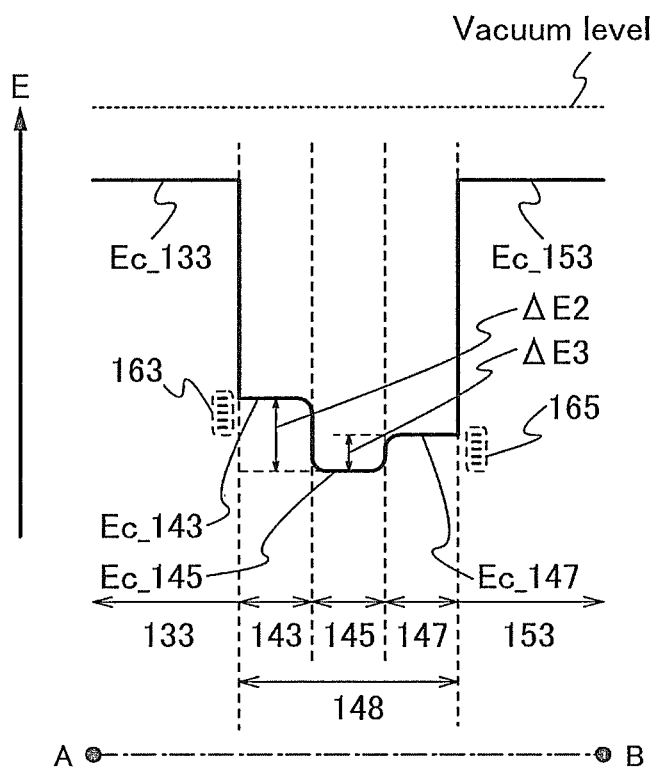
FIGS. 7A and 7B are diagrams showing a band structure of a transistor.
Figure 7B:
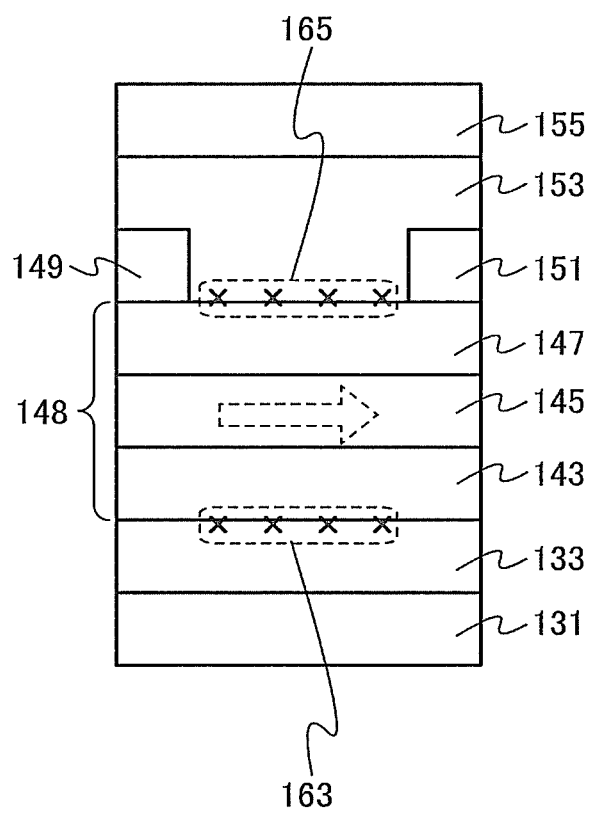

In the band structure shown in FIG. 7A, an In—Ga—Zn oxide with an energy gap of 3.8 eV is used as the oxide film 147 containing In or Ga (In:Ga:Zn=1:6:4), an In—Ga—Zn oxide with an energy gap of 3.15 eV is used as the oxide semiconductor film 145, and an In—Ga—Zn oxide with an energy gap of 3.5 eV is used as the oxide film 147 containing In or Ga (In:Ga:Zn=1:3:2).

Further, the bottom of the conduction band of the oxide film 143 containing In or Ga is represented by Ec_143, the bottom of the conduction band of the oxide semiconductor film 145 is represented by Ec_145, and the bottom of the conduction band of the oxide film 147 containing In or Ga is represented by Ec_147. The bottom of the conduction band of the oxide insulating film 133 is represented by Ec_133, and the bottom of the conduction band of the gate insulating film 153 is represented by Ec_153.

As shown in FIG. 7A, in the multilayer film 148, the bottom of the conduction band in the vicinity of the interface between the oxide film 143 containing In or Ga and the oxide semiconductor film 145 and the bottom of the conduction band in the vicinity of the interface between the oxide semiconductor film 145 and the oxide film 147 containing In or Ga vary continuously. A structure with such a bottom of the conduction band is also called an U-shape well structure. Such a shape is caused by mutual transfer of oxygen between the oxide film 143 containing In or Ga, the oxide semiconductor film 145, and the oxide film 147 containing In or Ga. Further, in the multilayer film 148, an energy of the bottom of the conduction band of the oxide semiconductor film 145 is lowest, and this region functions as a channel region.

Now, a state where electrons serving as carrier flow is described with reference to FIG. 7B. Note that in FIG. 7B, the amount of electrons flowing in the oxide semiconductor film 145 is represented by a size of a dotted arrow.

In the vicinity of the interface between the oxide insulating film 133 and the oxide film 143 containing In or Ga, trap levels 163 are formed by an impurity and defects. In addition, in the vicinity of the interface between the oxide film 147 containing In or Ga and the gate insulating film 153, trap levels 165 are formed by an impurity and defects. In the multilayer film 148 in this embodiment, the oxide film 143 containing In or Ga is provided between the oxide semiconductor film 145 and the oxide insulating film 133; thus, there is a distance between the oxide semiconductor film 145 and the trap levels 163. In addition, the oxide film 147 containing In or Ga is provided between the oxide semiconductor film 145 and the gate insulating film 153; thus, there is a distance between the oxide semiconductor film 145 and the trap levels 165. As a result, electrons flowing in the oxide semiconductor film 145 are less likely to be captured by the trap levels 163 and 165. Accordingly, the amount of on-state current of the transistor can be increased, and the field-effect mobility can be increased. When the electrons are captured by the trap levels 163 and 165, the electrons become negative fixed charges. As a result, a threshold voltage of the transistor fluctuates. However, by the distance between the oxide semiconductor film 145 and the trap levels 163 and 165, capture of the electrons by the trap levels 163 and 165 can be reduced, and accordingly a fluctuation of the threshold voltage can be reduced.

Further, when oxygen added to the oxide film 143 containing In or Ga transfers to the oxide semiconductor film 145, the amount of oxygen vacancies in the oxide semiconductor film 145 can be reduced.

As a result, of the multilayer film 148, the absorption coefficient calculated by CPM measurement is lower than $1 \times 10^{-3}$/cm, preferably lower than $1 \times 10^{-4}$/cm, further preferably lower than $5 \times 10^{-5}$/cm.

Note that when the energy difference $\Delta E2$ of the bottom of the conduction band in the vicinity of the interface between the oxide film 143 containing In or Ga and the oxide semiconductor film 145 and the energy difference $\Delta E3$ of the bottom of the conduction band in the vicinity of the interface between the oxide semiconductor film 145 and the oxide film 147 containing In or Ga are each small, carrier flowing in the oxide semiconductor film 145 transcends the bottom of the conduction band of each of the oxide film 143 containing In or Ga and the oxide film 147 containing In or Ga, and is captured by the trap levels 163 and 165. Thus, each of the energy difference $\Delta E2$ of the bottom of the conduction band between the oxide film 143 containing In or Ga and the oxide semiconductor film 145 and the energy difference $\Delta E3$ of the bottom of the conduction band between the oxide semiconductor film 145 and the oxide film 147 containing In or Ga is greater than or equal to 0.1 eV, preferably greater than or equal to 0.15 eV.

Note that when the energy difference $\Delta E3$ in the vicinity of the interface between the oxide semiconductor film 145 and the oxide film 147 containing In or Ga is small as compared with the energy difference $\Delta E2$ in the vicinity of the interface between the oxide film 143 containing In or Ga and the oxide semiconductor film 145, resistance between the oxide semiconductor film 145 and the pair of electrodes 149 and 151 can be reduced. Thus, the amount of on-state current of the transistor can be further increased, and the field-effect mobility can be further increased.

Although the energy difference $\Delta E3$ is smaller than the energy difference $\Delta E2$, the energy difference $\Delta E2$ and the energy difference $\Delta E3$ can be same or the energy difference $\Delta E3$ can be larger than the energy difference $\Delta E2$ by selecting, as appropriate, constituent elements and compositions of the oxide film 143 containing In or Ga, the oxide semiconductor film 145, and the oxide film 147 containing In or Ga.

Through the above steps, the density of localized levels of the oxide semiconductor film is reduced, and a transistor with excellent electric characteristics can be manufactured. In addition, a highly reliable transistor in which a variation in electric characteristics with time or a variation in electric characteristics due to a stress test is small can be manufactured.

Modification Example 1

It is preferable that the oxide semiconductor film 145 be highly purified by reducing the amount of impurities as in the oxide semiconductor film 111 described in Modification Example 1 in Embodiment 4 because a transistor with more excellent electric characteristics can be manufactured.

Modification Example 2

Although in this embodiment, the pair of electrodes 149 and 151 is provided between the multilayer film 148 and the gate insulating film 153, the pair of electrodes 149 and 151 may be provided between the oxide insulating film 133 and the multilayer film 148.

Modification Example 3

As the gate insulating film 153 described in this embodiment, any of the oxide insulating film 119, the oxide insulating film 121, and the nitride insulating film 123, which are described in Modification Example 3 in Embodiment 4 can be used as appropriate.

Modification Example 4

In formation of the multilayer film 148 illustrated in FIG. 6D in this embodiment, an etching residue generated at the time of etching the oxide film 135b containing In or Ga, the oxide semiconductor film 139a, and the oxide film 141 containing In or Ga is, in some times, attached to side surfaces of the multilayer film 148. The attached substance on the side surfaces of the multilayer film 148 is an oxide containing In or Ga, which has the same composition of the oxide films 143 and 147 containing In or Ga or higher insulating properties than the oxide films 143 and 147 containing In or Ga. The substance is attached on the side walls of the oxide semiconductor film 145 in the multilayer film 148 in the channel width direction. In other words, the attached substance and the gate insulating film 153 are provided between the oxide semiconductor film 145 and the gate electrode 155. Thus, a distance between the oxide semiconductor film 145 and the gate electrode is increased. As a result, generation of a leakage current in the region can be suppressed.

Modification Example 5

Figure 9A:
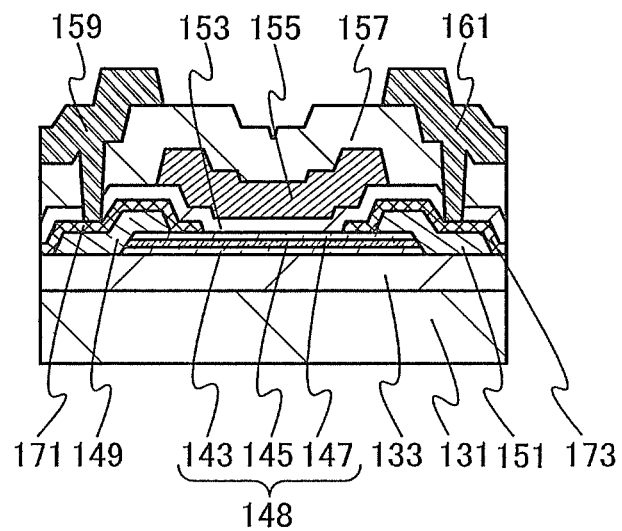
FIGS. 9A and 9B illustrate one embodiment of a semiconductor device.

Further, as illustrated in FIG. 9A, conductive films 171 and 173 may be provided over the pair of electrodes 149 and 151. In the case where the pair of electrodes 149 and 151 is formed using a conductive material which is easily bonded to oxygen, such as tungsten, titanium, aluminum, or copper, oxygen in the gate insulating film 153 is bonded to the conductive material, and resistance of the pair of electrodes 149 and 151 is increased. As a result, the amount of on-state current of the transistor is reduced. Thus, the conductive films 171 and 173 are provided so as to cover surfaces and side surface of the pair of electrodes 149 and 151, whereby an increase in resistance of the pair of electrodes 149 and 151 can be suppressed.

The conductive films 171 and 173 may be formed using tantalum nitride, titanium nitride, ruthenium, or the like. As the conductive films 171 and 173 are formed so as to cover the surfaces and the side surfaces of the pair of electrodes 149 and 151, the amount of on-state current of the transistor can be increased.

Note that a resist mask is processed by a method suitable for thinning processing, such as electron beam exposure, and the conductive film is etched with use of the resist mask, so that conductive films 172 and 174 are formed. Thus, a transistor in which the channel length is extremely small, typically the channel length is 30 nm or less, can be manufactured as in FIG. 9B. When a positive-type resist is used as the resist mask, an exposed region can be minimized, which makes it possible to manufacture a transistor whose channel length is 30 nm or less.

Figure 9B:
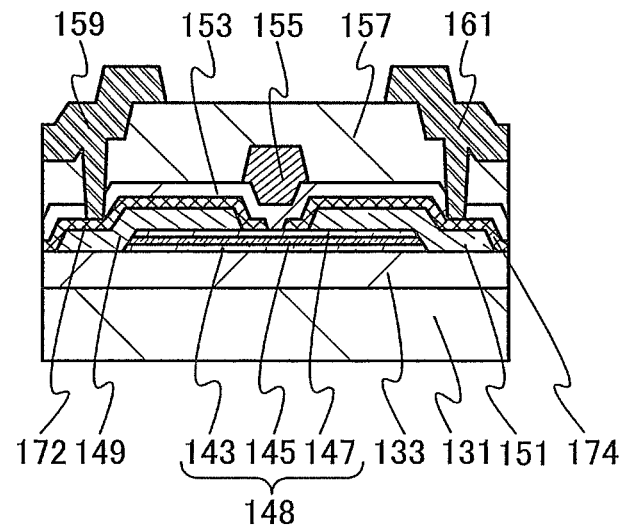

As illustrated in FIG. 9B, when a layout in which the pair of electrodes 149 and 151 and the gate electrode 155 do not overlap with each other is employed, parasitic capacitance between the pair of electrodes 149 and 151 and the gate electrode 155 can be reduced. Thus, the field-effect mobility of the transistor can be increased.

When the pair of electrodes 149 and 151 is formed using a conductive material which is easily bonded to oxygen, such as tungsten, titanium, aluminum, or copper, oxygen in the multilayer film 148 and the conductive material in the pair of electrodes 149 and 151 are bonded, and an oxygen vacancy region in the multilayer film 148 is formed. Since the region has higher conductivity, the contact resistance between the multilayer film 148 and the pair of electrodes 149 and 151 can be reduced, and the amount of on-state current of the transistor can be increased.

Modification Example 6

Figure 10A:
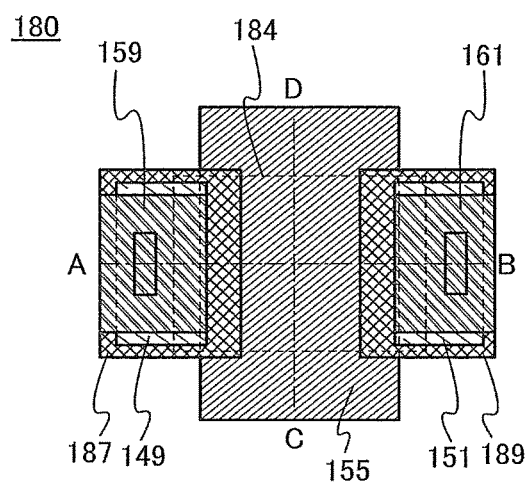
FIGS. 10A to 10C illustrate one embodiment of a semiconductor device.
Figure 10C:
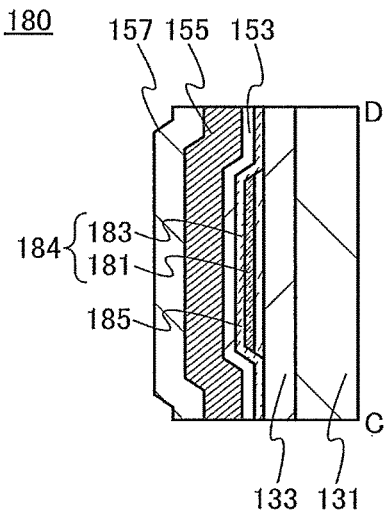
Figure 10B:
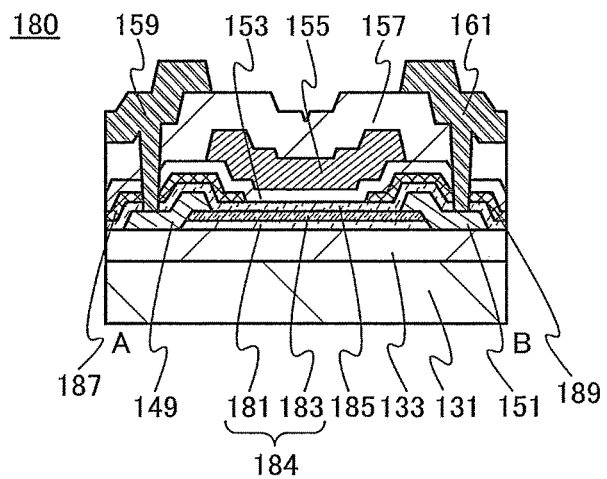

FIG. 10A to 10C are a top view and cross-sectional views of a transistor 180. FIG. 10A is a top view of the transistor 180, FIG. 10B is a cross-sectional view taken along dashed-dotted line A-B in FIG. 10A, and FIG. 10C is a cross-sectional view taken along dashed-dotted line C-D in FIG. 10A. Note that in FIG. 10A, part of components of the transistor 180 (e.g., the substrate 101, the oxide insulating film 133, the gate insulating film 153, an oxide film 185 containing In or Ga, the protective film 157, and the like) are not shown for simplicity.

The transistor 180 illustrated in FIGS. 10A to 10C includes the oxide insulating film 133 over the substrate 101, a multilayer film 184 formed over the oxide insulating film 133, the pair of electrodes 149 and 151 in contact with the multilayer film 184, the oxide film 185 containing In or Ga in contact with the oxide insulating film 133, the multilayer film 184, and the pair of electrodes 149 and 151, a pair of conductive films 187 and 189 in contact with the oxide film 185 containing In or Ga, the gate insulating film 153 covering the oxide film 185 containing In or Ga and the pair of conductive films 187 and 189, and the gate electrode 155 overlapping with the multilayer film 184 with the oxide film 185 containing In or Ga and the gate insulating film 153 interposed therebetween. In addition, the protective film 157 covering the gate insulating film 153 and the gate electrode 155 is provided. Furthermore, the wirings 159 and 161 in contact with the pair of electrodes 149 and 151 may be provided in openings formed in the gate insulating film 153, the oxide film 185 containing In or Ga, the pair of conductive films 187 and 189, and the protective film 157.

As illustrated in FIG. 10B, the transistor described in this embodiment can have a structure in which the multilayer film 184 including an oxide semiconductor film has a two-layer structure formed in accordance with Embodiment 1, the oxide film 185 containing In or Ga is provided over the pair of electrodes 149 and 151, and the pair of conductive films 187 and 189 is provided over the oxide film 185 containing In or Ga. As the multilayer film 184, an oxide film 181 containing In or Ga and an oxide semiconductor film 183 are stacked over the oxide insulating film 133.

The pair of conductive films 187 and 189 can be formed as appropriate using a material and a formation method which are similar to those of the conductive films 171 and 173 described in Modification Example 5.

When the oxide film 185 containing In or Ga is provided between the multilayer film 184 and the pair of conductive films 187 and 189, over-etching of the multilayer film 184 can be prevented in etching of the pair of conductive films 187 and 189.

Further, as illustrated in FIG. 10B, besides the gate insulating film 153, the oxide film 185 containing In or Ga is provided between the multilayer film 184 and the gate electrode 155. Thus, at end portions of the multilayer film 184 in the channel width direction of the transistor, the amount of the leakage current between the multilayer film 184 and the gate electrode 155 can be reduced.

Note that the structures, methods, and the like described in this embodiment can be used as appropriate in combination with any of the structures, methods, and the like described in the other embodiments and examples.

Embodiment 6

In this embodiment, a transistor having a different structure from the transistors in Embodiment 4 and Embodiment 5 will be described with reference to FIG. 11. A transistor in this embodiment includes a plurality of gate electrodes facing each other with a multilayer film including an oxide semiconductor film interposed therebetween.

Figure 11:
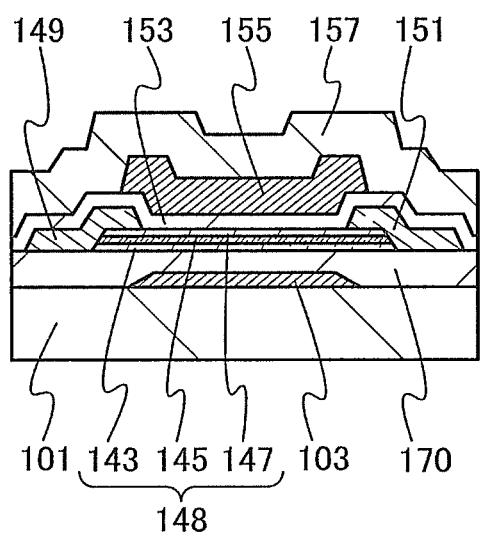
FIG. 11 illustrates one embodiment of a method for manufacturing a transistor.

A transistor illustrated in FIG. 11 includes the gate electrode 103 over the substrate 101. Over the substrate 101 and the gate electrode 103, a gate insulating film 170 is formed, the multilayer film 148 is provided to overlap with the gate electrode 103 with the gate insulating film 170 interposed therebetween, and the pair of electrodes 149 and 151 is provided to be in contact with the multilayer film 148. Further, the gate insulating film 153 is provided over the gate insulating film 170, the multilayer film 148, and the pair of electrodes 149 and 151. Furthermore, the gate electrode 155 is provided to overlap with the multilayer film 148 with the gate insulating film 153 interposed therebetween. In addition, the protective film 157 may be provided over the gate insulating film 153 and the gate electrode 155.

In this embodiment, as the multilayer film 148, a multilayer film having the structure described in Embodiment 3 is used, which is similar to that of the transistor in Embodiment 5. Specifically, the multilayer film 148 in which the oxide film 143 containing In or Ga, the oxide semiconductor film 145, and the oxide film 147 containing In or Ga are sequentially stacked is used. Note that the multilayer film described in Embodiment 1 and Embodiment 2 can be used as appropriate.

The gate insulating film 170 can be formed in a manner similar to that of the gate insulating film 104 in Embodiment 4. Further, after the gate insulating film 104 in Embodiment 4 is formed, the film is planarized, so that the gate insulating film 170 in FIG. 11 can be formed.

The transistor in this embodiment has the gate electrode 103 and the gate electrode 155 facing each other with the multilayer film 148 provided therebetween. By application of different potentials to the gate electrode 103 and the gate electrode 155, the threshold voltage of the transistor can be controlled. Alternatively, the same potential may be applied to the gate electrode 103 and the gate electrode 155. Further alternatively, the potential of the gate electrode 155 may be a fixed potential or a ground potential.

In this embodiment, the oxide semiconductor film is in contact with the oxide film containing at least one of metal elements constituting the oxide semiconductor film, that is, in contact with the oxide film containing In or Ga. Accordingly, the number of interface levels at an interface between the oxide film containing In or Ga and the oxide semiconductor film is extremely small. Thus, when oxygen is transferred from the oxide film containing In or Ga to the oxide semiconductor film, the oxygen is less likely to be captured by the interface levels, and the oxygen in the oxide film containing In or Ga can be efficiently transferred to the oxide semiconductor film. Further, with the oxygen transferred into the oxide semiconductor film, oxygen vacancies in the oxide semiconductor film are filled, and thus, the density of localized levels in the oxide semiconductor film can be reduced.

The oxide semiconductor film is in contact with the oxide film containing In or Ga. In other words, the oxide semiconductor film is provided over an oxide insulating film with the oxide film containing In or Ga, and accordingly the concentration of silicon or carbon which is one of elements belonging to Group 14 can be reduced. Therefore, the amount of oxygen vacancies in the oxide semiconductor film can be reduced, and the density of localized levels in the oxide semiconductor film can be reduced.

Further, since in the transistor in this embodiment, two gate electrodes face each other with the multilayer film including an oxide semiconductor film interposed therebetween, electric characteristics of the transistor can be easily controlled.

Note that the structures, methods, and the like described in this embodiment can be used as appropriate in combination with any of the structures, methods, and the like described in the other embodiments and examples.

Embodiment 7

In this embodiment, one embodiment applicable to an oxide semiconductor film in the transistor included in the semiconductor device described in the above embodiment will be described.

The oxide semiconductor film may be an amorphous oxide semiconductor, a single-crystal oxide semiconductor, or a polycrystalline oxide semiconductor. Further, the oxide semiconductor film may include an oxide semiconductor with a crystallinity part (CAAC-OS).

The CAAC-OS film is one of oxide semiconductor films including a plurality of crystal parts, and most of the crystal parts each fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of a microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depends on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

There are three methods for forming a CAAC-OS.

The first method is to form an oxide semiconductor film at a temperature in the range of 100° C. to 450° C. to form, in the oxide semiconductor film, crystal parts in which the c-axes are aligned in the direction parallel with a normal vector of a surface where the oxide semiconductor film is formed or a normal vector of a surface of the oxide semiconductor film.

The second method is to form an oxide semiconductor film with a small thickness and then heat it at a temperature in the range of 200° C. to 700° C., to form, in the oxide semiconductor film, crystal parts in which the c-axes are aligned in the direction parallel with a normal vector of a surface where the oxide semiconductor film is formed or a normal vector of a surface of the oxide semiconductor film.

The third method is to form a first oxide semiconductor film with a small thickness, then heat it at a temperature in the range of 200° C. to 700° C., and form a second oxide semiconductor film to form, in the second oxide semiconductor film, crystal parts in which the c-axes are aligned in the direction parallel with a normal vector of the surface where the second oxide semiconductor film is formed or to a normal vector of the top surface of the second oxide semiconductor film.

In a transistor in which a CAAC-OS is used for an oxide semiconductor film, change in electric characteristics due to irradiation with visible light or ultraviolet light is small. Accordingly, the transistor including a CAAC-OS film as an oxide semiconductor film has favorable reliability.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

By increasing the heating temperature of the surface where the CAAC-OS film is formed (for example, the substrate heating temperature) during the deposition, migration of a sputtered particle is likely to occur after the sputtered particle reaches the surface where the CAAC-OS film is formed. Specifically, the temperature of the surface where the CAAC-OS film is formed during the deposition is higher than or equal to 100° C. and lower than or equal to 740° C., preferably higher than or equal to 150° C. and lower than or equal to 500° C.

Furthermore, it is preferable that the proportion of oxygen in the deposition gas be increased and the power be optimized in order to reduce plasma damage at the deposition. The proportion of oxygen in the deposition gas is higher than or equal to 30 vol. % and lower than or equal to 100 vol. %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing a heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Note that the structures and the like described in this embodiment can be combined as appropriate with any of the structures and the like described in the other embodiments and example.

Embodiment 8

A semiconductor device with a display function (also referred to as a display device) can be manufactured by using the transistor whose example is described in the above embodiments. Moreover, some or all of the driver circuits which include the transistor can be formed over a substrate where the pixel portion is formed, whereby a system-on-panel can be obtained. In this embodiment, an example of a display device using the transistor examples of which are shown in the above embodiments is described with reference to FIGS. 12A to 12C and FIGS. 13A and 13B. FIGS. 13A and 13B are cross-sectional views illustrating cross-sectional structures taken along dashed-dotted line M-N in FIG. 12B.

Figure 12A:
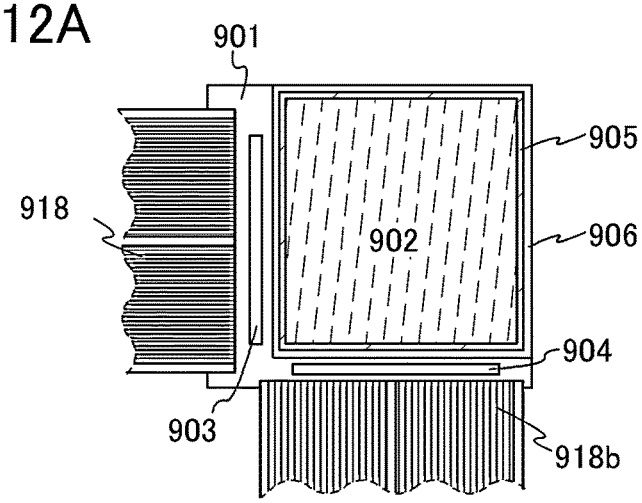
FIGS. 12A to 12C illustrate one embodiment of a method for manufacturing a semiconductor device.
Figure 13A:
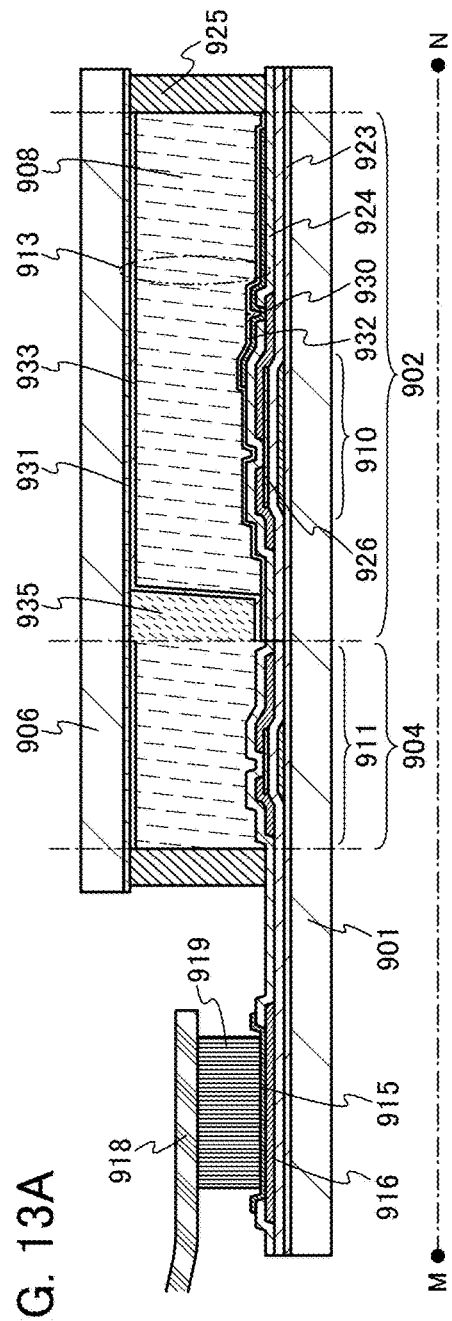
FIGS. 13A and 13B are cross-sectionals views illustrating one embodiment of a method for manufacturing a semiconductor device.
Figure 13B:
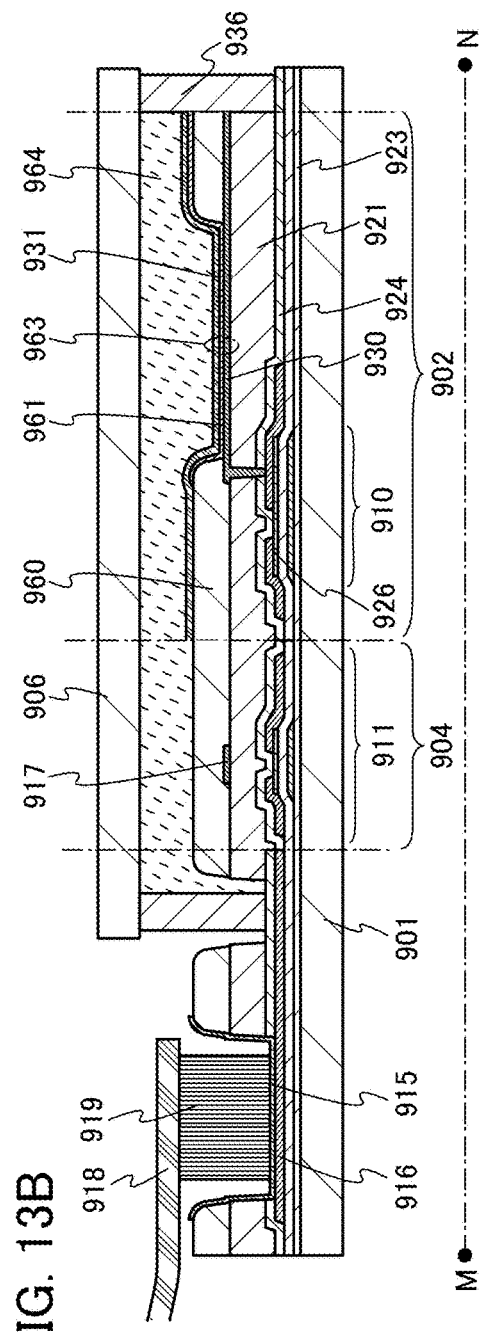

In FIG. 12A, a sealant 905 is provided so as to surround a pixel portion 902 provided over a first substrate 901, and the pixel portion 902 is sealed with a second substrate 906. In FIG. 12A, a signal line driver circuit 903 and a scan line driver circuit 904 each are formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPC) 918 and 918b.

Figure 12B:
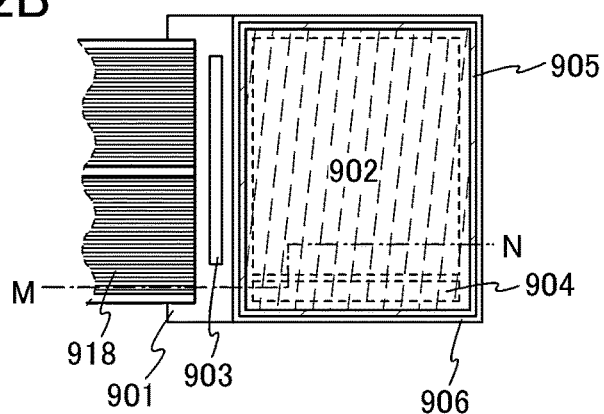
Figure 12C:
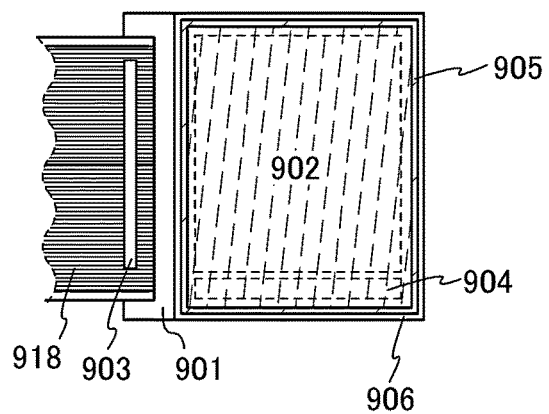

In FIGS. 12B and 12C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 12B and 12C, a signal line driver circuit 903 which is formed using a single crystal semiconductor or a polycrystalline semiconductor over a substrate separately prepared is mounted in a region different from the region surrounded by the sealant 905 over the first substrate 901. In FIGS. 12B and 12C, various signals and potentials are supplied to the signal line driver circuit 903 which is separately formed, the scan line driver circuit 904, and the pixel portion 902 from the FPC 918.

Although FIGS. 12B and 12C each show an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 12A shows an example in which the signal line driver circuit 903 and the scan line driver circuit 904 are mounted by a COG method. FIG. 12B shows an example in which the signal line driver circuit 903 is mounted by a COG method. FIG. 12C shows an example in which the signal line driver circuit 903 is mounted by a TAB method.

Note that the display device includes a panel in which the display element is sealed, and a module in which an IC including a controller or the like is mounted on the panel.

Note that the display device in this specification refers to an image display device or a display device. The display device may serve as a light source (including a lighting device). Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be applied.

As the display element provided in the display device, a liquid crystal element (also referred to as liquid crystal display element) or a light-emitting element (also referred to as light-emitting display element) can be used. A light-emitting element includes, in its scope, an element whose luminance is controlled by current or voltage, and specifically includes an inorganic electroluminescent (EL) element, an organic EL element, and the like. Furthermore, a display medium whose contrast is changed by an electric effect, such as electronic ink, can be used. FIG. 13A illustrates an example of a liquid crystal display device using a liquid crystal element as a display element, and FIG. 13B illustrates an example of a light-emitting display device as a display element.

As illustrated in FIGS. 13A and 13B, the semiconductor device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930, and the terminal electrode 916 is formed using the same conductive film as pair of electrodes of transistors 910 and 911.

Each of the pixel portion 902 and the scan line driver circuit 904 which are provided over the first substrate 901 includes a plurality of transistors. FIGS. 13A and 13B illustrate the transistor 910 included in the pixel portion 902 and the transistor 911 included in the scan line driver circuit 904. In FIG. 13A, an insulating film 924 is formed over the transistors 910 and 911. In FIG. 13B, a planarization film 921 is further provided over an insulating film 924. Note that an insulating film 923 is an insulating film serving as a base film.

In this embodiment, any of the transistors described in the above embodiments can be applied to the transistors 910 and 911. When a multilayer film 926 described in any of Embodiment 1 to Embodiment 3 is used in the transistors 910 and 911, a display device with high image quality can be provided.

Moreover, FIG. 13B shows an example in which a conductive film 917 is provided over the planarization film 921 so as to overlap with a channel region in the multilayer film of the transistor 911 for the driver circuit. In this embodiment, the conductive film 917 is formed of the same film as the first electrode 930. By providing the conductive film 917 so as to overlap with the channel region of the oxide semiconductor film, the amount of change in the threshold voltage of the transistor 911 between before and after a BT stress test can be further reduced. The potential applied to the conductive film 917 is either the same as or different from the potential applied to the gate electrode of the transistor 911, and the conductive film 917 can function as a second gate electrode. The potential of the conductive film 917 may be GND, 0 V or in a floating state. Further, the potential may be the same or substantially the same as the minimum potential (Vss; for example, the potential of the source electrode in the case where the potential of the source electrode is a reference potential) of the driver circuit In addition, the conductive film 917 has a function of blocking an external electric field. In other words, the conductive film 917 has a function of preventing an external electric field from affecting the inside (a circuit portion including the transistor), i.e., particularly, a function of preventing static electricity. Such a blocking function of the conductive film 917 can prevent variation in electric characteristics of the transistor due to the influence of an external electric field such as static electricity. The conductive film 917 can be used for any of the transistors described in the above embodiments.

The transistor 910 provided in the pixel portion 902 is electrically connected to the display element to form a display panel. There is no particular limitation on the kind of the display element as long as display can be performed, and various kinds of display elements can be employed.

In FIG. 13A, a liquid crystal element 913 is a display element including the first electrode 930, a second electrode 931, and a liquid crystal layer 908. An insulating film 932 and an insulating film 933 which serve as alignment films are provided so that the liquid crystal layer 908 is interposed therebetween. The second electrode 931 is provided on the second substrate 906 side. The second electrode 931 overlaps with the first electrode 930 with the liquid crystal layer 908 provided therebetween.

A spacer 935 is a columnar spacer obtained by selective etching of an insulating film and is provided in order to control the distance between the first electrode 930 and the second electrode 931 (a cell gap). Alternatively, a spherical spacer may also be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed is used for the liquid crystal layer in order to improve the temperature range. The liquid crystal composition which includes a liquid crystal showing a blue phase and a chiral material has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The first substrate 901 and the second substrate 906 are fixed in place by the sealant 925. As the sealant 925, an organic resin such as a thermosetting resin or a photocurable resin can be used.

Further, the transistor including an oxide semiconductor film used in the above embodiments has the following electrical characteristics: a defect of a stepwise rise of the drain current does not occur. Therefore, switching characteristics are excellent. Furthermore, relatively high field-effect mobility is obtained, which enables high-speed operation. Consequently, when the above transistor is used in a pixel portion of a semiconductor device having a display function, high-quality images can be obtained. Since a driver circuit portion and the pixel portion can be formed over one substrate with use of the above transistor, the number of components of the semiconductor device can be reduced.

The size of storage capacitor formed in the liquid crystal display device is set considering the leakage current of the transistor provided in the pixel portion or the like so that charge can be held for a predetermined period. By using the transistor including the highly-purified oxide semiconductor film, it is enough to provide a storage capacitor having a capacitance that is ⅓ or less, preferably ⅕ or less of a liquid crystal capacitance of each pixel; therefore, the aperture ratio of a pixel can be increased.

In the display device, a black matrix (light-blocking film), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. The present invention is not limited to the application to a display device for color display but can also be applied to a display device for monochrome display.

In FIG. 13B, a light-emitting element 963 which is a display element is electrically connected to the transistor 910 provided in the pixel portion 902. Note that the structure of the light-emitting element 963 is a stacked structure of the first electrode 930, a light-emitting layer 961, and the second electrode 931; however, the structure is not limited thereto. The structure of the light-emitting element 963 can be changed as appropriate depending on, for example, the direction in which light is extracted from the light-emitting element 963.

A partition wall 960 is provided over end portions of the first electrode 930. A partition wall 960 can be formed using an organic insulating material or an inorganic insulating material. It is particularly preferable that the partition wall 960 be formed using a photosensitive resin material to have an opening over the first electrode 930 so that a sidewall of the opening has an inclined surface with a continuous curvature.

The light-emitting layer 961 may be formed with a single layer or a plurality of layers stacked.

A protective layer may be formed over the second electrode 931 and the partition wall 960 in order to prevent entry of oxygen, hydrogen, moisture, carbon dioxide, or the like into the light-emitting element 963. As the protective layer, a silicon nitride film, a silicon nitride oxide film, an aluminum oxide film, an aluminum nitride film, an aluminum oxynitride film, an aluminum nitride oxide film, a DLC film, or the like can be formed. In addition, in a space which is sealed with the first substrate 901, the second substrate 906, and a sealant 936, a filler 964 is provided and sealed. It is preferred that, in this manner, the light-emitting element be packaged (sealed) with a protective film (such as a laminate film or an ultraviolet curable resin film) or a cover material with high air-tightness and little degasification so that the panel is not exposed to the outside air.

As the sealant 936, an organic resin such as a thermosetting resin or a photocurable resin, fitted glass including low-melting glass, or the like can be used. The fritted glass is preferred because of its high barrier property against impurities such as water and oxygen. When the fritted glass is used for the sealant 936, the fitted glass is preferred to be provided over the insulating film 924 as illustrated in FIG. 13B because adhesion can be increased.

As the filler 964, as well as an inert gas such as nitrogen or argon, an ultraviolet curable resin or a thermosetting resin can be used; polyvinyl chloride (PVC), an acrylic resin, polyimide, an epoxy resin, a silicone resin, polyvinyl butyral (PVB), ethylene vinyl acetate (EVA), or the like can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930 and the second electrode 931 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

Alternatively, the first electrode 930 and the second electrode 931 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

The first electrode 930 and the second electrode 931 can be formed using a conductive composition including a conductive macromolecule (also referred to as a conductive polymer). As the conductive macromolecule, a so-called π-electron conjugated conductive macromolecule can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Since the transistor is easily broken owing to static electricity or the like, a protective circuit for protecting the driver circuit is preferably provided. The protection circuit is preferably formed using a nonlinear element.

As described above, by using any of the transistors described in the above embodiments, a semiconductor device having a display function and high reliability can be provided.

This embodiment can be implemented in appropriate combination with the structures described in the other embodiments.

Embodiment 9

In this embodiment, a semiconductor device and a method for manufacturing the semiconductor device will be described with reference to FIG. 14 and FIGS. 15A to 15C. The semiconductor device includes a transistor formed using a first semiconductor material in a lower portion and a transistor formed using a second semiconductor material in an upper portion, and the transistor formed using the first semiconductor material includes a semiconductor substrate. As the semiconductor substrate included in the transistor using the first semiconductor material, a single crystal semiconductor substrate or a polycrystalline semiconductor substrate made of silicon, silicon carbide, or the like, a compound semiconductor substrate made of silicon germanium or the like, an SOI substrate, or the like can be used. Here, a single crystal silicon substrate is used as the semiconductor substrate. Further, as the transistor using the second semiconductor material, the transistor using the multilayer film including the oxide semiconductor film described in Embodiment 4 or Embodiment 5 is used. Here, the transistor using the multilayer film including the oxide semiconductor film described in Embodiment 5 is employed.

First, a structure of the semiconductor device is described with reference to FIG. 14.

A transistor 305 and a transistor 306, which are formed using a semiconductor substrate 301, are an n-channel transistor (NMOSFET) and a p-channel transistor (PMOSFET), respectively. The transistor 305 and the transistor 306 are electrically isolated from other elements by a shallow trench isolation (STI) 303. The use of the STI 303 can reduce the generation of a bird's beak in an element isolation region, which is caused in an LOCOS element isolation method, and can reduce the size of the element isolation region. On the other hand, in a semiconductor device that is not required to be structurally miniaturized or downsized, the STI 303 is not necessarily formed and an element isolation means such as LOCOS can be used.

The transistor 305 includes a channel region 307 in the semiconductor substrate 301, impurity regions 309 (also referred to as a source region and a drain region) which are provided such that the channel region 307 is provided therebetween, a gate insulating film 311 over the channel region 307, and a gate electrode 313 over the gate insulating film 311 so as to overlap with the channel region. The gate electrode 313 can be a single layer or a multilayer. Note that the gate electrode 313 may have a stacked-layer structure of a first conductive film formed using a first material for improving processing accuracy and a second conductive film formed using a second material for reducing resistance.

Between the impurity regions 309 and the channel region 307, impurity regions 315 different from the impurity regions 309 are provided. The impurity regions 315 function as LDD regions or extension regions for controlling the distribution of an electric field in the vicinity of the channel region, depending on the concentration of an impurity introduced thereto. At the side walls of the gate electrode 313, sidewalls 317 are provided. With the sidewalls 317, the impurity regions 315 can be formed.

The transistor 306 includes a channel region 308 provided in an n-well region 304, impurity regions 310 (also referred to as a source region and a drain region) which are provided such that the channel region 308 is provided therebetween, a gate insulating film 312 provided over the channel region 308, and a gate electrode 314 provided over the gate insulating film 312 so as to overlap with the channel region. The gate electrode 314 can be a single layer or a multilayer.

In addition, impurity regions 316 which are different from the impurity regions 310 are provided between the impurity regions 310 and the channel region 308. The impurity regions 316 function as LDD regions or extension regions for controlling the distribution of an electric field in the vicinity of the channel region, depending on the concentration of an impurity introduced thereto. At the side walls of the gate electrode 314, sidewalls 318 are provided. With the sidewalls 318, the impurity regions 310 can be formed.

An insulating film 321 and an insulating film 323 are provided over the transistor 305 and the transistor 306. In the insulating film 321 and the insulating film 323, openings are provided, and in the openings, contact plugs 325 connecting the impurity region 309 and the impurity region 310 are provided. The contact plugs 325 serve as a source electrode and a drain electrode of the transistor 305 and the transistor 306. Further, the contact plugs 325 are connected to wirings 329 embedded in an insulating film 327 over the insulating film 323.

The insulating film 321 can function as a protective film and can prevent impurities from entering the channel region from the outside. In addition, when the insulating film 321 is formed using a material such as silicon nitride by a CVD method, hydrogenation of single crystal silicon can be performed by heat treatment in the case where the single crystal silicon is used for the channel region. When an insulating film having tensile stress or compressive stress is used as the insulating film 321, distortion can be caused in the semiconductor material in the channel region. By applying tensile stress to a silicon material in the channel region in the case of an n-channel transistor or applying compressive stress to a silicon material in the channel region in the case of a p-channel transistor, the mobility of the transistor can be improved.

For the insulating film 323 and the insulating film 327, it is possible to use an insulator such as silicon oxide, silicon oxynitride, silicon nitride oxide, boron phosphorus silicate glass (BPSG), phosphorus silicate glass (PSG), silicon oxide to which carbon is added (SiOC), silicon oxide to which fluorine is added (SiOF), tetraethyl orthosilicate (TEOS) which is silicon oxide made from $Si(OC_2H_5)_4$, hydrogen silsesquioxane (HSQ), methyl silsesquioxane (MSQ), organo silicate glass (OSG), or an organic-polymer-based material. In particular, in the case of advancing miniaturization of the semiconductor device, parasitic capacitance between wirings is significant and signal delay is increased. Therefore, the relative permittivity of silicon oxide (k=4.0 to 4.5) is too high, and it is preferable to use a material with k=3.0 or less. After the conductive films are embedded in the openings which are provided in the insulating film, CMP treatment is performed to form the contact plugs; thus, mechanical strength is required for the insulating film. As long as the mechanical strength can be secured, the insulating films can be made porous to have a lower dielectric constant.

The contact plugs 325 are formed to have a single-layer structure or a stacked structure including any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given.

For the wirings 329, it is preferable to use a low-resistance conductive material such as copper or aluminum. By using a low-resistance conductive material, wiring delay of signals transmitted through the wirings 329 can be reduced. In the case where copper is used for the wirings 329, a barrier film is preferred to be formed between the insulating film 323 and the wirings 329 in order to prevent copper from dispersing into the channel region of the semiconductor substrate 301. The barrier film can each be formed using a film of tantalum nitride, a stacked-layer film of tantalum nitride and tantalum, a film of titanium nitride, a stacked-layer film of titanium nitride and titanium, or the like for example, but is not limited to the films of these materials as long as their function of preventing diffusion of a wiring material and their adhesion to the wiring material, a base film, or the like are secured.

Over the insulating film 327 and the wirings 329, an insulating film 331 and a barrier film 332 are stacked. Over the barrier film 322, an insulating film 333 is formed, and wirings 335a to 335c are embedded in the insulating film 333.

The wiring 335a and the wiring 335b are connected to any of wirings 329 through contact plugs (not shown) embedded in the insulating film 331 and the barrier film 332.

The barrier film 332 is preferably formed using an insulating film having an effect of blocking hydrogen, water, and oxygen. Typically, an aluminum oxide film, an aluminum oxynitride film, a gallium oxide film, a gallium oxynitride film, an yttrium oxide film, an yttrium oxynitride film, a hafnium oxide film, a hafnium oxynitride film, a silicon nitride film, or the like is used.

Although the barrier film 332 is provided over the insulating film 331, the position is not limited thereto as long as it is between an insulating film 343 and the transistors 305 and 306.

An insulating film 343 is provided over the insulating film 333 and the wirings 335a to 335c. Further, openings are provided in the insulating film 343, and a contact plug 345a and a contact plug 345b which are connected to the wiring 335a and the wiring 335b respectively are provided in the openings.

A transistor 349 is provided over the insulating film 343, the contact plug 345a, and the contact plug 345b. As the transistor 349, any of the transistors described in Embodiment 4 to Embodiment 6 can be used as appropriate. Here, the transistor 349 includes a multilayer film 351 including an oxide semiconductor film, a pair of electrodes 353 and 355 in contact with the multilayer film 351 including an oxide semiconductor film, a gate insulating film 357 covering the multilayer film 351 including an oxide semiconductor film and the pair of electrodes 353 and 355, and a gate electrode 359 overlapping with the multilayer film 351 including an oxide semiconductor film with the gate insulating film 357 interposed therebetween.

In addition, over the transistor 349, an insulating film 365 is stacked. Further, an insulating film 367 may be provided over the insulating film 365.

The insulating film 343 can be formed using an oxynitride insulating film containing oxygen in excess of the stoichiometric composition, specifically, an oxynitride insulating film in which the water content is low and which contains oxygen in excess of the stoichiometric composition.

The contact plug 345a and the contact plug 345b can be formed as appropriate using a material and a formation method which are similar to those of the contact plugs 325. Note that an electrode 353 of the transistor 349 and the wiring 335a are connected to each other through the contact plug 345a, and an electrode 355 and the wiring 335b are connected to each other through the contact plug 345b.

The insulating film 365 can be formed as appropriate using a material similar to that of the protective film 157 in Embodiment 5.

The insulating film 367 can be formed as appropriate using a material similar to that of the insulating film 323.

In the semiconductor device described in this embodiment, the transistors 305 and 306 using the first semiconductor material and the transistor 349 using the second semiconductor material are stacked. The transistor 349 using the second semiconductor material includes the multilayer film 351 including an oxide semiconductor film, and the density of localized levels of the multilayer film 351 is reduced. Thus, a transistor with excellent electric characteristics can be provided. In addition, a highly reliable transistor in which a variation in electric characteristics with time or a variation in electric characteristics due to a stress test is small can be manufactured.

Figure 14:
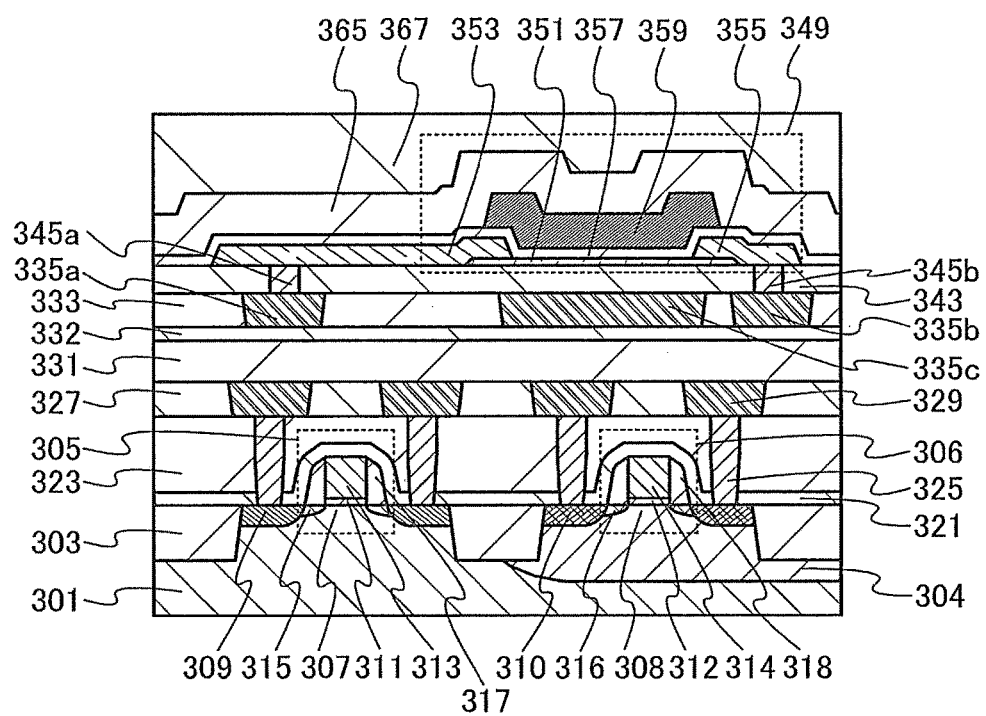
FIG. 14 illustrates one embodiment of a semiconductor device.

Next, a method for manufacturing the semiconductor device in FIG. 14 is described with reference to FIGS. 15A to 15C.

Figure 15A:
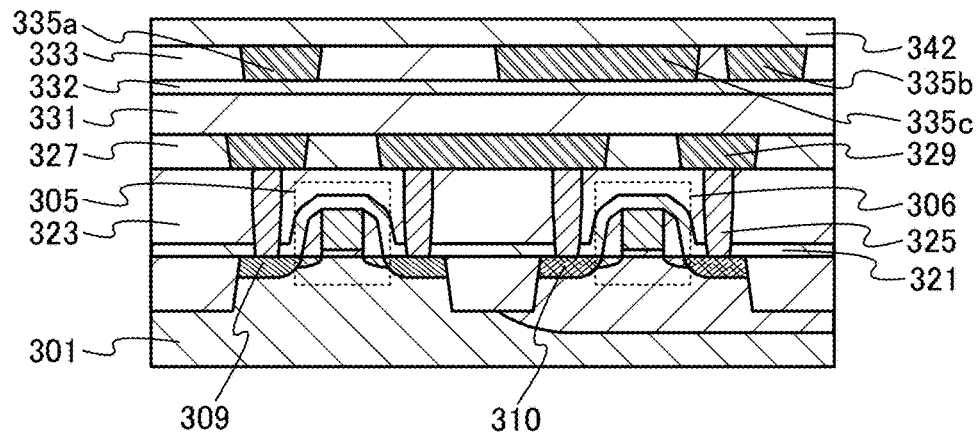
FIGS. 15A to 15C illustrate one embodiment of a method for manufacturing a semiconductor device.
Figure 15B:
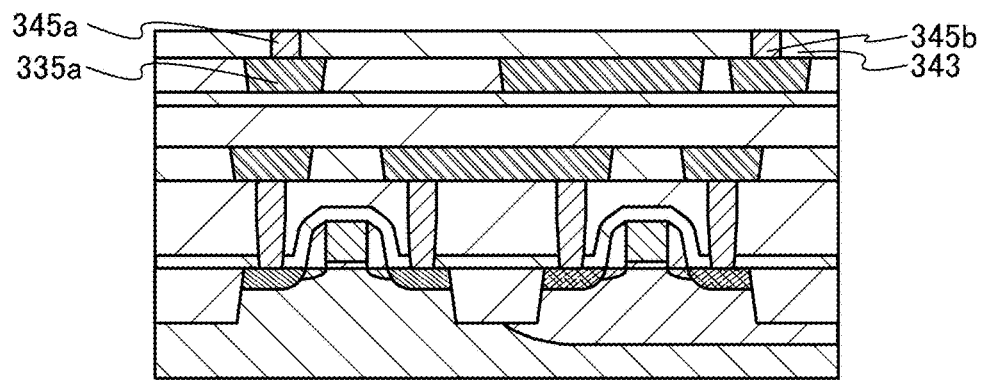

As illustrated in FIG. 15A, with use of a known method for manufacturing a MOS transistor, the transistor 305 and the transistor 306 are formed using the semiconductor substrate 301.

Next, an insulating film that is to be the insulating film 321 is formed over the transistor 305 and the transistor 306 by a sputtering method or a CVD method, and an insulating film that is to be the insulating film 323 is formed over the insulating film that is to be the insulating film 321 by a sputtering method, a CVD method, a coating method including a spin-coating method (also referred to as spin on glass: SOG), or the like. Note that the insulating film that is to be the insulating film 323 preferably has a surface that is planarized by planarization treatment such as a CMP method, or the like.

Next, openings are formed in the insulating film that is to be the insulating film 321 and the insulating film that is to be the insulating film 323, so that part of the impurity regions 309 and part of the impurity regions 310 are exposed, and the contact plugs 325 are formed so that the openings are filled. The contact plugs 325 can be formed in such a manner that a conductive film is formed by a sputtering method, a CVD method, an electrolytic plating method, or the like, planarization treatment is performed by a CMP method, an etching method, or the like, and then a surface portion of the conductive film, which is unnecessary, is removed.

Next, the insulating film 327 and the wirings 329 are formed over the insulating film 323.

A method for forming the insulating film 327 is described below. An insulating film that is to be the insulating film 327 is formed using a material of the insulating film 321 or the insulating film 323 as appropriate, by a sputtering method, a CVD method, a coating method including a spin-coating method, or the like. Next, part of the insulating film that is to be the insulating film 327 is removed, so that openings exposing part of the contact plugs 325 are formed, and the insulating film 327 is formed.

The wirings 329 can be formed in such a manner that a conductive film is formed over the contact plugs 325 and the insulating film 327 by a sputtering method, a CVD method, an electrolyte plating method, or the like and planarization treatment is performed by a CMP method or an etching method to divide the conductive film.

Note that by using a dual damascene method, the contact plugs 325 and the wirings 329 may be formed at the same time.

Next, the insulating film 331 is formed over the insulating film 327 and the wirings 329, and the barrier film 332 is formed over the insulating film 331. Although not shown, openings are formed in the insulating film 331 and the barrier film 332, and contact plugs with which the openings are filled are formed.

The insulating film 331 can be formed using a formation method similar to that of the insulating film 323.

The barrier film 332 can be formed by a sputtering method or a CVD method.

Next, the insulating film 333 and the wirings 335a to 335c are formed over the barrier film 332. The insulating film 333 and the wirings 335a to 335c can be formed in a manner similar to that of the insulating film 327 and the wirings 329.

An insulating film 342 is formed over the insulating film 333 and the wirings 335a to 335c. The insulating film 342 can be formed in a manner similar to that of the oxide insulating film 3 described in Modification Example 1 of Embodiment 1.

Next, part of the insulating film 342 is removed to form openings, so that the insulating film 343 is formed. Then, the contact plug 345a and the contact plug 345b with which the openings are filled are formed (see FIG. 15B).

The contact plug 345a and the contact plug 345b can be formed in a manner similar to that of the contact plugs 325.

Next, the transistor 349 is formed over the insulating film 343, the contact plug 345a, and the contact plug 345b. The transistor 349 can be formed as appropriate using a formation method described in Embodiment 4 or Embodiment 5.

Figure 15C:
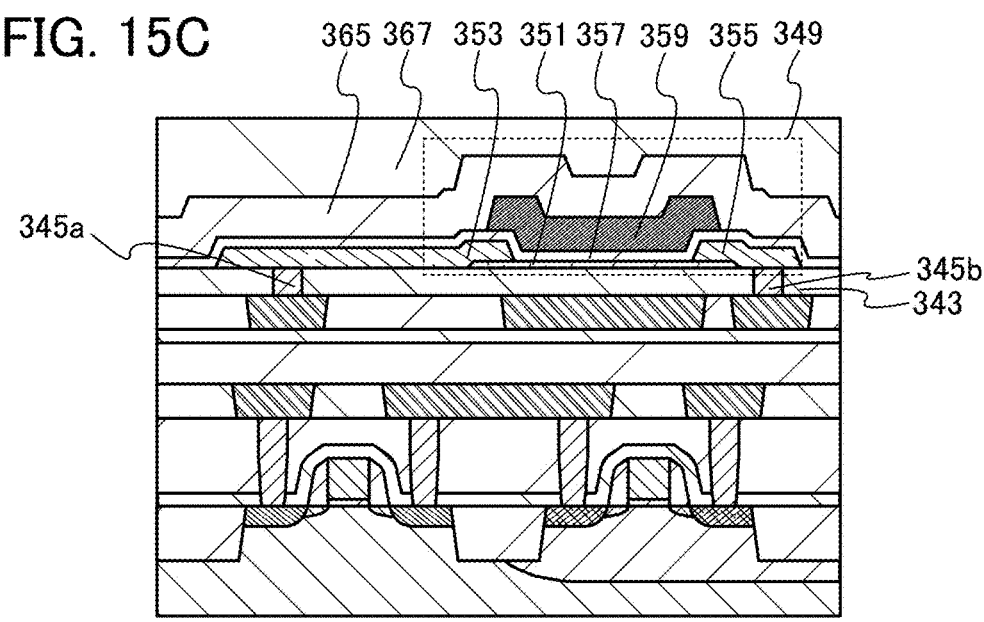

Over the transistor 349, the insulating film 365 is formed, and over the insulating film 365, the insulating film 367 is formed (see FIG. 15C).

The insulating film 365 can be formed by a sputtering method or a CVD method. The insulating film 367 can be formed by a coating method, a printing method, or the like.

As described above, through a plurality of contact plugs and a plurality of wirings, the transistor 305 or the transistor 306, which includes the first semiconductor material and is provided in the lower portion of the semiconductor device, is electrically connected to the transistor 349 which includes the second semiconductor material and is provided in the upper portion of the semiconductor device. With the above-described structure in which the transistor including the first semiconductor material and being capable of operating at high speed and the transistor including the second semiconductor material and having significantly small off-state current are combined, a semiconductor device including a logic circuit capable of operating at high speed with low power consumption, e.g., a memory device or a central processing unit (CPU), can be manufactured.

Such a semiconductor device is not limited to the above structure and can be changed as desired unless they deviate from the spirit of the present invention. For example, in the above description, two wiring layers are provided between the transistor including the first semiconductor material and the transistor including the second semiconductor material, but one wiring layer or three or more wiring layers may be provided, or without wirings, the transistors may be directly connected through only a contact plug. In this case, a through-silicon via (TSV) technique can also be used, for example. In addition, in the above description, a material such as copper is embedded in an insulating film to form a wiring, but a wiring having a three-layer structure of a barrier film, a wiring material layer, and a barrier film, for example, may be obtained by patterning through a photolithography step.

In the case where a copper wiring is formed in a tier between the transistors 305 and 306 including the first semiconductor material and the transistor 349 including the second semiconductor material, it is particularly necessary to take into consideration the influence of heat treatment performed in the process for manufacturing the transistor 349 including the second semiconductor material. In other words, it is necessary to take care that the temperature of heat treatment performed in the process for manufacturing the transistor 349 including the second semiconductor material is appropriate to the properties of the wiring material. This is because, in the case where high-temperature heat treatment is performed on a component of the transistor 349 for example, thermal stress is caused in case of using the copper wiring, leading to a problem such as stress migration.

In the multilayer film 351 including an oxide semiconductor film, which is included in the transistor 349 in this embodiment, the density of localized levels can be reduced. Thus, a transistor with excellent electric characteristics can be provided. In addition, a highly reliable transistor in which a variation in electric characteristics with time or a variation in electric characteristics due to a stress test is small can be manufactured.

Note that the structures, methods, and the like described in this embodiment can be used as appropriate in combination with any of the structures, methods, and the like described in the other embodiments and examples.

Embodiment 10

Although the oxide semiconductor film and the oxide film containing In or Ga which are described in the above embodiment can be formed by a sputtering method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The oxide semiconductor film and the oxide film containing In or Ga which are described in the above embodiment can be formed by a thermal CVD method such as a MOCVD method or an ALD method. For example, in the case where an InGaZnO$_X$ (X>0) film is formed, trimethylindium, trimethylgallium, and diethylzinc are used. Note that the chemical formula of trimethylindium is $(CH_3)_3In$. The chemical formula of trimethylgallium is $(CH_3)_3Ga$. The chemical formula of diethylzinc is $(CH_3)_2Zn$. Without limitation to the above combination, triethylgallium (chemical formula: $(C_2H_5)_3Ga$) can be used instead of trimethylgallium and dimethylzinc (chemical formula: $(C_2H_5)_2Zn$) can be used instead of diethylzinc.

For example, an oxide semiconductor film, e.g., an InGaZnO$_X$ (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to the this example. A mixed compound layer such as an $InGaO_2$ layer, an $InZnO_2$ layer, a GaInO layer, a ZnInO layer or a GaZnO layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Furthermore, a $Zn(CH_3)_2$ gas may be used.

Embodiment 11

In this embodiment, examples of electronic devices which can use any of the transistors described in Embodiment 1 to Embodiment 5 will be described.

The semiconductor devices described in Embodiment 4 to Embodiment 9 can be applied to a variety of electronic devices (including an amusement machine). Examples of the electronic devices include televisions, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, cellular phones, car phones, portable game machines, calculators, portable information terminals, electronic notebooks, e-book readers, electronic translators, audio input devices, cameras such as video cameras and digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers. In addition, examples include alarm devices such as smoke detectors, gas alarm devices, and security alarm devices. Further, the examples include industrial equipment such as guide lights, traffic lights, belt conveyors, elevators, escalators, industrial robots, and power storage systems. In addition, movable objects driven by oil engines or motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like.

Any of the semiconductor devices described in Embodiments 4 to Embodiment 9 includes a transistor with an extremely small amount of off-state current; thus, data can be held for a long time in the semiconductor device. As a result, in the semiconductor device, the number of writing operations can be reduced, and the power can be in an off state when writing is not performed. Therefore, when an electronic device is provided with the semiconductor device, power consumption of the electronic device can be reduced.

Note that the structures, methods, and the like described in this embodiment can be used as appropriate in combination with any of the structures, methods, and the like described in the other embodiments and examples.

Example 1

In this example, the density of localized levels of a multilayer film including an oxide semiconductor film was estimated by a constant photocurrent method (CPM).

First, a structure of Sample 1 which was subjected to CPM measurement and a fabrication method thereof are described.

Figure 16:
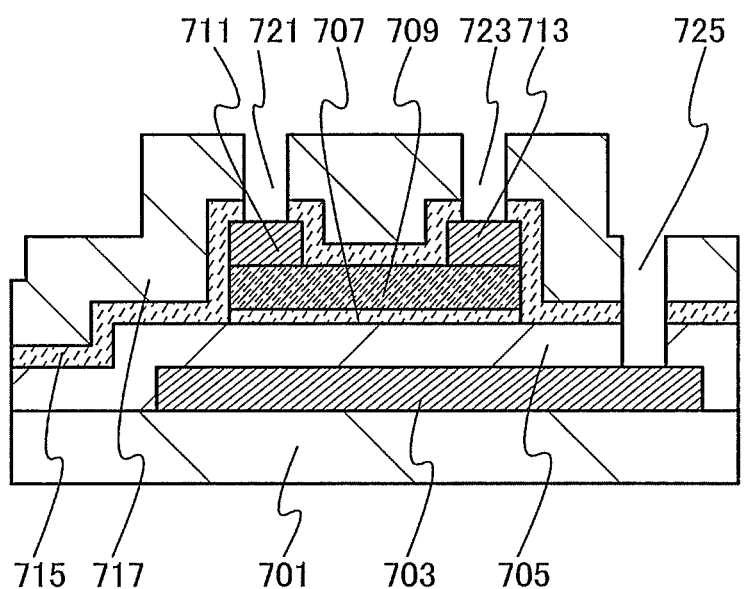
FIG. 16 illustrates a structure of a sample.

The structure of Sample 1 is described with reference to FIG. 16. In Sample 1, an electrode 703 is provided over a glass substrate 701, and an insulating film 705 is provided over the electrode 703. An oxide film 707 containing In or Ga is provided over the insulating film 705, and an oxide semiconductor film 709 is provided over the oxide film 707 containing In or Ga. A pair of electrodes 711 and 713 is provided over the oxide semiconductor film 709, an oxide film 715 containing In or Ga is provided over the oxide semiconductor film 709, and an insulating film 717 is provided over the oxide film 715 containing In or Ga.

Further, through an opening 721 formed in the oxide film 715 containing In or Ga and the insulating film 717, the electrode 711 is exposed. Through an opening 723 formed in the oxide film 715 containing In or Ga and the insulating film 717, the electrode 713 is exposed. Through an opening 725 formed in the insulating film 705, the oxide film 715 containing In or Ga, and the insulating film 717, the electrode 703 is exposed.

Next, a method for fabricating Sample 1 is described.

A 100-nm-thick tungsten film was formed over the glass substrate 701 by a sputtering method, and then with use of a mask formed by a photolithography step, the tungsten film was etched, so that the electrode 703 was formed.

The insulating film 705 was formed over the glass substrate 701 and the electrode 703. In this case, as the insulating film 705, a 100-nm-thick silicon oxynitride film was formed by a CVD method.

Over the insulating film 705, an oxide film containing In or Ga was formed by a sputtering method. In this case, with use of a target of an In—Ga—Zn oxide (In:Ga:Zn=1:3:2 [atomic ratio]), a 30-nm-thick In—Ga—Zn oxide was formed by a sputtering method. Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

Next, oxygen was added to the oxide film containing In or Ga by an ion implantation method. Oxygen ions were added with a dose of $1\times10^{16}/cm^2$ to the oxide film containing In or Ga at an accelerating voltage of 5 keV.

Next, an oxide semiconductor film was formed over the oxide film containing In or Ga by a sputtering method. In this case, with use of a target of an In—Ga—Zn oxide (In:Ga:Zn=1:1:1 [atomic ratio]), a 100-nm-thick In—Ga—Zn oxide was formed by a sputtering method. Note that an argon gas (flow rate: 30 sccm) and an oxygen gas (flow rate: 15 sccm) were used as a deposition gas, the pressure was set to be 0.4 Pa, the substrate temperature was set to be 300° C., and a DC power of 0.5 kW was applied.

Next, after a mask was formed over the oxide semiconductor film by a photolithography step, the oxide film containing In or Ga and the oxide semiconductor film were etched, so that the oxide film 707 containing In or Ga and the oxide semiconductor film 709 were formed.

Next, heat treatment was performed to make part of oxygen contained in the oxide film 707 containing In or Ga transfer to the oxide semiconductor film 709, so that the amount of oxygen vacancies in the oxide semiconductor film 709 was reduced. In this case, after heat treatment performed at 450° C. for 1 hour in a nitrogen atmosphere, heat treatment was performed at 450° C. for 1 hour in a dry-air atmosphere.

Next, the pair of electrodes 711 and 713 was formed over the oxide semiconductor film 709. In this case, a 100-nm-thick tungsten film was formed by a sputtering method, and then with use of a mask formed by a photolithography step, the tungsten film was etched, so that the pair of electrodes 711 and 713 was formed.

Next, the oxide film 715 containing In or Ga was formed over the insulating film 705, the oxide film 707 containing In or Ga, the oxide semiconductor film 709, and the pair of electrodes 711 and 713, and then the insulating film 717 was formed by a CVD method.

As the oxide film 715 containing In or Ga, a 30-nm-thick In—Ga—Zn oxide was formed by a sputtering method with use of a target of an In—Ga—Zn oxide (In:Ga:Zn=1:3:2 [atomic ratio]). Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

In this case, as the insulating film 717, a 300-nm-thick silicon oxide film was formed by a sputtering method.

Next, heat treatment was performed. Here, the heat treatment was performed at 300° C. for 1 hour in a dry-air atmosphere.

Then, a mask was formed over the insulating film 717 by a photolithography step. After that the insulating film 705, the oxide film 715 containing In or Ga, and the insulating film 717 were partly etched, so that the openings 721, 723, and 725 were formed, and the electrode 703 and the pair of electrodes 711 and 713 were exposed.

Through the above steps, Sample 1 was fabricated.

Next, CPM measurement was performed on Sample 1. CPM measurement is carried out in such a manner that the amount of light with which a sample surface between the pair of electrodes is irradiated is adjusted in a state where voltage is applied between the pair of electrodes 711 and 713 in contact with the oxide semiconductor film 709 in the sample so that a photocurrent value is kept constant, and an absorption coefficient is derived from the amount of irradiation light at each wavelength. In the CPM measurement, when the measurement object has a defect, the absorption coefficient at energy which corresponds to a level at which the defect exists (calculated from a wavelength) is increased.

By multiplying an increase in the absorption coefficient by a constant, the defect density of the measurement object can be obtained.

Figure 17A:
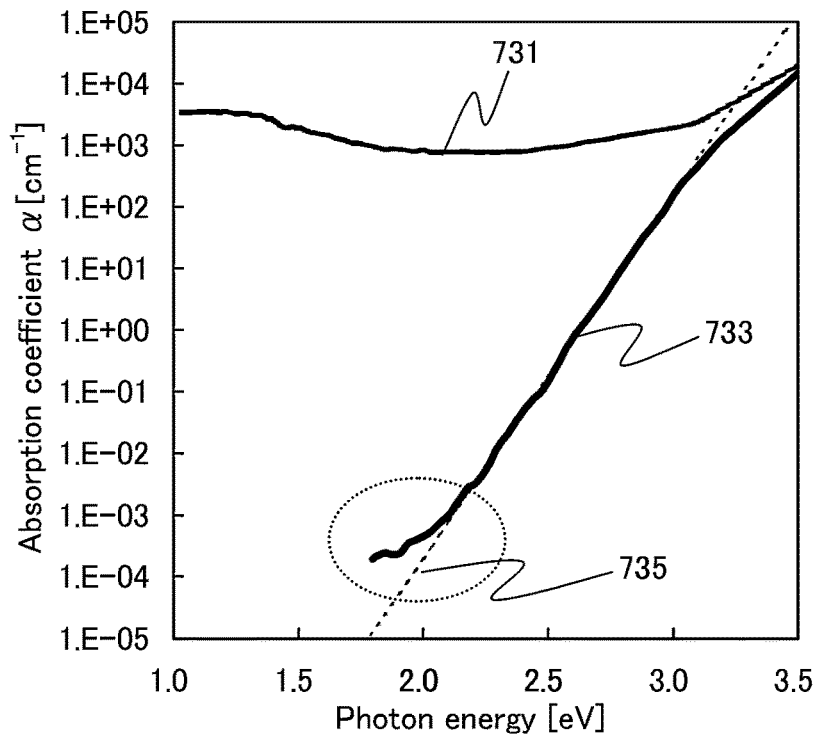
FIGS. 17A and 17B are graphs showing results of CPM measurement.
Figure 17B:
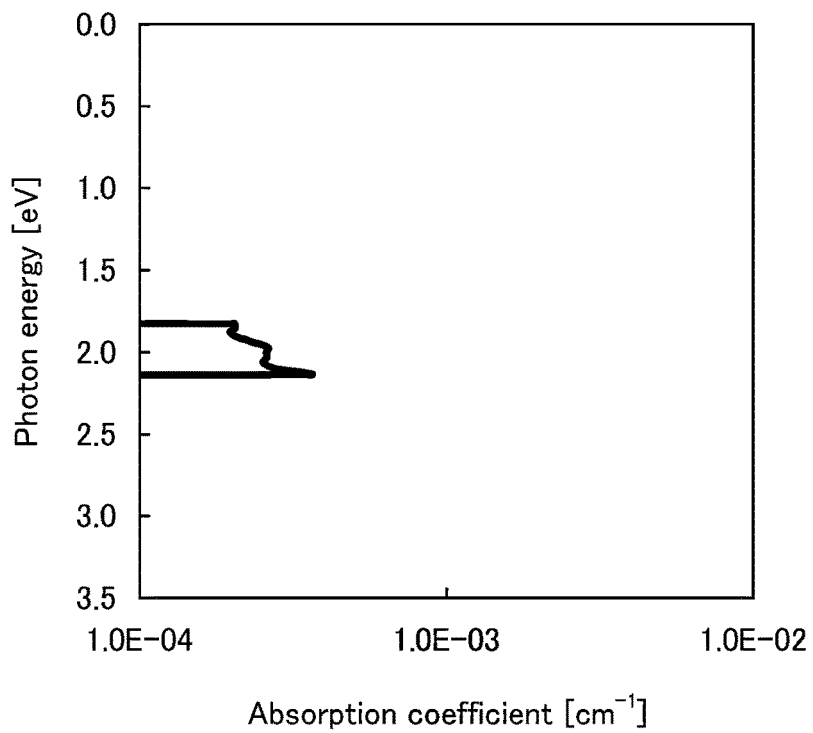

FIG. 17A shows measurement results of Sample 1. A curve 733 represents the absorption coefficient curve of the sample, a curve 731 represents the absorption coefficient measured optically with a spectrophotometer, and a chain line 735 represents a tangent of the curve 733. The integral value of the absorption coefficient in an energy range surrounded by a dashed-line circle in FIG. 17A was derived in such a manner that the absorption coefficient at an urbach tail (the chain line 735) was subtracted from the absorption coefficient (the curve 733) measured by CPM. The derivation result of the integral value is shown in FIG. 17B.

In FIG. 17A, the horizontal axis indicates the photon energy, and the vertical axis indicates the absorption coefficient. In FIG. 17B, the horizontal axis indicates the absorption coefficient, and the vertical axis indicates the photon energy. The bottom of the conduction band and the top of the valence band of the oxide semiconductor film are set to 0 eV and 3.15 eV, respectively, on the vertical axis in FIG. 17B. Further, in FIG. 17B, the curve indicated by a solid line corresponds to the localized levels of Sample 1, and absorption due to the localized levels was observed in an energy range from 1.5 eV to 2.3 eV, inclusive. When the values at each energy level are integrated, it was found that the absorption coefficient due to the localized states of Sample 1 was $4.36 \times 10^{-5}$/cm.

The localized levels observed in this example are supposed to be derived from impurities or defects. From the above, it is found that the oxide film 707 containing In or Ga and the oxide semiconductor film 709 have extremely low density of levels derived from impurities or defects. In other words, when a transistor is manufactured using the oxide film 707 containing In or Ga and the oxide semiconductor film 709, the on-state current of the transistor can be increased, and the field-effect mobility can also be increased. In addition, a highly reliable transistor in which a variation in electric characteristics with time or a variation in electric characteristics due to a stress test is small can be manufactured.

Example 2

In this example, the numbers of hydrogen molecules, water molecules, and oxygen molecules released by heating from the oxide film containing In or Ga to which oxygen is added were estimated, and the results thereof will be described.

First, a method for fabricating evaluated samples is described. The fabricated samples are Sample 2 to Sample 6.

A method for fabricating Sample 2 and Sample 3 is described.

A silicon wafer was used as the substrate. The substrate was heated at 950° C. in an oxygen atmosphere containing hydrogen chloride, so that a 100-nm-thick silicon oxide film including chlorine was formed over a surface of the substrate.

Next, a 300-nm-thick silicon oxynitride film was formed over the silicon oxide film including chlorine by a CVD method. Then, a surface of the silicon oxynitride film was planarized by CMP treatment.

Next, a 30-nm-thick In—Ga—Zn-based oxide film was formed as the oxide film containing In or Ga by a sputtering method. In this case, a target (In:Ga:Zn=1:3:2 [atomic ratio]) was used, and an argon gas (flow rate: 30 sccm) and an oxygen gas (flow rate: 15 sccm) were used as a sputtering gas. The sputtering gas was introduced to a chamber at a pressure of 0.4 Pa, the substrate temperature was set to be 200° C., and a DC power of 0.5 kW was applied.

Through the above steps, Sample 2 was fabricated.

Next, oxygen was added to the oxide film containing In or Ga included in Sample 2, so that an oxide film containing In or Ga to which oxygen is added was formed. In this case, oxygen ions were added with a dose of $1 \times 10^{16}$/cm$^2$ to the oxide film containing In or Ga by an ion implantation method at an accelerating voltage of 5 keV.

Through the above steps, the sample 3 was fabricated.

The film density of the oxide film containing In or Ga in each of Sample 2 and Sample 3 was measured by an X-ray reflectometry (XRR) analysis method, whereby the film density of Sample 2 was 5.8 g/cm$^3$, and the film density of Sample 3 was 5.6 g/cm$^3$. From the above, it is found that the film density is reduced by addition of oxygen to the oxide semiconductor film.

Figure 18A:
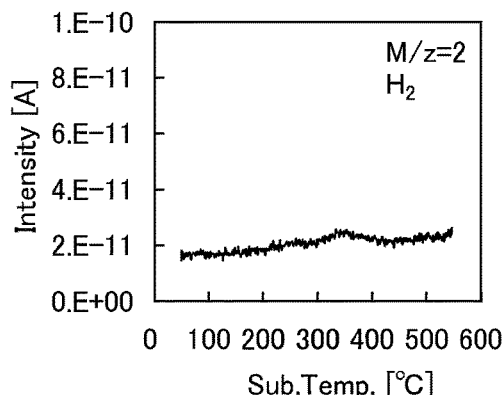
FIGS. 18A to 18F are graphs showing results of TDS measurement.
Figure 18C:
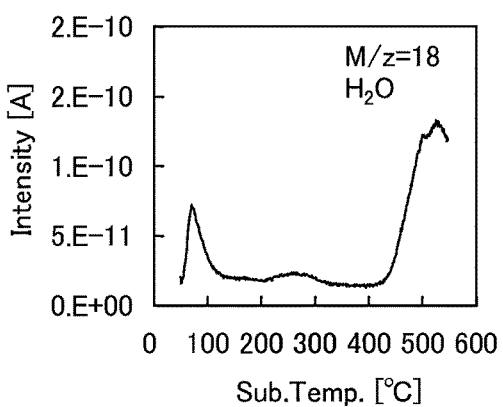
Figure 18E:
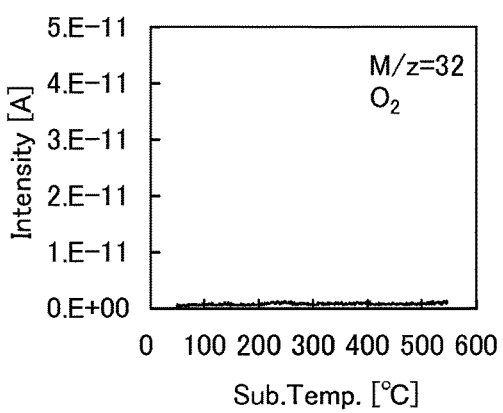
Figure 18B:
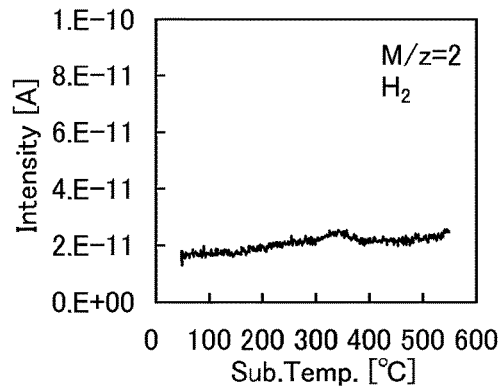
Figure 18D:
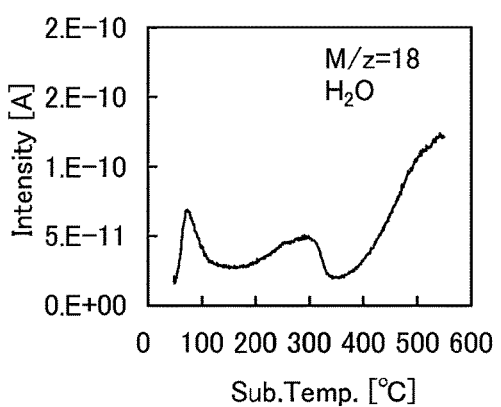
Figure 18F:
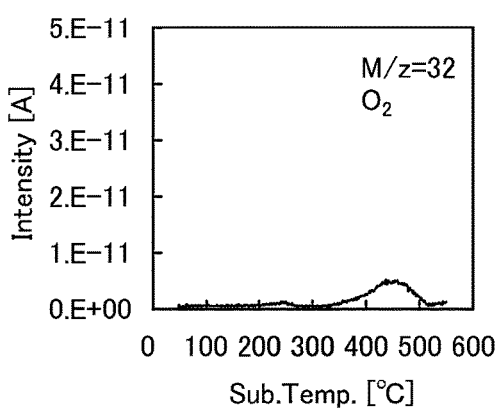

Next, Sample 2 and Sample 3 were subjected to TDS analysis. FIGS. 18A and 18B show the number of hydrogen molecules released from Sample 2 and Sample 3 with respect to the substrate temperature. FIGS. 18C and 18D show the number of water molecules released with respect to the substrate temperature. FIGS. 18E and 18F show the number of oxygen molecules released with respect to the substrate temperature.

According to FIGS. 18A and 18B, Sample 2 and Sample 3 show a similar tendency as for the number of released hydrogen molecules. According to FIGS. 18C and 18D, the number of water molecules released at around 300° C. in Sample 3 is large as compared with that in Sample 2. According to FIGS. 18E and 18F, oxygen is not released from the oxide film containing In or Ga in Sample 2 even when the substrate was heated, whereas oxygen molecules are released within a temperature range from 350° C. to 510° C. inclusive in Sample 3.

The total number of molecules released to the outside corresponds to the integral value of a curve representing the TDS analysis results. Thus, the total number of oxygen molecules released to the outside was calculated, and the results were as follows: $6.8 \times 10^{13}$ molecules/cm$^2$ (Sample 2) and $2.1 \times 10^{14}$ molecules/cm$^2$ (Sample 3).

From the above, it is found that heat treatment is performed after oxygen is added to the oxide film containing In or Ga, whereby oxygen is released from the oxide film containing In or Ga.

Next, Sample 4 was fabricated in such a manner that after oxygen was added to the 300-nm-thick silicon oxynitride film formed over the substrate in Sample 2, an oxide film containing In or Ga was formed over the silicon oxynitride film.

In addition, Sample 5 was fabricated in such a manner that after oxygen was added to the 300-nm-thick silicon oxynitride film formed over the substrate in Sample 3, an oxide film containing In or Ga was formed over the silicon oxynitride film.

In this case, oxygen ions were added with a dose of $2 \times 10^{16}$/cm$^2$ to each of the silicon oxynitride films by an ion implantation method at an accelerating voltage of 60 keV.

Figure 19A:
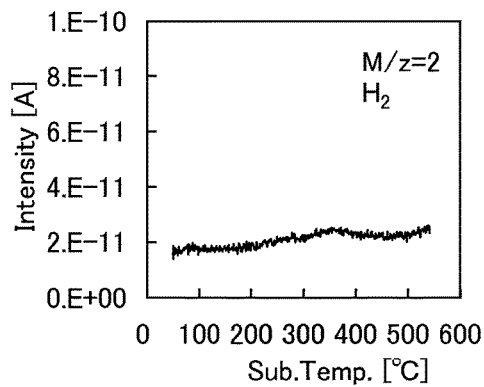
FIGS. 19A to 19F are graphs showing results of TDS measurement.
Figure 19B:
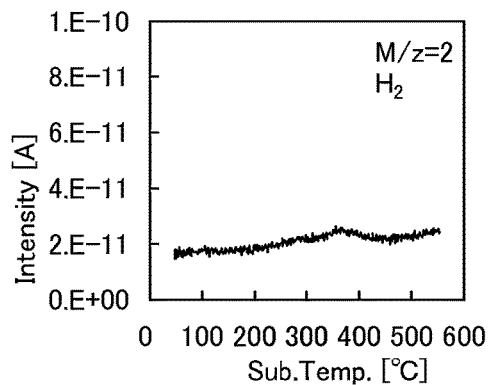
Figure 19C:
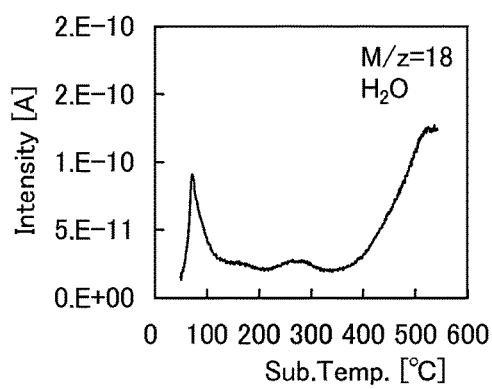
Figure 19D:
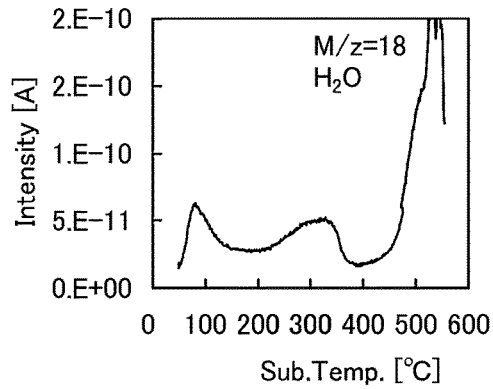
Figure 19E:
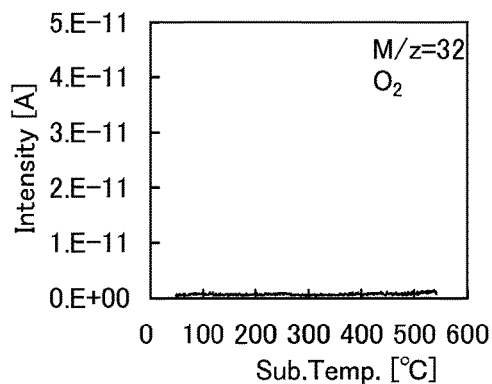
Figure 19F:
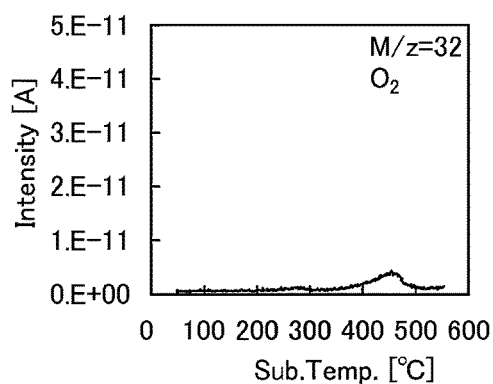

Next, Sample 4 and Sample 5 were subjected to TDS analysis. FIGS. 19A and 19B show the number of hydrogen molecules released from Sample 4 and Sample 5 with respect to the substrate temperature. FIGS. 19C and 19D show the number of water molecules released with respect to the substrate temperature. FIGS. 19E and 19F show the number of oxygen molecules released with respect to the substrate temperature.

According to FIGS. 19A and 19B, Sample 4 and Sample 5 show a similar tendency as for the number of released hydrogen molecules. According to FIGS. 19C and 19D, the number of water molecules released at around 300° C. in Sample 5 is large as compared with that in Sample 4. According to FIGS. 19E and 19F, oxygen is not released from the oxide film containing In or Ga in Sample 4 even when the substrate was heated, whereas oxygen molecules are released within a range higher than or equal to 350° C. and lower than or equal to 510° C. in Sample 5.

The total number of oxygen molecules released to the outside was calculated, and the results were as follows: $5.9 \times 10^{13}$ molecules/cm$^2$ (Sample 4) and $1.7 \times 10^{14}$ molecules/cm$^2$ (Sample 5).

From the above, it is found that heat treatment is performed after oxygen is added to the oxide film containing In or Ga, whereby oxygen is released from the oxide film containing In or Ga. Further, by comparison of FIG. 18F with FIG. 19F, it is found that the numbers of released oxygen molecules are equivalent to each other; thus the number of oxygen molecules released from the silicon oxynitride film to which oxygen is added is small, and the oxygen molecules are released mainly from the oxide film containing In or Ga.

Note that Sample 6 was fabricated in such a manner that a silicon oxynitride film was formed over the substrate and oxygen was added to the silicon oxynitride film. In other words, Sample 6 has a structure of Sample 4 without the oxide film containing In or Ga.

Figure 20A:
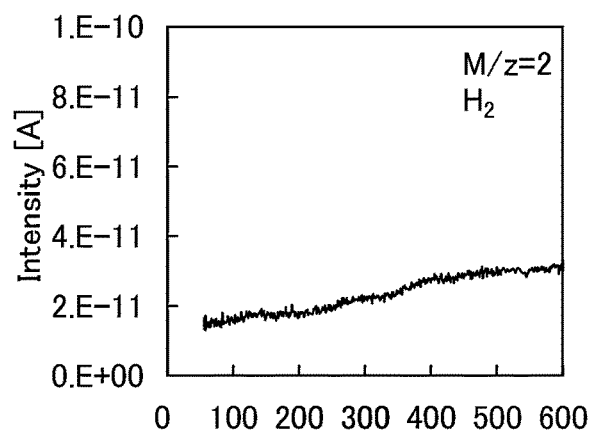
FIGS. 20A to 20C are graphs showing results of TDS measurement.
Figure 20B:
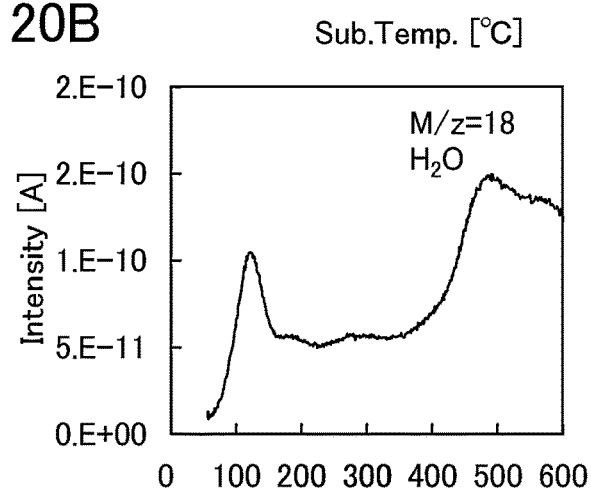
Figure 20C:
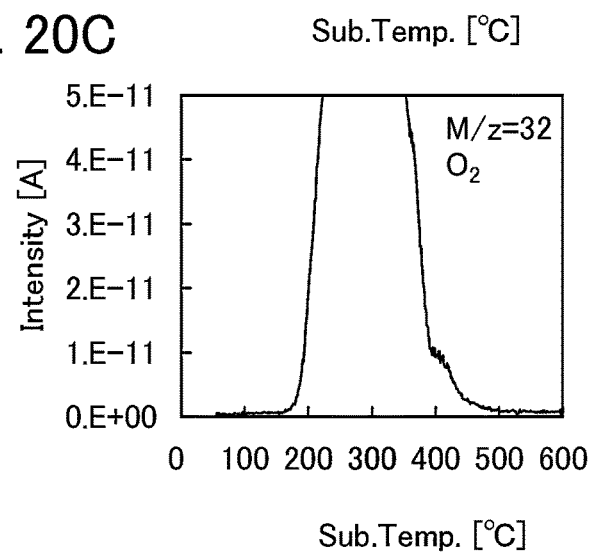

Next, Sample 6 was subjected to TDS analysis. FIG. 20A shows the number of hydrogen molecules released from Sample 6 with respect to the substrate temperature. FIG. 20B shows the number of water molecules released with respect to the substrate temperature. FIG. 20C shows the number of oxygen molecules released with respect to the substrate temperature.

The total number of oxygen molecules released to the outside was calculated. The result of Sample 6 was $9.2 \times 10^{15}$ molecules/cm$^2$.

As shown in FIGS. 20B and 20C, it is found that the number of released water molecules and the number of released oxygen molecules in Sample 6 are large as compared with those in Sample 2 to Sample 5. From the above, the oxide film containing In or Ga formed over the silicon oxynitride film in each of Sample 2 to Sample 5 has a blocking effect of preventing a release of water molecules and oxygen molecules.

Example 3

In this example, a state where oxygen in a multilayer film diffuses after heat treatment at 350° C. or 450° C. will be described with reference to FIGS. 21A to 21C.

Samples in each of which any of films in the multilayer film was deposited with use of an $^{18}O_2$ gas were fabricated. SIMS was performed on the samples, and the distribution concentration of the $^{18}O$ in the depth direction was measured. FIGS. 21A to 21C show the measurement results.

In this case, an oxide film 401a containing In or Ga was formed with use of a target of an In—Ga—Zn oxide (In:Ga:Zn=1:1:1 [atomic ratio]) by a sputtering method.

Further, an oxide semiconductor film 401b was formed with use of a target of an In—Ga—Zn oxide (In:Ga:Zn=3:1:2 [atomic ratio]) by a sputtering method.

Furthermore, an oxide film 401c containing In or Ga was formed with use of a target of an In—Ga—Zn oxide (In:Ga:Zn=1:1:1 [atomic ratio]) by a sputtering method.

Figure 21A:
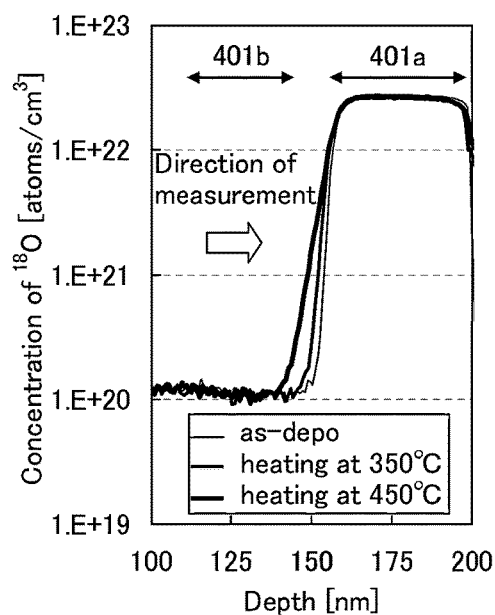
FIGS. 21A to 21C are graphs showing diffusion of oxygen in a multilayer film according to one embodiment of the present invention.

FIG. 21A shows the concentration distribution of $^{18}O$ in the depth direction, which includes an interface between the oxide film 401a containing In or Ga and the oxide semiconductor film 401b. In the sample of FIG. 21A, an $^{18}O_2$ gas was used for formation of the oxide film 401a containing In or Ga and the $^{18}O_2$ gas was not used for the other films. As compared with the case where heat treatment was not performed (represented as "as-depo"; thin solid line), in the case of performing heat treatment at 350° C. (represented as "after heating at 350° C."; solid line) and the case of performing heat treatment at 450° C. (represented as "after heating at 450° C."; thick solid line), the $^{18}O$ further diffuses from the oxide film 401a containing In or Ga to the oxide semiconductor film 401b.

Figure 21B:
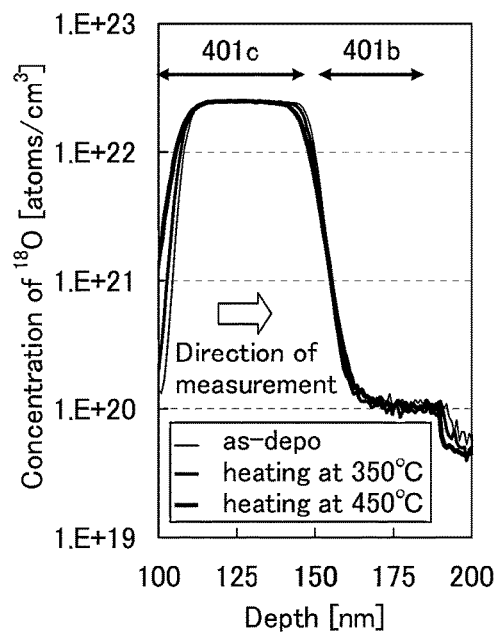

FIG. 21B shows the distribution of $^{18}O$ concentration in the depth direction, which includes an interface between the oxide semiconductor film 401b and the oxide film 401c containing In or Ga. In the sample of FIG. 21B, an $^{18}O_2$ gas was used for formation of the oxide semiconductor film 401b, and an $^{18}O_2$ gas was not used for the other layers. As compared with the case where heat treatment was not performed (represented as "as-depo"; thin solid line), in the case of performing heat treatment at 350° C. (represented as "after heating at 350° C."; solid line) and the case of performing heat treatment at 450° C. (represented as "after heating at 450° C."; thick solid line), the $^{18}O$ further diffuses from the oxide semiconductor film 401b to the oxide film 401c containing In or Ga.

Figure 21C:
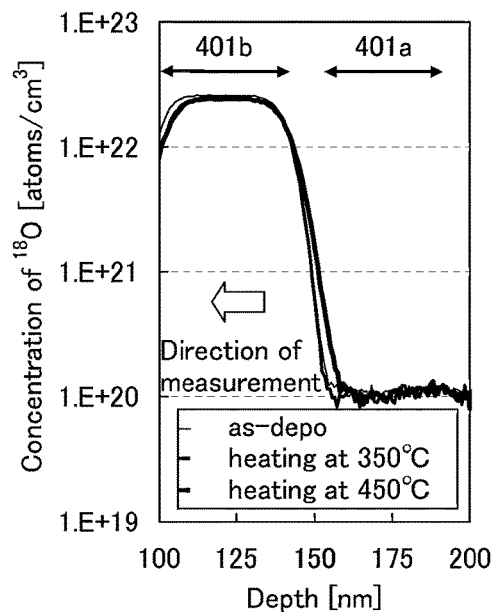

FIG. 21C shows the concentration distribution of $^{18}O$ in the depth direction, which includes an interface between the oxide film 401a containing In or Ga and the oxide semiconductor film 401b. In the sample of FIG. 21C, an $^{18}O_2$ gas was used for formation of the oxide semiconductor film 401b, and an $^{18}O_2$ gas was not used for the other layers. As compared with the case where heat treatment was not performed (represented as "as-depo"; thin solid line) and the case of performing heat treatment at 350° C. (represented as "after heating at 350° C."; solid line), in the case of performing heat treatment at 450° C. (represented as "after heating at 450° C."; thick solid line), $^{18}O$ further diffuses from the oxide semiconductor film 401b to the oxide film 401a containing In or Ga.

As shown in FIGS. 21A to 21C, oxygen mutually diffuses in the multilayer film.

Example 4

In this example, the concentration of silicon contained in a multilayer film in a transistor which is one embodiment of the present invention will be described. Here, results obtained by estimating the multilayer film with SIMS are described.

First, samples subjected to SIMS measurement are described.

The multilayer film was formed as follows: a 10-nm-thick oxide film 81 containing In or Ga was formed over a silicon wafer; a 10-nm-thick oxide semiconductor film 82 was formed over the oxide film 81 containing In or Ga; and a 10-nm-thick oxide film 83 containing In or Ga was formed over the oxide semiconductor film 82.

In this example, the oxide film 81 containing In or Ga was an oxide film formed by a sputtering method with use of a target of an In—Ga—Zn oxide (In:Ga:Zn=1:3:2 [atomic ratio]). Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

Further, the oxide semiconductor film 82 was an oxide semiconductor film formed by a sputtering method with use of a target of an In—Ga—Zn oxide (In:Ga:Zn=1:1:1 [atomic ratio]). Note that an argon gas (flow rate: 30 sccm) and an oxygen gas (flow rate: 15 sccm) were used as a deposition gas, the pressure was set to be 0.4 Pa, the substrate temperature was set to be 300° C., and a DC power of 0.5 kW was applied.

Further, the oxide film 83 containing In or Ga was an oxide film formed by a sputtering method with use of a target of an In—Ga—Zn oxide (In:Ga:Zn=1:3:2 [atomic ratio]). Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

A sample which was not subjected to heat treatment and a sample which was subjected to heat treatment performed at 450° C. for 2 hours after the multilayer film was formed were prepared. The sample which was not subjected to heat treatment is Sample 7, and the sample which was subjected to heat treatment is Sample 8.

Figure 22A:
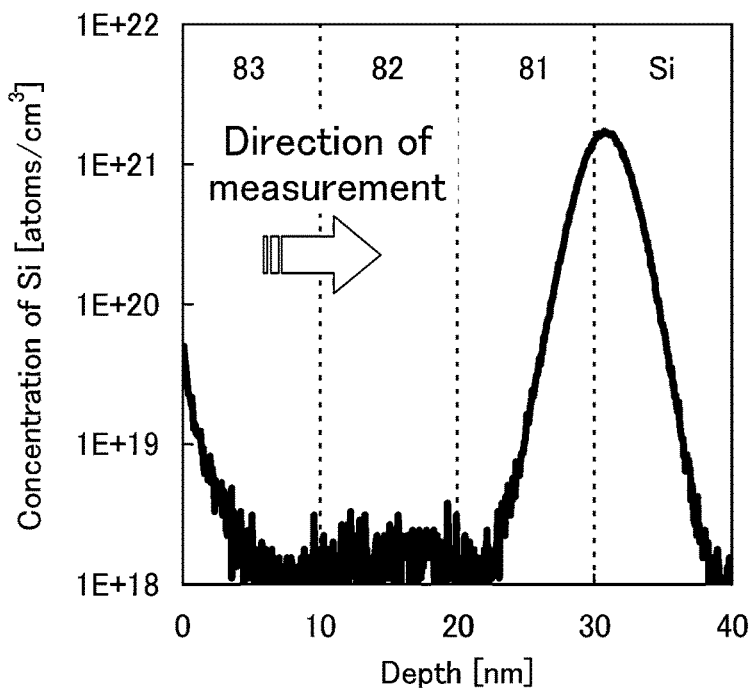
FIGS. 22A and 22B are graphs showing results of ToF-SIMS of a multilayer film included in a transistor.

With respect to Sample 7 and Sample 8, time-of-flight secondary ion mass spectroscopy (ToF-SIMS) was performed, whereby the concentrations of Si [atoms/cm$^3$] in the depth direction were measured. FIG. 22A shows the concentration of Si converted from the secondary ion intensity of SiO$_3$ [atoms/cm$^3$] in the depth direction in the multilayer film in Sample 7, and FIG. 22B shows the concentration of Si converted from the secondary ion intensity of SiO$_3$ [atoms/cm$^3$] in the depth direction in the multilayer film in Sample 8.

Figure 22B:
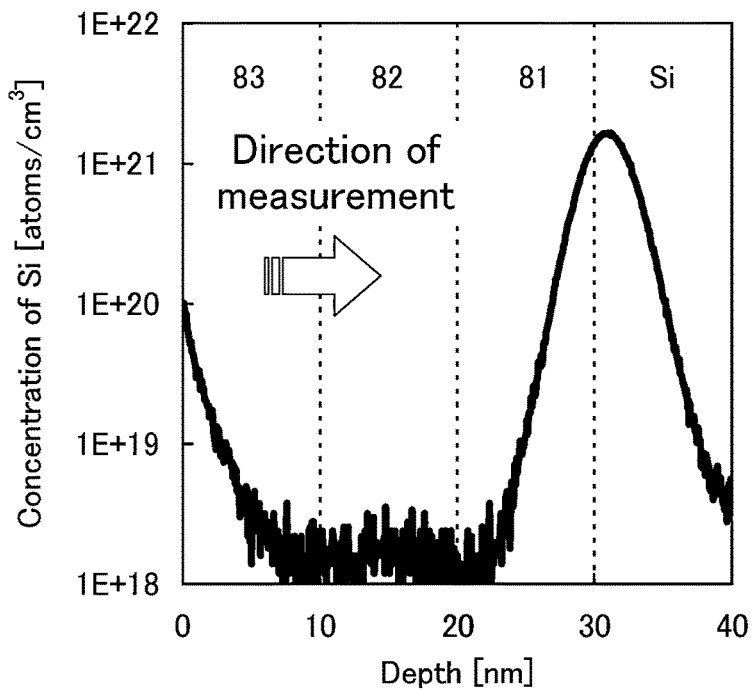

According to FIGS. 22A and 22B, the interface between the silicon wafer and the oxide film 81 containing In or Ga and the top surface of the oxide film 83 containing In or Ga have higher concentration of Si. The Si concentration in the oxide semiconductor film 82 was about $1\times10^{18}$ atoms/cm$^3$ which is the lower limit of detection of ToF-SIMS. This is probably because, owing to existence of the oxide film 81 containing In or Ga and the oxide film 83 containing In or Ga, the oxide semiconductor film 82 is not influenced by silicon caused by the silicon wafer or surface contamination.

From the results shown in FIGS. 22A and 22B, it is found that silicon diffusion is less likely to occur by heat treatment, and silicon is mixed mainly at the time of film formation.

As described above, with use of the multilayer film described in this example, a transistor with stable electric characteristics can be manufactured.

This application is based on Japanese Patent Application serial no. 2012-232079 filed with Japan Patent Office on Oct. 19, 2012, the entire contents of which are hereby incorporated by reference.

What is claimed is:

1. A method for manufacturing a semiconductor device, comprising the steps of:
    forming a first oxide semiconductor layer;
    adding oxygen to the first oxide semiconductor layer by using an ion implantation method, an ion doping method, or plasma treatment;
    forming a second oxide semiconductor layer over the first oxide semiconductor layer after adding the oxygen; and
    performing heat treatment after forming the second oxide semiconductor layer so that a part of oxygen in the first oxide semiconductor layer is transferred to the second oxide semiconductor layer.

2. The method for manufacturing the semiconductor device according to claim 1, wherein the second oxide semiconductor layer comprises one of indium, gallium, and zinc.

3. The method for manufacturing the semiconductor device according to claim 1, further comprising the step of:
    forming an insulating layer under the first oxide semiconductor layer before forming the first oxide semiconductor layer,
    wherein oxygen is added to the insulating layer in the step of adding the oxygen.

4. The method for manufacturing the semiconductor device according to claim 1, further comprising the steps of:
    forming a first gate electrode;
    forming a first insulating layer over the first gate electrode before forming the first oxide semiconductor layer; and
    forming a source electrode and a drain electrode electrically connected to the second oxide semiconductor layer,
    wherein the first gate electrode overlaps with the second oxide semiconductor layer.

5. The method for manufacturing the semiconductor device according to claim 4, further comprising the steps of:
    forming a second insulating layer over the second oxide semiconductor layer, the source electrode, and the drain electrode; and
    forming a second gate electrode over the second insulating layer,
    wherein the second gate electrode overlaps with the second oxide semiconductor layer.

6. The method for manufacturing the semiconductor device according to claim 1, further comprising the steps of:
    forming a source electrode and a drain electrode electrically connected to the second oxide semiconductor layer,
    forming an insulating layer over the second oxide semiconductor layer, the source electrode, and the drain electrode; and
    forming a gate electrode over the insulating layer;
    wherein the gate electrode overlaps with the second oxide semiconductor layer.

7. The method for manufacturing the semiconductor device according to claim 1, wherein the first oxide semiconductor layer comprises one of indium, gallium, and zinc.

8. The method for manufacturing the semiconductor device according to claim 1, wherein an amount of the oxygen added to the first oxide semiconductor layer is greater than or equal to $5\times10^{14}$/cm$^2$ and less than or equal to $5\times10^{16}$/cm$^2$.

9. A method for manufacturing a semiconductor device, comprising the steps of:
    forming a first oxide semiconductor layer;
    forming a second oxide semiconductor layer over the first oxide semiconductor layer;
    adding oxygen to the second oxide semiconductor layer by using an ion implantation method, an ion doping method, or plasma treatment; and
    performing heat treatment after adding the oxygen so that a part of oxygen in the second oxide semiconductor layer is transferred to the first oxide semiconductor layer.

10. The method for manufacturing the semiconductor device according to claim 9, wherein the first oxide semiconductor layer comprises one of indium, gallium, and zinc.

11. The method for manufacturing the semiconductor device according to claim 9, further comprising the steps of:
forming a first gate electrode;
forming a first insulating layer over the first gate electrode before forming the first oxide semiconductor layer; and
forming a source electrode and a drain electrode electrically connected to the first oxide semiconductor layer,
wherein the first gate electrode overlaps with the first oxide semiconductor layer.

12. The method for manufacturing the semiconductor device according to claim 11, further comprising the steps of:
forming a second insulating layer over the second oxide semiconductor layer, the source electrode, and the drain electrode; and
forming a second gate electrode over the second insulating layer,
wherein the second gate electrode overlaps with the first oxide semiconductor layer.

13. The method for manufacturing the semiconductor device according to claim 9, further comprising the steps of:
forming a source electrode and a drain electrode electrically connected to the first oxide semiconductor layer,
forming an insulating layer over the second oxide semiconductor layer, the source electrode, and the drain electrode; and
forming a gate electrode over the insulating layer;
wherein the gate electrode overlaps with the first oxide semiconductor layer.

14. The method for manufacturing the semiconductor device according to claim 9, wherein the second oxide semiconductor layer comprises one of indium, gallium, and zinc.

15. The method for manufacturing the semiconductor device according to claim 9, wherein an amount of the oxygen added to the first oxide semiconductor layer is greater than or equal to $5\times10^{14}/cm^2$ and less than or equal to $5\times10^{16}/cm^2$.

16. A method for manufacturing a semiconductor device, comprising the steps of:
forming a first oxide semiconductor layer;
adding oxygen to the first oxide semiconductor layer by using an ion implantation method, an ion doping method, or plasma treatment;
forming a second oxide semiconductor layer over the first oxide semiconductor layer after adding the oxygen;
forming a third oxide semiconductor layer over the second oxide semiconductor layer; and
performing heat treatment after forming the second oxide semiconductor layer so that a part of oxygen in the first oxide semiconductor layer is transferred to the second oxide semiconductor layer.

17. The method for manufacturing the semiconductor device according to claim 16, wherein the second oxide semiconductor layer comprises one of indium, gallium, and zinc.

18. The method for manufacturing the semiconductor device according to claim 16, further comprising the step of:
forming an insulating layer under the first oxide semiconductor layer before forming the first oxide semiconductor layer,
wherein oxygen is added to the insulating layer in the step of adding the oxygen.

19. The method for manufacturing the semiconductor device according to claim 16, further comprising the steps of:
forming a first gate electrode;
forming a first insulating layer over the first gate electrode before forming the first oxide semiconductor layer; and
forming a source electrode and a drain electrode electrically connected to the second oxide semiconductor layer,
wherein the first gate electrode overlaps with the second oxide semiconductor layer.

20. The method for manufacturing the semiconductor device according to claim 19, further comprising the steps of:
forming a second insulating layer over the third oxide semiconductor layer, the source electrode, and the drain electrode; and
forming a second gate electrode over the second insulating layer,
wherein the second gate electrode overlaps with the second oxide semiconductor layer.

21. The method for manufacturing the semiconductor device according to claim 16, further comprising the steps of:
forming a source electrode and a drain electrode electrically connected to the second oxide semiconductor layer,
forming an insulating layer over the third oxide semiconductor layer, the source electrode, and the drain electrode; and
forming a gate electrode over the insulating layer;
wherein the gate electrode overlaps with the second oxide semiconductor layer.

22. The method for manufacturing the semiconductor device according to claim 16, wherein the first oxide semiconductor layer comprises one of indium, gallium, and zinc.

23. The method for manufacturing the semiconductor device according to claim 16, wherein an amount of the oxygen added to the first oxide semiconductor layer is greater than or equal to $5\times10^{14}/cm^2$ and less than or equal to $5\times10^{16}/cm^2$.

* * * * *